United States Patent
Hirose et al.

(10) Patent No.: US 9,837,261 B2
(45) Date of Patent: *Dec. 5, 2017

(54) METHOD OF MANUFACTURING SEMICONDUCTOR DEVICE AND SUBSTRATE PROCESSING METHOD

(71) Applicant: Hitachi Kokusai Electric Inc., Tokyo (JP)

(72) Inventors: Yoshiro Hirose, Toyama (JP); Atsushi Sano, Toyama (JP); Yugo Orihashi, Toyama (JP); Yoshitomo Hashimoto, Toyama (JP); Satoshi Shimamoto, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/248,833

(22) Filed: Aug. 26, 2016

(65) Prior Publication Data

US 2016/0365243 A1    Dec. 15, 2016

Related U.S. Application Data

(63) Continuation of application No. 14/706,221, filed on May 7, 2015, now Pat. No. 9,460,911, which is a
(Continued)

(30) Foreign Application Priority Data

Dec. 9, 2011  (JP) ................................ 2011-270723
Oct. 23, 2012 (JP) ................................ 2012-233850

(51) Int. Cl.
*H01L 21/02*     (2006.01)
*H01L 21/31*     (2006.01)
(Continued)

(52) U.S. Cl.
CPC ........ *H01L 21/02126* (2013.01); *C23C 16/36* (2013.01); *C23C 16/45523* (2013.01);
(Continued)

(58) Field of Classification Search
None
See application file for complete search history.

(56) References Cited

U.S. PATENT DOCUMENTS 7,638,170 B2      12/2009   Li
9,053,927 B2 *    6/2015    Hirose .............. H01L 21/02271
(Continued)

FOREIGN PATENT DOCUMENTS

CN     102034702 A       4/2011
JP     2004-283587 A1    10/2004
(Continued)

OTHER PUBLICATIONS

Office Action in Corresponding Chinese Application No. 201210549327.5, dated Jan. 20, 2015, along with English Translation.
(Continued)

*Primary Examiner* — Asok K Sarkar
(74) *Attorney, Agent, or Firm* — Edell, Shapiro & Finnan LLC

(57) ABSTRACT

A method of manufacturing a semiconductor device for forming a thin film having low permittivity, high etching resistance and high leak resistance is provided. The method includes: forming a film containing a predetermined element, oxygen, carbon and nitrogen on a substrate by performing a cycle a predetermined number of times. The cycle includes: (a) supplying a source gas containing the predetermined element and a halogen element to the substrate; (b) supplying a first reactive gas containing the three elements including carbon, nitrogen and hydrogen wherein a number
(Continued)

of carbon atoms in each molecule of the first reactive gas is greater than that of nitrogen atoms in each molecule of the first reactive gas to the substrate; (c) supplying a nitriding gas as a second reactive gas to the substrate; and (d) supplying an oxidizing gas as a third reactive gas to the substrate, wherein (a) through (d) are non-simultaneously performed.

12 Claims, 26 Drawing Sheets

Related U.S. Application Data continuation of application No. 13/708,966, filed on Dec. 8, 2012, now Pat. No. 9,054,046.

(51) Int. Cl.
  *C23C 16/36*  (2006.01)
  *C23C 16/455*  (2006.01)

(52) U.S. Cl.
  CPC .... *H01L 21/0228* (2013.01); *H01L 21/02167* (2013.01); *H01L 21/02172* (2013.01); *H01L 21/02211* (2013.01); *H01L 21/31* (2013.01); *H01L 21/02178* (2013.01); *H01L 21/02181* (2013.01); *H01L 21/02183* (2013.01); *H01L 21/02186* (2013.01); *H01L 21/02189* (2013.01)

(56) References Cited

U.S. PATENT DOCUMENTS

| | | | | |
|---|---|---|---|---|
| 9,054,046 | B2* | 6/2015 | Hirose | .................... H01L 21/31 |
| 9,437,422 | B2* | 9/2016 | Hirose | .............. H01L 21/02271 |
| 9,460,911 | B2* | 10/2016 | Hirose | .................... H01L 21/31 |
| 2004/0186375 | A1 | 9/2004 | Vavrek et al. | |
| 2005/0159017 | A1 | 7/2005 | Kim et al. | |
| 2006/0084283 | A1 | 4/2006 | Paranjpe et al. | |
| 2010/0105192 | A1 | 4/2010 | Akae et al. | |
| 2010/0304047 | A1 | 12/2010 | Yang et al. | |
| 2011/0256726 | A1 | 10/2011 | Lavoie et al. | |
| 2011/0256733 | A1 | 10/2011 | Hirose et al. | |
| 2012/0009802 | A1 | 1/2012 | Lavoie et al. | |
| 2013/0052836 | A1 | 2/2013 | Hirose et al. | |
| 2013/0196516 | A1 | 8/2013 | Lavoie et al. | |

FOREIGN PATENT DOCUMENTS

| | | |
|---|---|---|
| JP | 2006-24668 A1 | 1/2006 |
| JP | 2008517479 A1 | 5/2008 |
| JP | 2011-524087 A1 | 8/2011 |
| JP | 2011-238894 A | 11/2011 |
| WO | 2011123792 A1 | 10/2011 |
| WO | 2011125395 A1 | 10/2011 |

OTHER PUBLICATIONS

Office Action in Corresponding Japanese Application No. 2012-233850, dated Jul. 2016, along with English Translation.
Office Action in corresponding Japanese Patent Application No. 2016-216988, drafted on Aug. 29, 2017, with English translation.

* cited by examiner

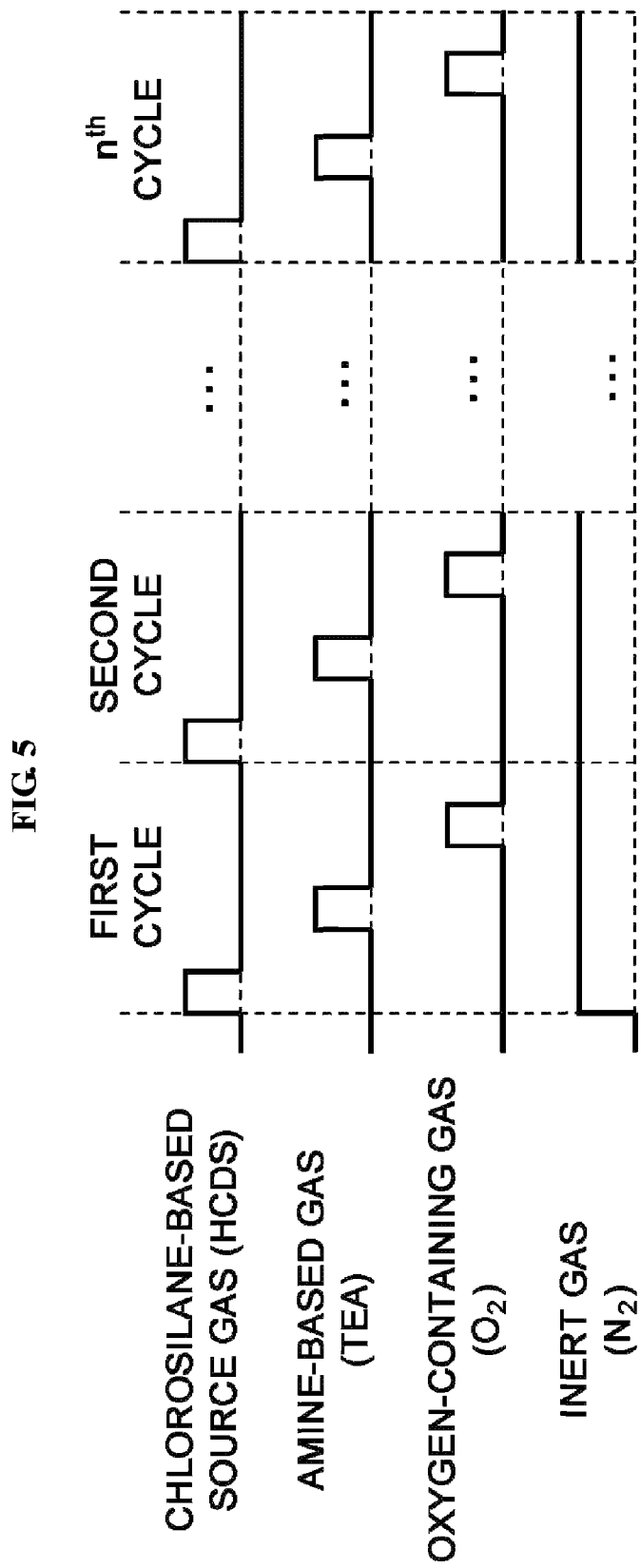

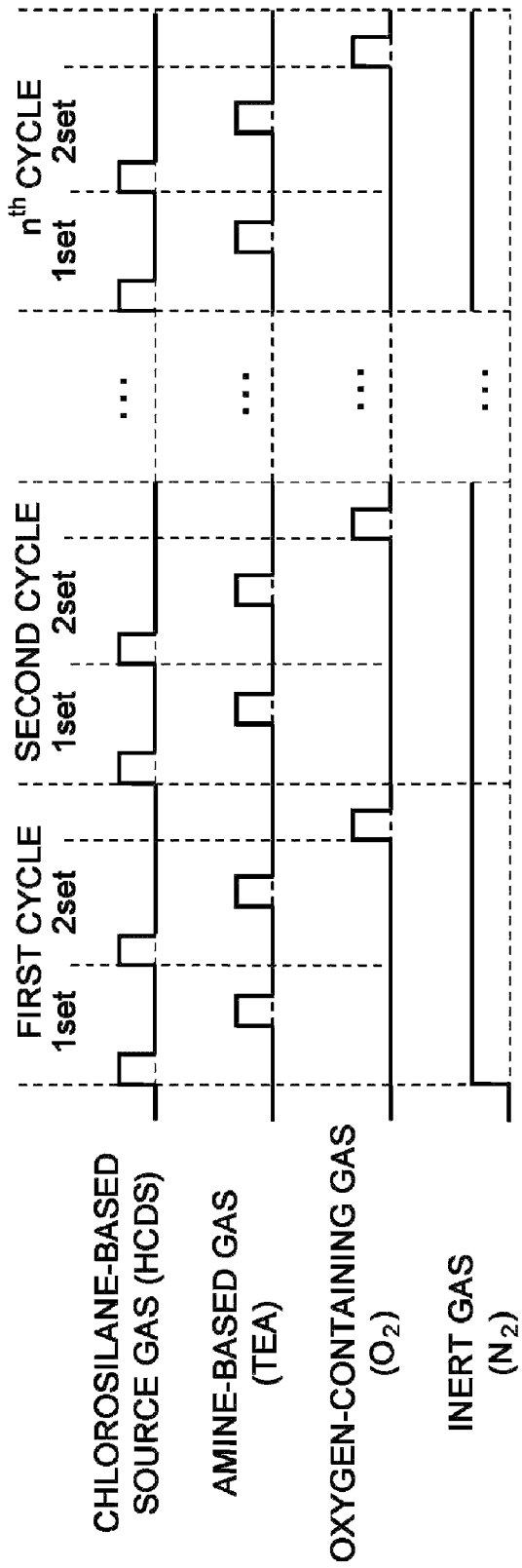

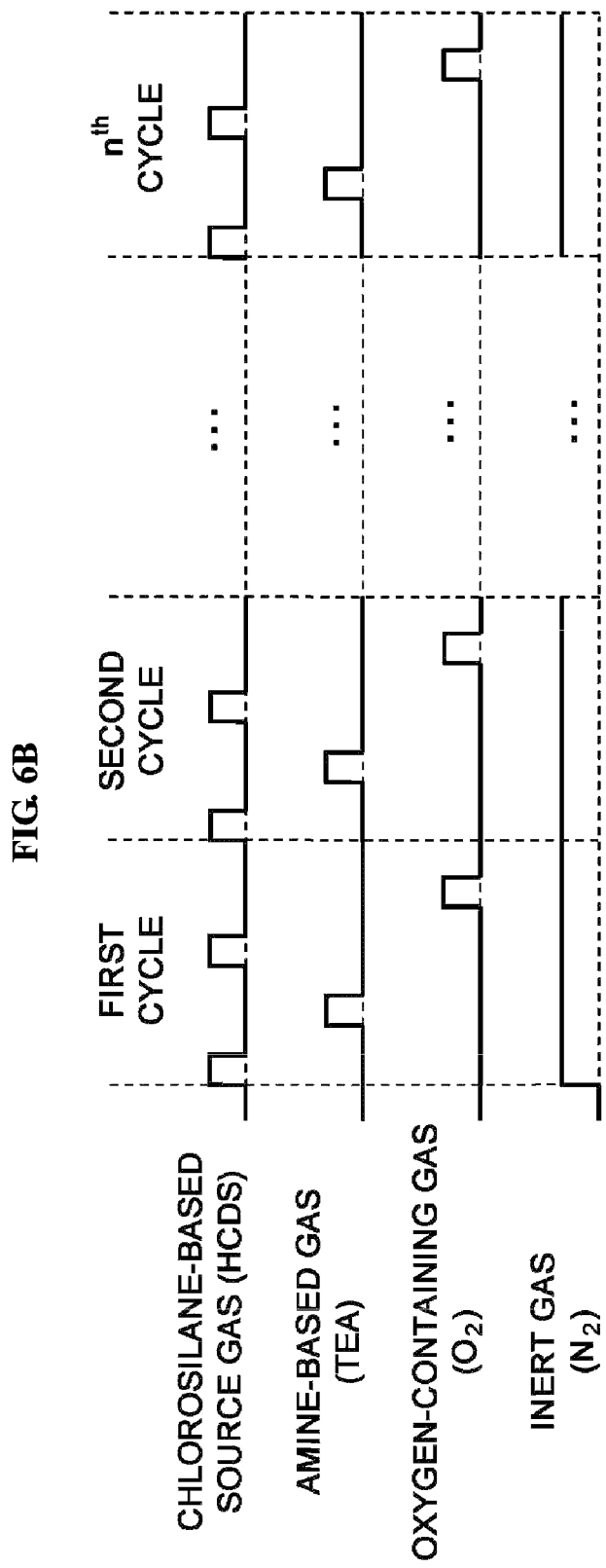

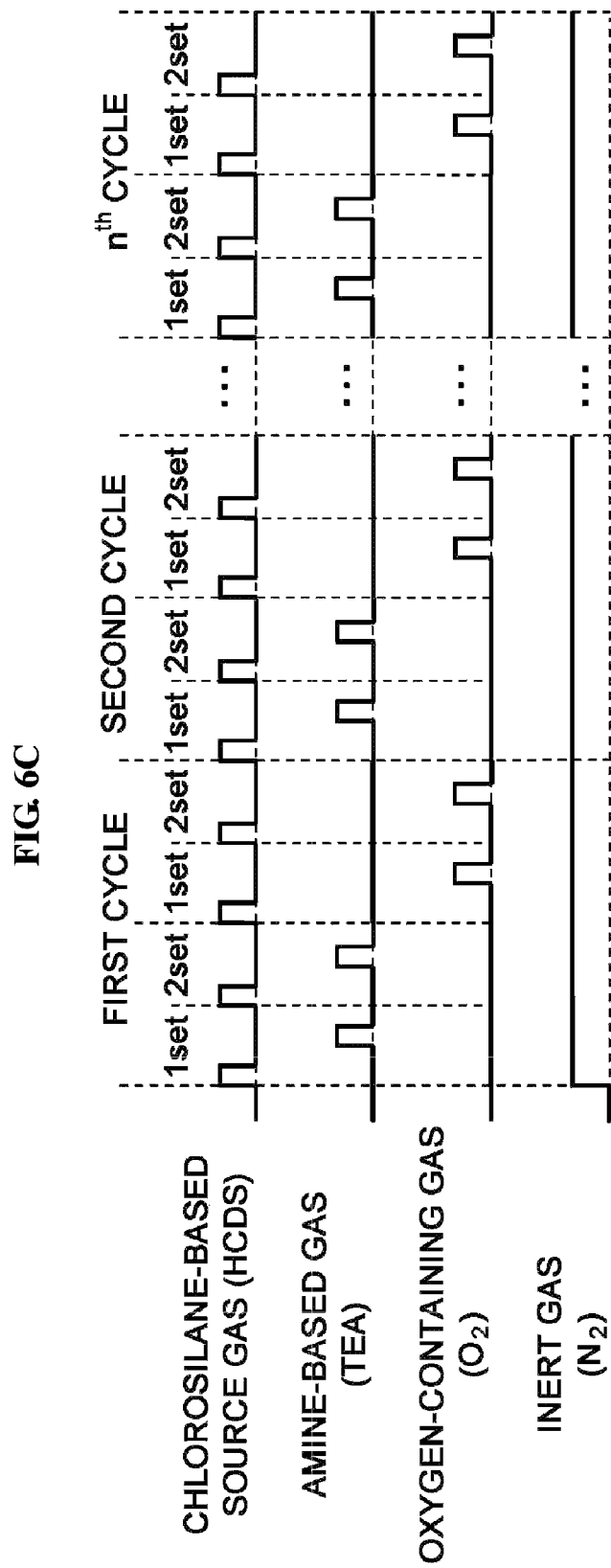

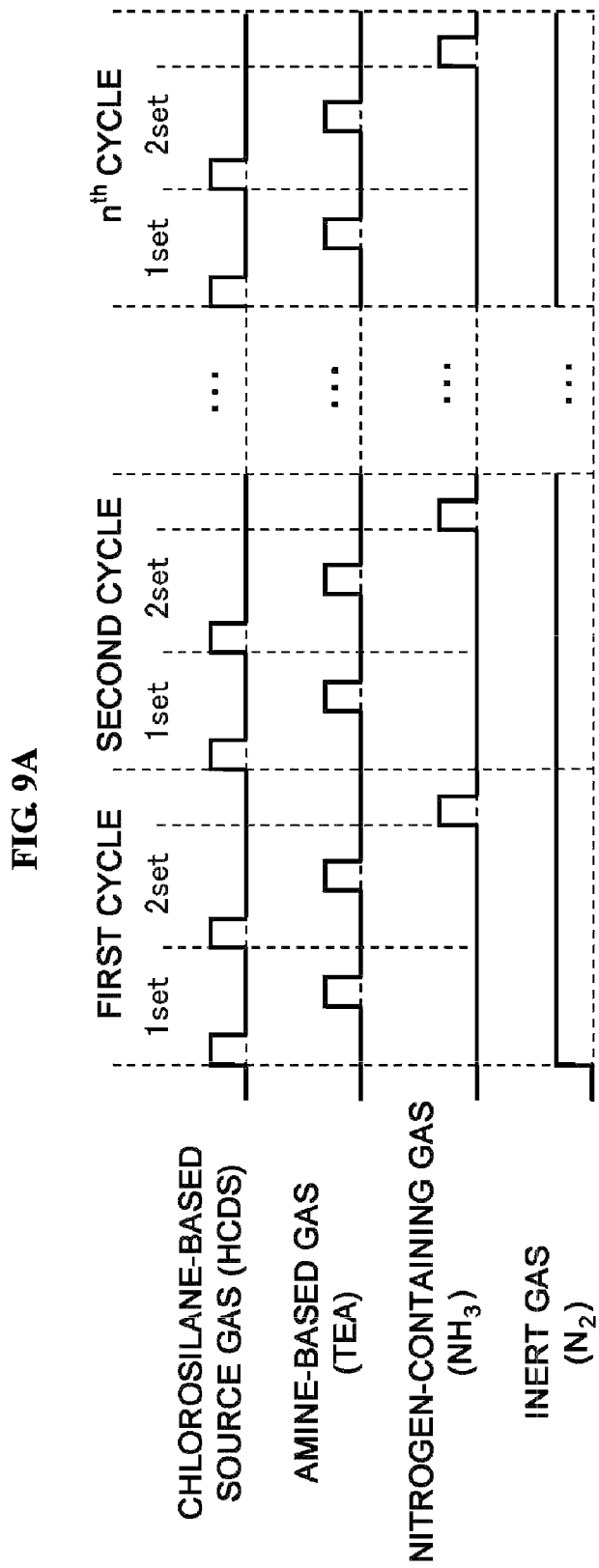

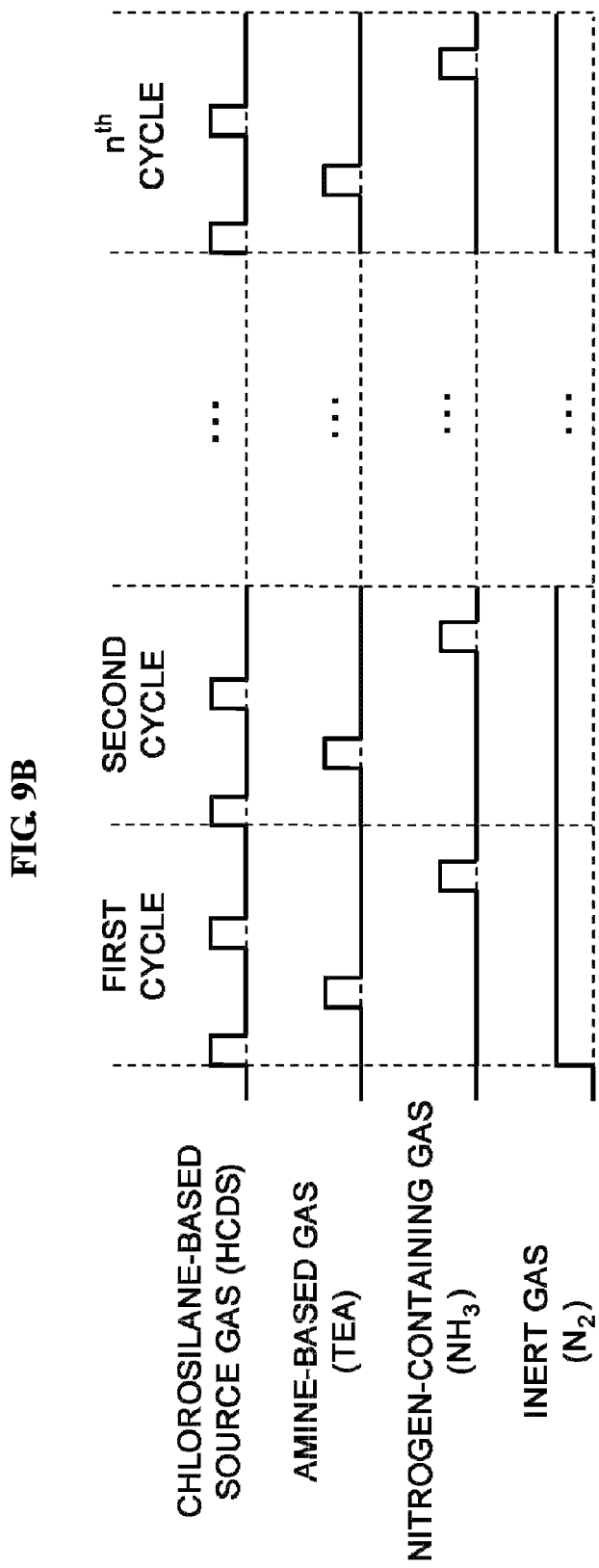

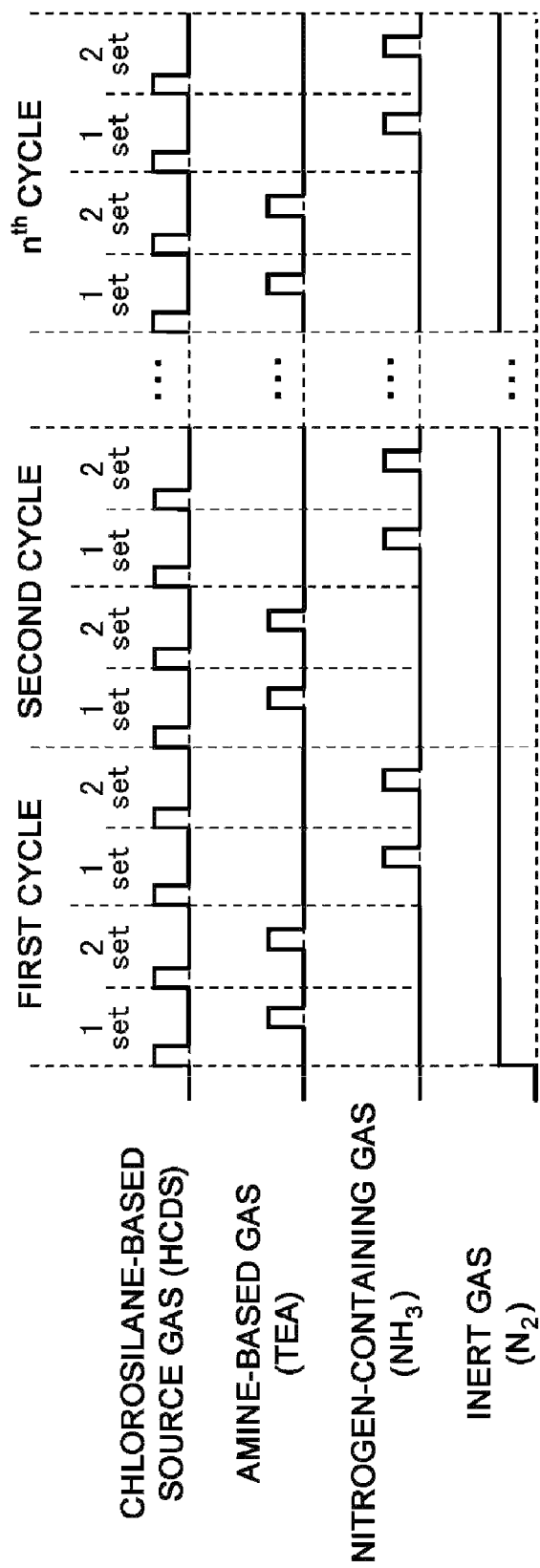

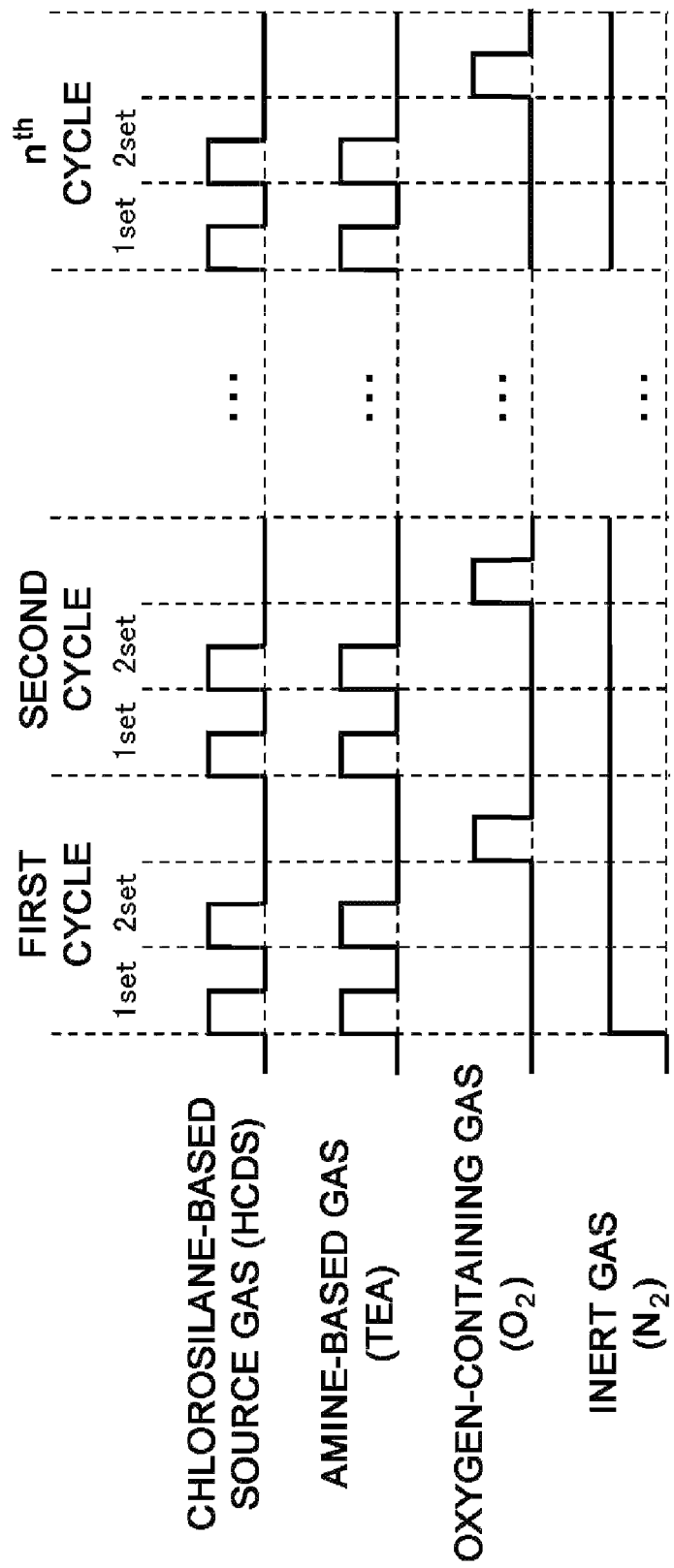

FIG. 16

| THICKNESS MAP | CENTER | | |
|---|---|---|---|
| CONDITIONS | $O_2$ 0 sec | $O_2$ 3 sec | $O_2$ 6 sec |
| FILM THICKNESS AVERAGE (Å) | 277.6 | 194.7 | 183.2 |
| UNIFORMITY WIW | 2.7 | 2.9 | 2.1 |
| UNIFORMITY WTW | 2.5 | 2.2 | 2.4 |
| R.I. | 2.2 | 1.8 | 1.6 |
| XPS:Si/C/N/O | 40/42/15/3 | 36/20/12/32 | 36/9/9/46 |
| WER for 1.0%aHF (Å/min) | 0.5 | 2.5 | 12.9 |
| | ESTIMATION SAMPLE A | ESTIMATION SAMPLE B | ESTIMATION SAMPLE C |

FIG. 17

|  |  | CENTER |
|---|---|---|
| ESTIMATION SAMPLE D | THICKNESS MAP |  |
|  | THICKNESS(AVERAGE) | 110.4 Å |
|  | UNIFORMITY WIW | 1.8 % |
|  | UNIFORMITY WTW | 0.8 % |
|  | CYCLE RATE | 0.55 Å /cycle |
|  | XRF:Si/O/C/N | 56.7/33.5/8.0/1.8 |
|  | WER for 1.0% HF | - |
|  | R.I(AVERAGE) | 1.57 |

FIG. 18

| | | CENTER |
|---|---|---|
| ESTIMATION SAMPLE E | THICKNESS MAP | |
| | THICKNESS (AVERAGE) | 129.5 Å |
| | UNIFORMITY WIW | 2.0 % |
| | UNIFORMITY WTW | 1.1 % |
| | CYCLE RATE | 0.55 Å /cycle |
| | XRF:Si/O/C/N | 55.1/31.6/10.2/3.1 |
| | WER for 1.0% HF | 5.2 Å /min |
| | R.I.(AVERAGE) | 1.59 |
| ESTIMATION SAMPLE F | THICKNESS MAP | |
| | THICKNESS (AVERAGE) | 138.5 Å |
| | UNIFORMITY WIW | 2.0 % |
| | UNIFORMITY WTW | 1.3 % |
| | CYCLE RATE | 0.87 Å /cycle |
| | XRF:Si/O/C/N | 56.1/32.7/6.1/5.1 |
| | WER for 1.0% HF | 5.1 Å /min |
| | R.I.(AVERAGE) | 1.59 |

METHOD OF MANUFACTURING SEMICONDUCTOR DEVICE AND SUBSTRATE PROCESSING METHOD

CROSS REFERENCE TO RELATED APPLICATIONS

This application is a continuation of U.S. patent application Ser. No. 14/706,221 filed May 7, 2015, entitled "Method Of Manufacturing Semiconductor Device And Substrate Processing Method", which is a continuation of U.S. patent application Ser. No. 13/708,966, filed Dec. 8, 2012, which claims foreign priority under 35 U.S.C. §119 (a)-(d) to Japanese Patent Application No. 2011-270723 filed on Dec. 9, 2011, and Japanese Patent Application No. 2012-233850 filed on Oct. 23, 2012, the entire contents of each of which are hereby incorporated by reference.

FIELD OF THE INVENTION

The present invention relates to a method of manufacturing a semiconductor device including a process of forming a thin film on a substrate, a method of processing a substrate, a substrate processing apparatus and a non-transitory computer readable recording medium.

BACKGROUND

A process of manufacturing a semiconductor device includes a process of forming a silicon-based insulating film such as a silicon oxide film ($SiO_2$), a silicon nitride film ($Si_3N_4$), or the like, on a substrate such as a silicon wafer, i.e., an insulating film containing silicon, which is a predetermined element. The silicon oxide film is widely used as an insulating film or an interlayer film having a high insulation property and low permittivity. In addition, the silicon nitride film has a good insulation property, corrosion resistance, permittivity, film stress controllability, or the like, and is widely used as an insulating film, a mask film, a charge accumulation film, or a stress control film. Further, a technique of adding carbon (C) into the insulating film is also already known, and thus etching resistance of the insulating film can be improved.

However, while the etching resistance of the insulating film can be improved by adding carbon into the insulating film, permittivity may be increased to deteriorate a leak resistance. That is, while the insulating films have both merits and demerits, in the related art, there is no thin film having characteristics of low permittivity, high etching resistance, and high leak resistance.

SUMMARY

Accordingly, the present invention is directed to provide a method of manufacturing a semiconductor device in which a thin film having characteristics of low permittivity, high etching resistance and high leak resistance can be formed, a method of processing a substrate, a substrate processing apparatus and a non-transitory computer readable recording medium.

According to an aspect of the present invention, there is provided a method of manufacturing a semiconductor device, including: forming a film containing a predetermined element, oxygen, carbon and nitrogen on a substrate by performing a cycle a predetermined number of times, the cycle including: (a) supplying a source gas containing the predetermined element and a halogen element to the substrate; (b) supplying a first reactive gas containing the three elements including carbon, nitrogen and hydrogen wherein a number of carbon atoms in each molecule of the first reactive gas is greater than that of nitrogen atoms in each molecule of the first reactive gas to the substrate; (c) supplying a nitriding gas as a second reactive gas to the substrate; and (d) supplying an oxidizing gas as a third reactive gas to the substrate, wherein (a) through (d) are non-simultaneously performed.

According to another aspect of the present invention, there is provided a substrate processing method including: forming a film containing a predetermined element, oxygen, carbon and nitrogen on a substrate by performing a cycle a predetermined number of times, the cycle including: (a) supplying a source gas containing the predetermined element and a halogen element to the substrate; (b) supplying a first reactive gas containing three elements including carbon, nitrogen and hydrogen wherein a number of carbon atoms in each molecule of the first reactive gas is greater than that of nitrogen atoms in each molecule of the first reactive gas to the substrate; (c) supplying a nitriding gas as a second reactive gas to the substrate; and (d) supplying an oxidizing gas as a third reactive gas to the substrate, wherein (a) through (d) are non-simultaneously performed.

According to still another aspect of the present invention, there is provided a method of manufacturing a semiconductor device, including: forming a film containing a predetermined element, oxygen, carbon and nitrogen on a substrate by performing a cycle a predetermined number of times, the cycle including: (a) forming a first layer containing the predetermined element, nitrogen and carbon by alternately performing, a predetermined number of times, supplying a source gas containing the predetermined element and a halogen element to the substrate; and supplying a first reactive gas containing three elements including carbon, nitrogen and hydrogen wherein a number of carbon atoms in each molecule of the first reactive gas is greater than that of nitrogen atoms in each molecule of the first reactive gas to the substrate; (b) nitriding the first layer by supplying a nitriding gas as a second reactive gas to the substrate; and (c) oxidizing the first layer nitrided in (b) by supplying an oxidizing gas as a third reactive gas to the substrate, wherein the steps (a) through (c) are non-simultaneously performed.

According to yet another aspect of the present invention, there is provided a non-transitory computer-readable recording medium storing a program that causes a computer to perform a process of forming a thin film containing a predetermined element on a substrate in a process chamber by performing a cycle a predetermined number of times, the cycle including: a process of forming a first layer containing the predetermined element, nitrogen and carbon by alternately performing supplying a source gas containing the predetermined element and a halogen element to the substrate in the process chamber and supplying a first reactive gas containing three elements including the carbon, the nitrogen and hydrogen and having a composition wherein a number of carbon atoms is greater than that of nitrogen atoms to the substrate in the process chamber a predetermined number of times; and a process of forming a second layer by supplying a second reactive gas different from the source gas and the first reactive gas to the substrate in the process chamber to modify the first layer.

BRIEF DESCRIPTION OF THE DRAWINGS

FIG. 5 is a view showing a gas supply timing in a film-forming sequence of the first embodiment of the present invention;

FIGS. 6A through 6C are views showing variants of the gas supply timing in the film-forming sequence of the first embodiment of the present invention, FIG. 6A showing a variant 1, FIG. 6B showing a variant 2 and FIG. 6C showing a variant 3;

FIGS. 9A through 9C are views showing variants of the gas supply timing of the film-forming sequence of the second embodiment of the present invention, FIG. 9A showing a variant 1, FIG. 9B showing a variant 2 and FIG. 9C showing a variant 3;

FIGS. 15A and 15B are views showing variants of a gas supply timing in a film-forming sequence of another embodiment of the present invention;

FIG. 16 is a view showing various measurement results of a SiOCN of an example 1 of the present invention;

FIG. 17 is a view showing various measurement results of a SiOC film of an example 2 of the present invention; and FIG. 18 is a view showing various measurement results of a SiOCN film of an example 3 of the present invention.

DETAILED DESCRIPTION

First Embodiment of the Invention

Hereinafter, a first embodiment of the present invention will be described with reference to the accompanying drawings.

(1) Configuration of Substrate Processing Apparatus

Figure 1:
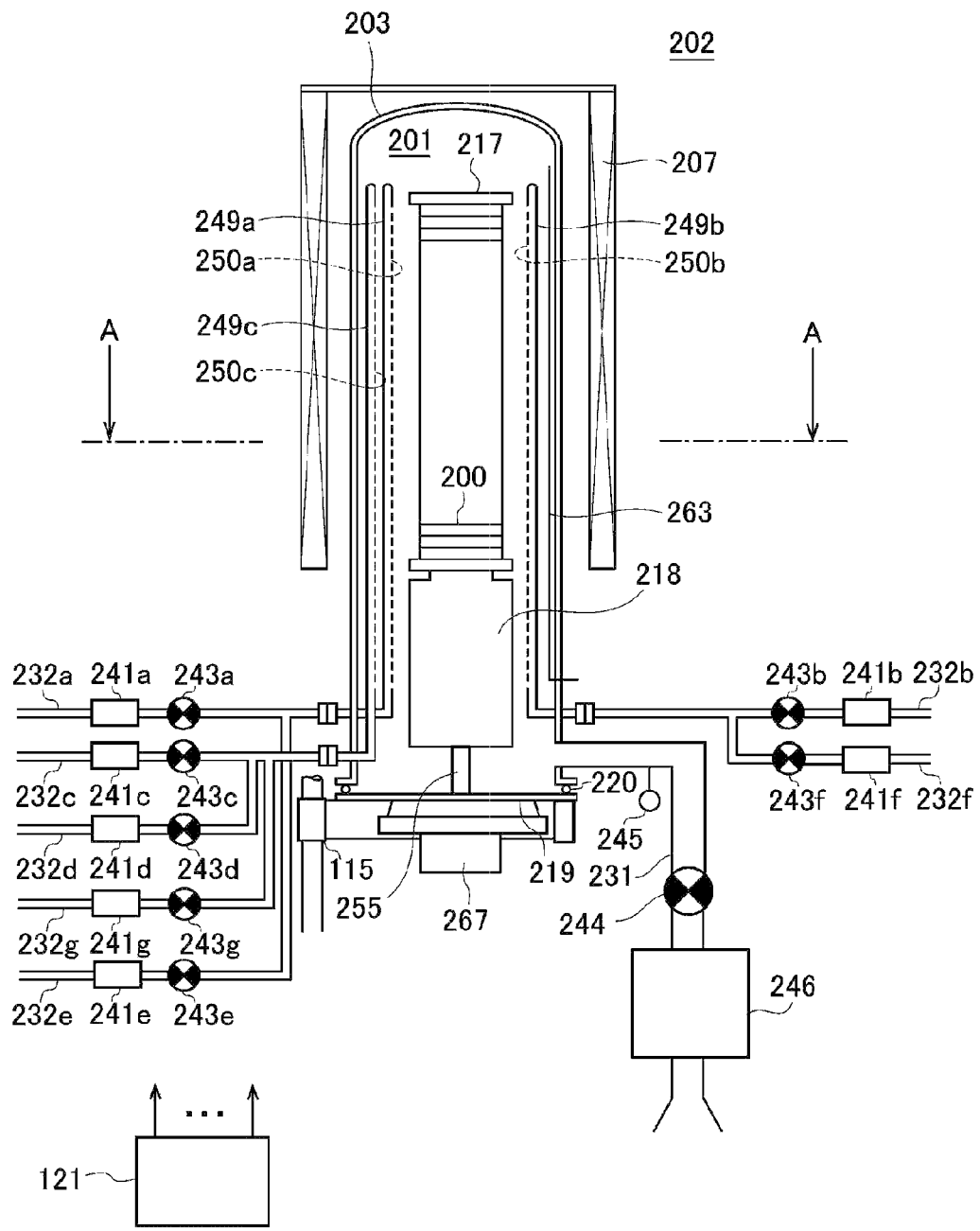
FIG. 1 is a schematic view of a vertical processing furnace of a substrate processing apparatus exemplarily used in an embodiment of the present invention, showing a longitudinal cross-sectional view of a processing furnace.
Figure 2:
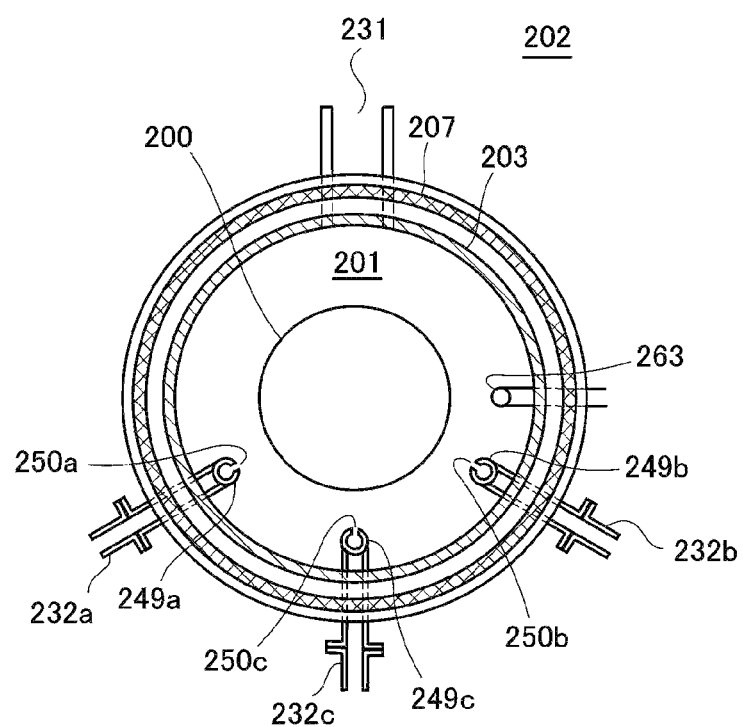
FIG. 2 is a schematic view of the vertical processing furnace of the substrate processing apparatus exemplarily used in the embodiment of the present invention, showing a cross-sectional view of the processing furnace taken along line A-A of FIG. 1.

FIG. 1 is a schematic view of a vertical processing furnace of a substrate processing apparatus exemplarily used in the embodiment, showing a longitudinal cross-sectional view of a the processing furnace 202. FIG. 2 is a schematic view of the vertical processing furnace exemplarily used in the embodiment, showing a cross-sectional view of the processing furnace 202 taken along line A-A of FIG. 1.

As shown in FIG. 1, the processing furnace 202 includes a heater 207, which is a heating unit (a heating mechanism). The heater 207 has a cylindrical shape and is supported by a heater base (not shown), which is a holding plate, to be vertically installed. In addition, the heater 207 may function as an activation mechanism (an excitation unit) configured to thermally activate (excite) a gas to be described below.

A reaction tube 203, which is concentric with the heater 207, constituting a reaction vessel (a processing vessel), is installed in the heater 207. The reaction tube 203 is formed of a heat-resistant material such as quartz ($SiO_2$) or silicon carbide (SiC), and has a cylindrical shape with an upper end closed and a lower end opened. A process chamber 201 is formed in a hollow cylindrical section of the reaction tube 203, and configured to accommodate wafers 200, which are substrates, in a state in which the wafers 200 are aligned in a vertical direction in a horizontal posture in a multi-stage manner by a boat 217.

A first nozzle 249a, a second nozzle 249b and a third nozzle 249c are installed in the process chamber 201 to pass through a lower portion of the reaction tube 203. A first gas supply pipe 232a, a second gas supply pipe 232b and a third gas supply pipe 232c are connected to the first nozzle 249a, the second nozzle 249b and the third nozzle 249c, respectively. In addition, a fourth gas supply pipe 232d is connected to the third gas supply pipe 232c. As described above, the three nozzles 249a, 249b and 249c and the four gas supply pipes 232a, 232b, 232c and 232d are installed at the reaction tube 203 to supply a plurality of kinds, in the embodiment, four kinds, of gases into the process chamber 201.

In addition, a manifold formed of metal and configured to support the reaction tube 203 may be installed under the reaction tube 203 such that the nozzles pass through a sidewall of the metal manifold. In this case, an exhaust pipe 231 (to be described later) may be installed at the metal manifold. In addition, even in this case, the exhaust pipe 231 may be installed at a lower portion of the reaction tube 203 rather than at the metal manifold. As described above, a furnace port of the processing furnace 202 may be formed of metal, and the nozzles may be installed at the furnace port formed of metal.

A mass flow controller (MFC) 241a, which is a flow rate controller (a flow rate control unit), and a valve 243a, which is an opening/closing valve, are installed at the first gas supply pipe 232a in sequence from an upstream direction. In addition, a first inert gas supply pipe 232e is connected to the first gas supply pipe 232a at a downstream side of the valve 243a. A mass flow controller 241e, which is a flow rate controller (a flow rate control unit), and a valve 243e, which is an opening/closing valve, are installed at the first inert gas supply pipe 232e in sequence from the upstream direction. In addition, the above-mentioned first nozzle 249a is connected to a front end of the first gas supply pipe 232a. The first nozzle 249a is installed in an arc-shaped space between an inner wall of the reaction tube 203 and the wafers 200 from a lower portion to an upper portion of the inner wall of the reaction tube 203 to rise upward in a stacking direction of the wafers 200. That is, the first nozzle 249a is installed in a side region of a wafer arrangement region, in which the wafers 200 are arranged, horizontally surrounding the wafer arrangement region along the wafer arrangement region.

The first nozzle 249a is configured as an L-shaped long nozzle, and has a horizontal section installed to pass through a lower sidewall of the reaction tube 203 and a vertical section installed to rise from one end side toward the other end side of at least the wafer arrangement region. Gas supply holes 250a configured to supply a gas are installed at side surfaces of the first nozzle 249a. The gas supply holes 250a are opened toward a center of the reaction tube 203, and enable supply of the gas toward the wafers 200. The plurality of gas supply holes 250a are formed from a lower portion to an upper portion of the reaction tube 203, and have the same opening area and are formed at the same opening pitch.

A first gas supply system is constituted by mainly the first gas supply pipe 232a, the mass flow controller 241a and the valve 243a. In addition, the first nozzle 249a may be included in the first gas supply system. Further, a first inert gas supply system is constituted by mainly the first inert gas supply pipe 232e, the mass flow controller 241e and the valve 243e. The first inert gas supply system functions as a purge gas supply system.

A mass flow controller (MFC) 241b, which is a flow rate controller (a flow rate control unit), and a valve 243b, which is an opening/closing valve, are installed at the second gas supply pipe 232b in sequence from the upstream direction. In addition, a second inert gas supply pipe 232f is connected to the second gas supply pipe 232b at a downstream side of the valve 243b. A mass flow controller 241f, which is a flow rate controller (a flow rate control unit), and a valve 243f, which is an opening/closing valve, are installed at the second inert gas supply pipe 232f in sequence from the upstream direction. In addition, the above-mentioned second nozzle 249b is connected to a front end of the second gas supply pipe 232b. The second nozzle 249b is installed in an arc-shaped space between the inner wall of the reaction tube 203 and the wafers 200 from the lower portion to the upper portion of the inner wall of the reaction tube 203 to rise upward in the stacking direction of the wafers 200. That is, the second nozzle 249b is installed in a side region of the wafer arrangement region, in which the wafers 200 are arranged, horizontally surrounding the wafer arrangement region along the wafer arrangement region. The second nozzle 249b is configured as an L-shaped long nozzle, and has a horizontal section installed to pass through the lower sidewall of the reaction tube 203 and a vertical section installed to rise from one end side toward the other end side of at least the wafer arrangement region. Gas supply holes 250b configured to supply a gas are formed in side surfaces of the second nozzle 249b. The gas supply holes 250b are opened toward the center of the reaction tube 203, and enable supply of the gas toward the wafers 200. The plurality of gas supply holes 250b are formed from the lower portion to the upper portion of the reaction tube 203, and have the same opening area and are formed at the same opening pitch.

A second gas supply system is constituted by mainly the second gas supply pipe 232b, the mass flow controller 241b and the valve 243b. In addition, the second nozzle 249b may be included in the second gas supply system. Further, a second inert gas supply system is constituted by mainly the second inert gas supply pipe 232f, the mass flow controller 241f and the valve 243f. The second inert gas supply system may function as a purge gas supply system.

A mass flow controller (MFC) 241c, which is a flow rate controller (a flow rate control unit), and a valve 243c, which is an opening/closing valve, are installed at the third gas supply pipe 232c in sequence from the upstream direction. In addition, the fourth gas supply pipe 232d is connected to the third gas supply pipe 232c at a downstream side of the valve 243c. A mass flow controller 241d, which is a flow rate controller (a flow rate control unit), and a valve 243d, which is an opening/closing valve, are installed at the fourth gas supply pipe 232d in sequence from the upstream direction. In addition, a third inert gas supply pipe 232g is connected to the third gas supply pipe 232c at a downstream side of the connecting position of the fourth gas supply pipe 232d. A mass flow controller 241g, which is a flow rate controller (a flow rate control unit), and a valve 243g, which is an opening/closing valve, are installed at the third inert gas supply pipe 232g in sequence from the upstream direction. In addition, the above-mentioned third nozzle 249c is connected to a front end of the third gas supply pipe 232c. The third nozzle 249c is installed in an arc-shaped space between the inner wall of the reaction tube 203 and the wafers 200 from the lower portion to the upper portion of the inner wall of the reaction tube 203 to rise upward in the stacking direction of the wafers 200. That is, the third nozzle 249c is installed at a side region of the wafer arrangement region, in which the wafers 200 are arranged, horizontally surrounding the wafer arrangement region along the wafer arrangement region. The third nozzle 249c is configured as an L-shaped long nozzle, and has a horizontal section installed to pass through the lower sidewall of the reaction tube 203 and a vertical section installed to rise from one end side toward the other end side of at least the wafer arrangement region. Gas supply holes 250c configured to supply a gas are installed in side surfaces of the third nozzle 249c. The gas supply holes 250c are opened toward the center of the reaction tube 203, and enable supply of the gas toward the wafers 200. The plurality of gas supply holes 250c are installed from the lower portion to the upper portion of the reaction tube 203, and have the same opening area and are formed at the same opening pitch.

A third gas supply system is constituted by mainly the third gas supply pipe 232c, the mass flow controller 241c and the valve 243c. In addition, the third nozzle 249c may be included in the third gas supply system. Further, a fourth gas supply system is constituted by mainly the fourth gas supply pipe 232d, the mass flow controller 241d and the valve 243d. Furthermore, the third nozzle 249c may be included in the fourth gas supply system at a downstream side of the connecting position of the third gas supply pipe 232c with respect to the fourth gas supply pipe 232d. In addition, a third inert gas supply system is constituted by mainly the third inert gas supply pipe 232g, the mass flow controller 241g and the valve 243g. The third inert gas supply system also functions as a purge gas supply system.

As described above, in the method of supplying a gas of the embodiment, the gas is conveyed via the nozzles 249a, 249b and 249c disposed in an arc-shaped long space in a longitudinal direction defined by the inner wall of the reaction tube 203 and ends of the plurality of stacked wafers 200, the gas is first ejected into the reaction tube 203 near the wafers 200 through the gas supply holes 250a, 250b, 250c opened in the nozzles 249a, 249b and 249c, respectively, and thus a main flow of the gas in the reaction tube 203 follows a direction parallel to surfaces of the wafers 200, i.e., the horizontal direction. According to the above-mentioned configuration, the gas can be uniformly supplied to the wafers 200, and thus a film thickness of a thin film formed on each of the wafers 200 can be uniformized. In addition, while the gas flowing on the surfaces of the wafers 200, i.e., a residual gas after reaction, flows toward an exhaust port, i.e., in a direction of the exhaust pipe 231, a flow direction of the residual gas is not limited to the vertical direction but may be appropriately specified by a position of the exhaust port.

A chlorosilane-based source gas, which is a source gas containing, for example, at least silicon (Si) and chlorine (Cl), is supplied into the process chamber 201 via the mass flow controller 241a, the valve 243a and the first nozzle 249a through the first gas supply pipe 232a as a source gas containing a predetermined element and a halogen element. Here, the chlorosilane-based source gas refers to a chlorosilane-based source material in a gaseous state, for example, a gas obtained by vaporizing a chlorosilane-based source material in a liquid state under a normal temperature and a normal pressure, or a chlorosilane-based source material in a gaseous state under a normal temperature and a normal pressure. In addition, the chlorosilane-based source material refers to a silane-based source material containing a chloro group, which is a halogen group, and refers to a source material containing at least silicon (Si) and chlorine (Cl). That is, the chlorosilane-based source material described herein may be referred to as a kind of halide. In addition, when the term "source material" is used herein, it may refer to "a liquid source material in a liquid state," "a source gas in a gaseous state," or both of these. Accordingly, when the term "chlorosilane-based source material" is used herein, it may refer to "a chlorosilane-based source material in a liquid state," "a chlorosilane-based source gas in a gaseous state," or both of these. For example, hexachlorodisilane ($Si_2Cl_6$, abbreviation: HCDS) gas containing halogen ligands (Cl) may be used as the chlorosilane-based source gas. The number of the ligands (Cl) containing a halogen group of HCDS in one molecule is 6. That is, the number of the ligands (Cl) containing a halogen group of HCDS in the compositional formula of HCDS is 6. In addition, when the liquid source material in a liquid state under a normal temperature and a normal pressure like HCDS is used, the liquid source material is vaporized by a vaporization system such as a vaporizer or a bubbler to be supplied as a source gas (an HCDS gas).

A gas containing, for example, amine, i.e., an amine-based gas, is supplied into the process chamber 201 via the mass flow controller 241b, the valve 243b and the second nozzle 249b through the second gas supply pipe 232b as a first reactive gas containing carbon (C) and nitrogen (N). Here, the amine-based gas refers to amine in a gaseous state, for example, a gas containing amine group such as a gas obtained by vaporizing amine in a liquid state under a normal temperature and a normal pressure, or amine in a gaseous state under a normal temperature and a normal pressure. The amine-based gas contains amine such as ethylamine, methylamine, propylamine, isopropylamine, butylamine, isobutylamine, or the like. Here, amine is a general name of compound in which a hydrogen element of ammonia ($NH_3$) is substituted with a hydrocarbon group such as an alkyl group. That is, amine contains a hydrocarbon group such as an alkyl group or the like as a ligand containing a carbon atom. The amine-based gas may be referred to as a gas containing no silicon because the amine-based gas contains three elements including carbon (C), nitrogen (N) and hydrogen (H) and does not contain silicon (Si), or may be referred to as a gas containing no silicon and no metal because the amine-based gas does not contain silicon or metal. In addition, the amine-based gas may be a nitrogen-containing gas, a carbon-containing gas, or a hydrogen-containing gas. The amine-based gas may be referred to as a material containing only the three elements including carbon (C), nitrogen (N) and hydrogen (H). In addition, when the term "amine" is used herein, it may refer to "amine in a liquid state," "an amine-based gas in a gaseous state," or both of these. For example, triethylamine [$(C_2H_5)_3N$, abbreviation: TEA] gas containing ethyl ligands ($C_2H_5$) may be used as the amine-based gas. The number of the ligands (ethyl group) containing a carbon atom of TEA in one molecule is 3, that is, the number of the ligands (ethyl group) containing a carbon atom of TEA in the compositional formula of TEA is 3. TEA has a composition wherein the number of carbon atoms is greater than that of nitrogen atoms. In addition, when amine in a liquid state under a normal temperature and a normal pressure such as TEA is used, the amine in a liquid state is vaporized by a vaporization system such as a vaporizer or a bubbler to be supplied as a first reactive gas (TEA gas).

The first reactive gas has a composition wherein the number of carbon atoms is greater than that of nitrogen atoms. That is, the number of carbon atoms is greater than that of nitrogen atoms in the compositional formula of the material constituting the first reactive gas. That is, the number of carbon atoms is greater than that of nitrogen atoms in one molecule of the material constituting the first reaction gas.

Further, the first reaction gas contains a plurality of ligands containing carbon atoms. That is, a plurality of ligands containing carbon atoms are contained in the compositional formula of the material constituting the first reactive gas.

For example, a gas containing oxygen (O) (an oxygen-containing gas), i.e., an oxidizing gas, is supplied into the process chamber 201 via the mass flow controller 241c, the valve 243c and the third nozzle 249c through the third gas supply pipe 232c as a second reactive gas different from the source gas and the first reactive gas. For example, oxygen ($O_2$) gas may be used as the oxygen-containing gas (the oxidizing gas).

For example, a gas containing nitrogen (N) (a nitrogen-containing gas), i.e., a nitriding gas, is supplied into the process chamber 201 via the mass flow controller 241d, the valve 243d, the third gas supply pipe 232c and the third nozzle 249c through the fourth gas supply pipe 232d as the second reactive gas different from the source gas and the first reactive gas. For example, ammonia ($NH_3$) gas may be used as the nitrogen-containing gas (the nitriding gas).

For example, nitrogen ($N_2$) gas is supplied as an inert gas into the process chamber 201 via the mass flow controllers 241e, 241f and 241g, the valves 243e, 243f and 243g, the gas supply pipes 232a, 232b and 232c, and the nozzles 249a, 249b and 249c through inert gas supply pipes 232e, 232f and 232g.

In addition, for example, when the above-mentioned gases flow through the gas supply pipes, a source gas supply system configured to supply a source gas containing a predetermined element and a halogen group, i.e., a chlorosilane-based source gas supply system, is constituted by the first gas supply system. Further, the chlorosilane-based source gas supply system may be simply referred to as a chlorosilane-based source material supply system. Furthermore, a first reactive gas supply system, i.e., an amine-based gas supply system, is constituted by the second gas supply system. In addition, the amine-based gas supply system may be simply referred to as an amine supply system. Further, a second reactive gas supply system, i.e., an oxygen-containing gas supply system, which is an oxidizing gas supply system, is constituted by the third gas supply system.

Furthermore, a second reactive gas supply system, i.e., a nitrogen-containing gas supply system, which is a nitriding gas supply system, is constituted by the fourth gas supply system.

The exhaust pipe 231 configured to exhaust an atmosphere in the process chamber 201 is installed at the reaction tube 203. As shown in FIG. 2, when seen in a horizontal cross-sectional view, the exhaust pipe 231 is installed at a side of the reaction tube 203 opposite to a side in which the gas supply hole 250a of the first nozzle 249a, the gas supply hole 250b of the second nozzle 249b and the gas supply hole 250c of the third nozzle 249c are formed, i.e., an opposite side of the gas supply holes 250a, 250b and 250c with the wafer 200 interposed therebetween. In addition, as shown in FIG. 1, when seen in a longitudinal cross-sectional view, the exhaust pipe 231 is installed under a place in which the gas supply holes 250a, 250b and 250c are formed. According to the above-mentioned configuration, the gas supplied near the wafers 200 in the process chamber 201 through the gas supply holes 250a, 250b and 250c flows in the horizontal direction, i.e., a direction parallel to the surfaces of the wafers 200, and then flows downward to be exhausted through the exhaust pipe 231. As described above, a main flow of the gas in the process chamber 201 also becomes a flow in the horizontal direction.

A vacuum pump 246, which is a vacuum exhaust apparatus, is connected to the exhaust pipe 231 via a pressure sensor 245, which is a pressure detector (a pressure detection unit), configured to detect a pressure in the process chamber 201, and an auto pressure controller (APC) valve 244, which is a pressure adjuster (a pressure adjusting unit). In addition, the APC valve 244 is a valve that can open/close a valve to perform vacuum exhaust and vacuum exhaust stoppage in the process chamber 201 in a state in which the vacuum pump 246 is operated, and that can adjust a valve opening angle to adjust a pressure in the process chamber 201 in a state in which the vacuum pump 246 is operated. An exhaust system is constituted by mainly the exhaust pipe 231, the APC valve 244 and the pressure sensor 245. In addition, the vacuum pump 246 may be included in the exhaust system. The exhaust system is configured to adjust the valve opening angle of the APC valve 244 based on pressure information detected by the pressure sensor 245 while operating the vacuum pump 246 such that the pressure in the process chamber 201 is vacuum-exhausted to a predetermined pressure (a vacuum level).

A seal cap 219, which is a furnace port cover configured to hermetically close a lower end opening of the reaction tube 203, is installed under the reaction tube 203. The seal cap 219 is configured to contact a lower end of the reaction tube 203 from a lower side in the vertical direction. The seal cap 219 is formed of metal such as stainless steel, and has a disc shape. An O-ring 220, which is a seal member in contact with the lower end of the reaction tube 203, is installed at an upper surface of the seal cap 219. A rotary mechanism 267 configured to rotate the boat 217, which is a substrate holder (to be described later), is installed at the seal cap 219 opposite to the process chamber 201. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to be raised and lowered in the vertical direction by a boat elevator 115, which is an elevation mechanism vertically installed at the outside of the reaction tube 203. The boat elevator 115 is configured to load and unload the boat 217 into and from the process chamber 201 by raising and lowering the seal cap 219. That is, the boat elevator 115 is configured as a conveyance apparatus (a conveyance mechanism) configured to convey the boat 217, i.e., the wafers 200, into and from the process chamber 201.

The boat 217, which is a substrate support, is formed of a heat-resistant material such as quartz or silicon carbide, and configured to concentrically align the plurality of wafers 200 in a horizontal posture in a multi-stage manner. In addition, an adiabatic member 218 formed of a heat-resistant material such as quartz or silicon carbide is installed at a lower portion of the boat 217, and configured such that heat from the heater 207 cannot be transferred to the seal cap 219. In addition, the adiabatic member 218 may be constituted by a plurality of adiabatic plates formed of a heat-resistant material such as quartz or silicon carbide, and an adiabatic plate holder configured to support the adiabatic plates in a horizontal posture in a multi-stage manner.

A temperature sensor 263, which is a temperature detector, is installed in the reaction tube 203, and configured to adjust an electrical connection state to the heater 207 based on temperature information detected by the temperature sensor 263 such that the temperature in the process chamber 201 reaches a desired temperature distribution. The temperature sensor 263 is constituted in an L shape like the nozzles 249a, 249b and 249c, and installed along the inner wall of the reaction tube 203.

Figure 3:
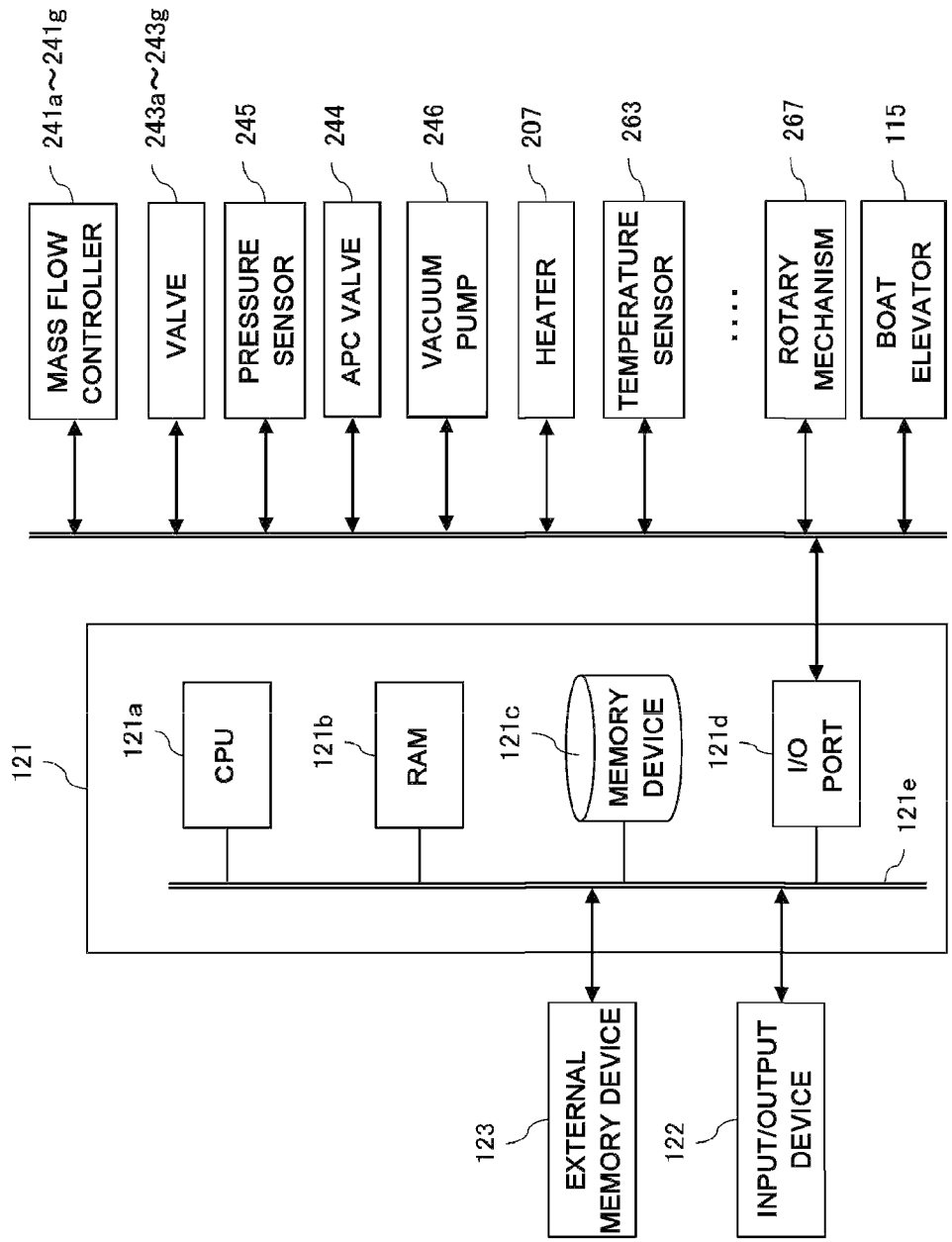
FIG. 3 is a schematic view of a controller of the substrate processing apparatus exemplarily used in the embodiment of the present invention.

As shown in FIG. 3, a controller 121, which is a control unit (a control part), is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, for example, a touch panel, is connected to the controller 121.

The memory device 121c is constituted by, for example, a flash memory, a hard disk drive (HDD), or the like. A control program for controlling an operation of the substrate processing apparatus or a process recipe, in which a sequence or condition for processing a substrate (to be described later) is written, is readably stored in the memory device 121c. In addition, the process recipe, which functions as a program, is combined to execute each sequence in the substrate processing process (to be described later) in the controller 121 to obtain a predetermined result. Hereinafter, the process recipe or control program may be generally simply referred to as a program. In addition, when term "program" is used herein, it may include the case in which the process recipe is solely included, the case in which the control program is solely included, or the case in which both of these are included. In addition, the RAM 121b is configured as a memory region (a work area) in which a program or data read by the CPU 121a is temporarily stored.

The I/O port 121d is connected to the mass flow controllers 241a, 241b, 241c, 241d, 241e, 241f and 241g, the valves 243a, 243b, 243c, 243d, 243e, 243f and 243g, the pressure sensor 245, the APC valve 244, the vacuum pump 246, the heater 207, the temperature sensor 263, the rotary mechanism 267, the boat elevator 115, and so on.

The CPU 121a is configured to read and execute the control program from the memory device 121c and read the process recipe from the memory device 121c according to input of an operation command from the input/output device 122. In addition, the CPU 121a is configured to control flow rate controlling operations of various gases by the mass flow controllers 241a, 241b, 241c, 241d, 241e, 241f and 241g according to contents of the read process recipe, opening/ closing operations of the valves 243a, 243b, 243c, 243d, 243e, 243f and 243g, an opening/closing operation of the APC valve 244 and a pressure adjusting operation by the APC valve 244 based on the pressure sensor 245, a temperature adjusting operation of the heater 207 based on the temperature sensor 263, start and stop of the vacuum pump 246, a rotation and rotation speed adjustment operation of the boat 217 by the rotary mechanism 267, an elevation operation of the boat 217 by the boat elevator 115, and so on.

In addition, the controller 121 is not limited to being configured as an exclusive computer but may be configured as a general-purpose computer. For example, the controller 121 according to the embodiment can be configured by preparing an external memory device 123, in which the program is stored [for example, a magnetic tape, a magnetic disk such as a flexible disk or a hard disk, an optical disc such as a CD or DVD, an optomagnetic disc such as an MO, a semiconductor memory such as a USB memory or a memory card], and installing the program on the general-purpose computer using the external memory device 123. In addition, a unit configured to supply a program to a computer is not limited to the case in which the program is supplied via the external memory device 123. For example, the program may be supplied using a communication means such as the Internet or a dedicated line, rather than via the external memory device 123. Further, the memory device 121c or the external memory device 123 is configured as a non-transitory computer readable recording medium, which is readable by a computer. Hereinafter, these are generally simply referred to as recording media. Furthermore, when the term "non-transitory computer readable recording medium" is used herein, it may include the case in which the memory device 121c is solely included, the case in which the external memory device 123 is solely included, or the case in which both of these are included.

(2) Substrate Processing Process

Next, an example of forming a thin film on the wafer 200, which is one process of a process of manufacturing a semiconductor device using the processing furnace 202 of the above-mentioned substrate processing apparatus, will be described. In addition, in the following description, operations of the respective parts constituting the substrate processing apparatus are controlled by the controller 121.

In the embodiment, a cycle including a process in which a process of supplying a source gas containing a predetermined element and a halogen element to the wafer 200 in the process chamber 201 and a process of supplying a first reactive gas containing the three elements including carbon, nitrogen and hydrogen and having a composition wherein the number of carbon atoms is greater than that of nitrogen atoms in one molecule to the wafer 200 in the process chamber 201 are alternately performed a predetermined number of times (one or more) to form a first layer containing the predetermined element, nitrogen and carbon on the wafer 200; and a process of supplying a second reactive gas different from the source gas and the first reactive gas to the wafer 200 in the process chamber 201 and modifying the first layer to form a second layer, is performed a predetermined number of times (one or more) to form a thin film having a predetermined composition containing the predetermined element and a predetermined film thickness on the wafer 200.

In addition, in the embodiment, in order to form a composition ratio of a thin film to be formed as a stoichiometric composition or another predetermined composition ratio different from the stoichiometric composition, supply conditions of a plurality of kinds of gases containing a plurality of elements constituting the thin film to be formed are controlled. For example, the supply conditions are controlled such that at least one element of the plurality of elements constituting the thin film to be formed stoichiometrically exceeds another element. Hereinafter, an example of forming a film while controlling a ratio of the plurality of elements constituting the thin film to be formed, i.e., a composition ratio of the thin film, will be described.

Figure 4:
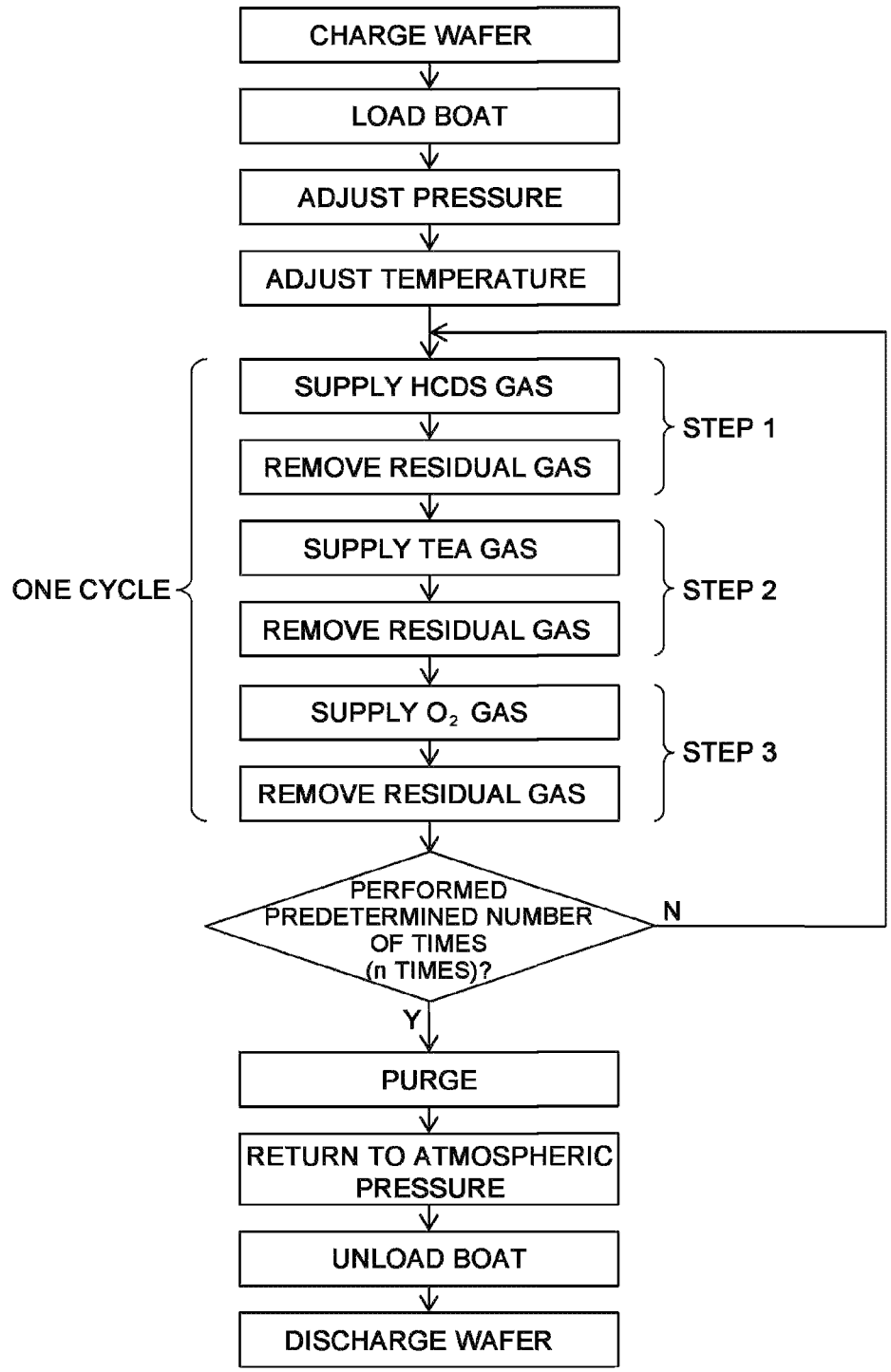
FIG. 4 is a view showing a film-forming flow of a first embodiment of the present invention.

Hereinafter, the film-forming sequence of the embodiment will be described in detail with reference to FIGS. 4 and 5. FIG. 4 is a view showing a film-forming flow of the embodiment. FIG. 5 is a view showing a gas supply timing in the film-forming sequence of the embodiment.

In addition, here, an example in which a cycle including a process in which a process of supplying an HCDS gas, which is a chlorosilane-based source gas, to the wafer 200 in the process chamber 201 as a source gas and a process of supplying TEA gas, which is an amine-based gas containing a plurality of (three) ligands (ethyl groups) containing a carbon atom in one molecule, to the wafer 200 in the process chamber 201 as a first reactive gas containing the three elements including carbon, nitrogen and hydrogen and having a composition wherein the number of carbon atoms is greater than that of nitrogen atoms in one molecule are alternately performed once to form a first layer containing silicon, nitrogen and carbon on the wafer 200; and a process of supplying $O_2$ gas, which is an oxygen-containing gas (an oxidizing gas), as a second reactive gas different from the source gas and the first reactive gas to the wafer 200 in the process chamber 201 and modifying the first layer to form a silicon oxycarbonitride layer (a SiOCN layer) or a silicon oxycarbide layer (a SiOC layer) as a second layer, is performed a predetermined number of times (n times) to form a silicon oxycarbonitride film (a SiOCN film) or a silicon oxycarbide film (a SiOC film), which is a silicon-based insulating film having a predetermined composition and a predetermined film thickness, on the wafer 200 will be described.

In addition, when the term "wafer" is used herein, it may refer to "the wafer itself" or "the wafer and a stacked body (a collected body) of predetermined layers or films formed on the surface" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer, which is a stacked body."

Accordingly, when "a predetermined gas is supplied to a wafer" is written herein, it may mean that "a predetermined gas is directly supplied to a surface (exposed surface) of a wafer itself" or that "a predetermined gas is supplied to a layer or a film formed on a wafer, i.e., on the uppermost surface of a wafer as a stacked body." In addition, when "a predetermined layer (of film) is formed on a wafer" is written herein, it may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a stacked body."

In addition, the term "substrate" as used herein may be synonymous with the term "wafer," and in this case, the terms "wafer" and "substrate" may be used interchangeably.

Wafer Charging and Boat Loading

When the plurality of wafers 200 are charged on the boat 217 (wafer charging), as shown in FIG. 1, the boat 217 supporting the plurality of wafers 200 is raised by the boat elevator 115 to be loaded into the process chamber 201 (boat loading). In this state, the seal cap 219 hermetically seals the lower end of the reaction tube 203 via the O-ring 220.

Pressure Adjustment and Temperature Adjustment

The inside of the process chamber 201 is vacuum-exhausted by the vacuum pump 246 to a desired pressure (a vacuum level). Here, the pressure in the process chamber 201 is measured by the pressure sensor 245, and the APC valve 244 is feedback-controlled based on the measured pressure information (pressure adjustment). In addition, the vacuum pump 246 maintains a regular operation state at least until processing of the wafers 200 is terminated. Further, the process chamber 201 is heated by the heater 207 to a desired temperature. Here, an electrical connection state to the heater 207 is feedback-controlled based on the temperature information detected by the temperature sensor 263 until the inside of the process chamber 201 reaches a desired temperature distribution (temperature adjustment). In addition, heating of the inside of the process chamber 201 by the heater 207 is continuously performed at least until processing of the wafers 200 is terminated. Next, rotation of the boat 217 and the wafers 200 is started by the rotary mechanism 267. In addition, rotation of the boat 217 and the wafers 200 by the rotary mechanism 267 is continuously performed at least until processing of the wafers 200 is terminated.

Process of Forming Silicon Oxycarbonitride Film or Silicon Oxycarbide Film

Next, the following three steps, i.e., steps 1 to 3, are sequentially performed.

[Step 1]

HCDS Gas Supply

The valve 243a of the first gas supply pipe 232a is opened to flow HCDS gas in the first gas supply pipe 232a. A flow rate of the HCDS gas flowing in the first gas supply pipe 232a is controlled by the mass flow controller 241a. The flow rate-controlled HCDS gas is supplied into the process chamber 201 through the gas supply hole 250a of the first nozzle 249a to be exhausted through the exhaust pipe 231. Here, the HCDS gas is supplied to the wafer 200. At the same time, the valve 243e is opened to flow $N_2$ gas, which is an inert gas, into the first inert gas supply pipe 232e. A flow rate of the $N_2$ gas flowing in the first inert gas supply pipe 232e is controlled by the mass flow controller 241e. The flow rate-controlled $N_2$ gas is supplied into the process chamber 201 with the HCDS gas to be exhausted through the exhaust pipe 231.

In addition, here, in order to prevent infiltration of the HCDS gas into the second nozzle 249b and the third nozzle 249c, the valves 243f and 243g are opened to flow the $N_2$ gas into the second inert gas supply pipe 232f and the third inert gas supply pipe 232g. The $N_2$ gas is supplied into the process chamber 201 via the second gas supply pipe 232b, the third gas supply pipe 232c, the second nozzle 249b and the third nozzle 249c to be exhausted through the exhaust pipe 231.

Here, the APC valve 244 is appropriately adjusted to vary the pressure in the process chamber 201 to a pressure within a range of, for example, 1 to 13,300 Pa, preferably, 20 to 1,330 Pa. A supply flow rate of the HCDS gas controlled by the mass flow controller 241a is set to a flow rate within a range of, for example, 1 to 1,000 sccm. Supply flow rates of the $N_2$ gas controlled by the mass flow controllers 241e, 241f and 241g are set to flow rates within a range of, for example, 100 to 10,000 sccm. A time of supplying the HCDS gas to the wafer 200, i.e., a gas supply time (an irradiation time), is a time within a range of, for example, 1 to 120 seconds, preferably, 1 to 60 seconds. Here, a temperature of the heater 207 is set such that a temperature of the wafer 200 is a temperature within a range of, for example, 250 to 700° C., preferably 300 to 650° C., and more preferably, 350 to 600° C. In addition, when the temperature of the wafer 200 is less than 250° C., the HCDS cannot be easily chemisorbed onto the wafer 200 such that a practical film-forming rate cannot be obtained. This problem can be solved by increasing the temperature of the wafer 200 to 250° C. or more. In addition, the HCDS can be more sufficiently adsorbed onto the wafer 200 by increasing the temperature of the wafer 200 to 300° C. or more, or 350° C. or more, and a more sufficient film-forming rate can be obtained. Further, when the temperature of the wafer 200 exceeds 700° C., film thickness uniformity may be easily deteriorated to make it difficult to control the film thickness uniformity as a CVD reaction is strengthened (a gaseous reaction becomes dominant). Deterioration of the film thickness uniformity can be suppressed and control thereof can be performed by controlling the temperature of the wafer 200 to 700° C. or less. In particular, a surface reaction becomes dominant by controlling the temperature of the wafer 200 to 650° C. or less, or 600° C. or less, the film thickness uniformity can be easily secured, and control thereof becomes easy. Accordingly, the temperature of the wafer 200 may be a temperature within a range of 250 to 700° C., preferably 300 to 650° C., more preferably 350 to 600° C.

The HCDS gas is supplied to the wafer 200 under the above-mentioned conditions, and for example, a silicon-containing layer containing chlorine (Cl) having a thickness of about less than one atomic layer to several atomic layers is formed on the wafer 200 (a lower base film of a surface) as an initial layer containing a predetermined element (silicon) and a halogen element (chlorine). The silicon-containing layer containing Cl may be an adsorption layer of the HCDS gas, a silicon layer (a Si layer) containing Cl, or both of these.

Here, the silicon layer containing Cl is a generic name including a discontinuous layer in addition to a continuous layer formed of silicon (Si) and containing Cl, or a silicon thin film containing Cl formed by overlapping them. In addition, a continuous layer formed of Si and containing Cl may be referred to as the silicon thin film containing Cl. Further, Si constituting the silicon layer containing Cl contains Si, in which bonding to Cl is completely broken, in addition to Si, in which bonding to Cl is not completely broken.

In addition, the adsorption layer of the HCDS gas includes a chemisorption layer in which a gas molecules of the HCDS gas are discontinuous, in addition to the chemisorption layer in which the gas molecules of the HCDS gas are continuous. That is, the adsorption layer of the HCDS gas includes a chemisorption layer having a thickness of one molecular layer containing HCDS molecules or less than one molecular layer. Further, HCDS ($Si_2Cl_6$) molecules constituting the adsorption layer of the HCDS gas contains molecules in which bonding of Si and Cl is partially broken (a $Si_xCl_y$ molecule). That is, the adsorption layer of the HCDS includes a chemisorption layer in which $Si_2Cl_6$ molecules and/or $Si_xCl_y$ molecules are continuous, or a chemisorption layer in which $Si_2Cl_6$ molecules and/or $Si_xCl_y$ molecules are discontinuous.

In addition, a layer having a thickness of less than one atomic layer refers to a discontinuously formed atomic layer, and a layer having a thickness of one atomic layer refers to a continuously formed atomic layer. Further, a layer having a thickness of less than one molecular layer refers to a discontinuously formed molecular layer, and a layer having a thickness of one molecular layer refers to a continuously formed molecular layer.

Under conditions in which the HCDS gas is autolyzed (pyrolyzed), i.e., under conditions in which a pyrolysis reaction of the HCDS occurs, the silicon layer containing Cl is formed by depositing Si on the wafer 200. Under conditions in which the HCDS gas is not autolyzed (pyrolyzed), i.e., under conditions in which a pyrolysis reaction of the HCDS does not occur, the adsorption layer of the HCDS gas is formed by adsorbing the HCDS gas onto the wafer 200. In addition, formation of the adsorption layer of the HCDS gas on the wafer 200 can increase the film-forming rate more than formation of the silicon layer containing Cl on the wafer 200.

When the thickness of the silicon-containing layer containing Cl formed on the wafer 200 exceeds several atomic layers, an effect of modification in step 2 and step 3 (described later) is not transferred to the entire silicon-containing layer containing Cl. In addition, a minimum value of the thickness of the silicon-containing layer containing Cl that can be formed on the wafer 200 is less than one atomic layer. Accordingly, the thickness of the silicon-containing layer containing Cl may be less than one atomic layer to several atomic layers. In addition, as the thickness of the silicon-containing layer containing Cl is one atomic layer or less, i.e., one atomic layer or less than one atomic layer, an effect of the modification reaction in step 2 and step 3 (to be described later) can be relatively increased, and a time required for the modification reaction in step 2 and step 3 can be reduced. A time for forming the silicon-containing layer containing Cl in step 1 can be reduced. Eventually, a processing time per one cycle can be reduced, and a total processing time can also be reduced. That is, the film-forming rate can also be increased. In addition, as the thickness of the silicon-containing layer containing Cl is one atomic layer or less, controllability of the film thickness uniformity can also be increased.

Removal of Residual Gas

After the silicon-containing layer containing Cl is formed as an initial layer, the valve 243a of the first gas supply pipe 232a is closed to stop supply of the HCDS gas. Here, the APC valve 244 of the exhaust pipe 231 is in an open state, and the inside of the process chamber 201 is vacuum-exhausted by the vacuum pump 246 to remove the HCDS gas remaining in the process chamber 201 after non-reaction or contribution to formation of the initial layer from the process chamber 201. In addition, here, supply of the $N_2$ gas, which is an inert gas, into the process chamber 201 is maintained in a state in which the valves 243e, 243f and 243g are open. The $N_2$ gas acts as a purge gas, and thus, the HCDS gas remaining in the process chamber 201 after non-reaction or contribution to formation of the initial layer can be removed from the inside of the process chamber 201.

In addition, here, the gas remaining in the process chamber 201 may not be completely removed, and the inside of the process chamber 201 may not be completely purged. When the gas remaining in the process chamber 201 is very small in amount, there is no bad effect generated in step 2 performed thereafter. Here, a flow rate of the $N_2$ gas supplied into the process chamber 201 need not be a large flow rate, and for example, an amount of $N_2$ gas similar to a capacity of the reaction tube 203 (the process chamber 201) can be supplied to perform the purge such that there is no bad effect generated in step 2. As described above, as the inside of the process chamber 201 is not completely purged, the purge time can be reduced to improve throughput. In addition, consumption of $N_2$ gas can be suppressed to a minimal necessity.

An inorganic source gas such as a tetrachlorosilane e.g., silicon tetrachloride ($SiCl_4$, abbreviation: STC) gas, trichlorosilane ($SiHCl_3$, abbreviation: TCS) gas, dichlorosilane ($SiH_2Cl_2$, abbreviation: DCS) gas, monochlorosilane ($SiH_3Cl$, abbreviation: MCS) gas, or the like, in addition to hexachlorodisilane ($Si_2Cl_6$, abbreviation: HCDS) gas, may be used as the chlorosilane-based source gas. A rare gas such as Ar gas, He gas, Ne gas, Xe gas, or the like, in addition to $N_2$ gas, may be used as the inert gas.

[Step 2]

TEA Gas Supply

After step 1 is terminated and the residual gas in the process chamber 201 is removed, the valve 243b of the second gas supply pipe 232b is opened to flow TEA gas into the second gas supply pipe 232b. A flow rate of TEA gas flowing in the second gas supply pipe 232b is adjusted by the mass flow controller 241b. The flow rate-adjusted TEA gas is supplied into the process chamber 201 through the gas supply hole 250b of the second nozzle 249b. The TEA gas supplied into the process chamber 201 is thermally activated (excited) and exhausted through the exhaust pipe 231. Here, the thermally activated TEA gas is supplied to the wafer 200. At the same time, the valve 243f is opened to flow the $N_2$ gas, which is an inert gas, into the second inert gas supply pipe 232f. A flow rate of the $N_2$ gas flowing in the second inert gas supply pipe 232f is adjusted by the mass flow controller 241f. The flow rate-adjusted $N_2$ gas is supplied into the process chamber 201 with the TEA gas to be exhausted through the exhaust pipe 231.

In addition, here, in order to prevent infiltration of the TEA gas into the first nozzle 249a and the third nozzle 249c, the valves 243e and 243g are opened to flow the $N_2$ gas into the first inert gas supply pipe 232e and the third inert gas supply pipe 232g. The $N_2$ gas is supplied into the process chamber 201 via the first gas supply pipe 232a, the third gas supply pipe 232c, the first nozzle 249a and the third nozzle 249c to be exhausted through the exhaust pipe 231.

Here, the APC valve 244 is appropriately adjusted such that the pressure in the process chamber 201 becomes a pressure within a range of, for example, 1 to 13,300 Pa, preferably 399 to 3,990 Pa. As the pressure in the process chamber 201 is set to be a relatively high pressure range, the TEA gas can be thermally activated with non-plasma. In addition, since the TEA gas can be thermally activated and supplied to generate a soft reaction, the modification (to be described later) can be softly performed. A supply flow rate of the TEA gas controlled by the mass flow controller 241b is set to a flow rate within a range of, for example, 100 to 2,000 sccm. Supply flow rates of the $N_2$ gas controlled by the mass flow controllers 241f, 241e and 241g are set to flow rates within a range of, for example, 100 to 10,000 sccm. Here, a partial pressure of the TEA gas in the process chamber 201 is set to a pressure within a range of 0.01 to 12,667 Pa. A time for supplying the thermally activated TEA gas to the wafer 200, i.e., the gas supply time (the irradiation time), is set to a time within a range of, for example, 1 to 120 seconds, preferably, 1 to 60 seconds. Here, similar to step 1, the temperature of the heater 207 is set such that the temperature of the wafer 200 is a temperature within a range of, for example, 250 to 700° C., preferably 300 to 650° C., and more preferably 350 to 600° C.

As the TEA gas is supplied to the wafer 200 under the above-mentioned conditions, the silicon-containing layer containing Cl, which is the initial layer, formed on the wafer 200 in step 1 can be reacted with the TEA gas. That is, a halogen element (Cl) contained in the silicon-containing layer containing Cl as the initial layer can be reacted with a ligand (an ethyl group) contained in the TEA gas. Accordingly, at least some of Cl atoms, i.e., atoms of halogen element contained in the initial layer can be drawn (separated) from the initial layer, and at least some of a plurality of ethyl groups contained in the TEA gas can be separated from the TEA gas. In addition, N of the TEA gas from which at least some of the ethyl groups are separated can be bonded to Si contained in the initial layer. That is, N constituting the TEA gas and having a dangling bond due to removal of at least some of the ethyl groups can be bonded to Si contained in the initial layer and having a dangling bond or Si in which a dangling bond had been provided to form Si—N bonding. In addition, here, C contained in the ethyl group, which is a ligand of TEA gas, or C that had been contained in the ethyl group can also be bonded to Si contained in the initial layer to form Si—C bonding. As a result, Cl is separated from the initial layer and an N element is newly introduced into the initial layer. In addition, here, a C element is also newly introduced into the initial layer.

As the TEA gas is supplied under the above-mentioned conditions, the silicon-containing layer containing Cl, which is the initial layer, can be appropriately reacted with the TEA gas, and the above-mentioned series of reactions can be generated.

Cl is separated from the initial layer by the series of reactions, an N element and a C element are newly introduced into the initial layer, and the silicon-containing layer containing Cl, which is the initial layer, is changed (modified) into a first layer containing silicon (Si), nitrogen (N) and carbon (C), i.e., a silicon carbonitride layer (a SiCN layer). The first layer becomes a layer having a thickness of less than one atomic layer to several atomic layers and containing Si, N and C. In addition, the first layer is a layer in which a ratio of a Si element or a ratio of C element is relatively high, i.e., a Si-rich or C-rich layer.

In addition, when a layer containing Si, N and C is formed as the first layer, chlorine (Cl) that had been contained in the silicon-containing layer containing Cl or hydrogen (H) that had been contained in the TEA gas constitute a gaseous material, for example, chlorine ($Cl_2$) gas, hydrogen ($H_2$) gas or hydrogen chloride (HCl) gas during a process of modification reaction of the silicon-containing layer containing Cl by the TEA gas to be discharged from the process chamber 201 via the exhaust pipe 231. That is, impurities such as Cl in the initial layer are drawn or eliminated from the initial layer to be separated from the initial layer. Accordingly, the first layer becomes a layer having fewer impurities such as Cl than the initial layer.

Removal of Residual Gas

After the first layer is formed, the valve 243b of the second gas supply pipe 232b is closed to stop supply of the TEA gas. Here, the inside of the process chamber 201 is vacuum-exhausted by the vacuum pump 246 in a state in which the APC valve 244 of the exhaust pipe 231 is open, and the TEA gas or reaction byproduct remaining in the process chamber 201 after non-reaction or contribution to formation of the first layer is removed from the inside of the process chamber 201. In addition, here, supply of the $N_2$ gas, which is an inert gas, into the process chamber 201 is maintained in a state in which the valves 243f, 243e and 243g are open. The $N_2$ gas acts as a purge gas, and thus the TEA gas or reaction byproduct remaining in the process chamber 201 after non-reaction or contribution to formation of the first layer can be effectively removed from the process chamber 201.

In addition, here, the gas remaining in the process chamber 201 may not be completely removed, or the inside of the process chamber 201 may not be completely purged. When the amount of gas remaining in the process chamber 201 is very small, there is no bad affect generated in step 3 performed thereafter. Here, the flow rate of the $N_2$ gas supplied into the process chamber 201 need not be set to a large flow rate, and for example, the amount of the $N_2$ gas similar to a capacity of the reaction tube 203 (the process chamber 201) can be supplied to perform the purge such that there is no bad affect generated in step 3. As described above, as the inside of the process chamber 201 is not completely purged, the purge time can be reduced to improve throughput. In addition, consumption of the $N_2$ gas can be suppressed to a minimal necessity.

As the amine-based gas, in addition to triethylamine [$(C_2H_5)_3N$, abbreviation: TEA], an ethylamine-based gas obtained by vaporizing diethylamine [$(C_2H_5)_2NH$, abbreviation: DEA] or monoethylamine ($C_2H_5NH_2$, abbreviation: MEA), a methylamine-based gas obtained by vaporizing trimethylamine [$(CH_3)_3N$, abbreviation: TMA], dimethyl amine [$(CH_3)_2NH$, abbreviation: DMA] or monomethylamine ($CH_3NH_2$, abbreviation: MMA), a propylamine-based gas obtained by vaporizing tripropylamine [$(C_3H_7)_3N$, abbreviation: TPA], dipropylamine [$(C_3H_7)_2NH$, abbreviation: DPA] or monopropylamine ($C_3H_7NH_2$, abbreviation: MPA), an isopropylamine-based gas obtained by vaporizing, triisopropylamine ([$(CH_3)_2CH]_3N$, abbreviation: TIPA), diisopropylamine ([$(CH_3)_2CH]_2NH$, abbreviation: DIPA) or monoisopropylamine [$(CH_3)_2CHNH_2$, abbreviation: MIPA], a butylamine-based gas obtained by vaporizing tributylamine [$(C_4H_9)_3N$, abbreviation: TBA], dibutyl amine [$(C_4H_9)_2NH$, abbreviation: DBA] or monobutylamine ($C_4H_9NH_2$, abbreviation: MBA), or an isobutylamine-based gas obtained by vaporizing triisobutylamine ([$(CH_3)_2CHCH_2]_3N$, abbreviation: TIBA), diisobutylamine ([$(CH_3)_2CHCH_2]_2NH$, abbreviation: DIBA) or monoisobutylamine [$(CH_3)_2CHCH_2NH_2$, abbreviation: MIBA] may be used. That is, for example, at least one gas of $(C_2H_5)_xN_{3-x}$, $(CH_3)_xNH_{3-x}$, $(C_3H_7)_xNH_{3-x}$, [$(CH_3)_2CH]_xNH_{3-x}$, $(C_4H_9)_xNH_{3-x}$, and [$(CH_3)_2CHCH_2]_xNH_{3-x}$ (in equations, x is an integer of 1 to 3) may be used as the amine-based gas.

In addition, a gas containing the three elements including carbon, nitrogen and hydrogen and having a composition wherein the number of carbon atoms is greater than that of nitrogen atoms in one molecule may be used as the amine-based gas. That is, a gas containing at least one amine selected from the group consisting of TEA, DEA, MEA, TMA, DMA, TPA, DPA, MPA, TIPA, DIPA, MIPA, TBA, DBA, MBA, TIBA, DIBA and MIBA may be used as the amine-based gas.

When a chlorosilane-based source gas containing a predetermined element (silicon) and a halogen element (chlorine) such as HCDS gas is used as a source gas, as the amine-based gas containing the three elements including carbon, nitrogen and hydrogen and having a composition wherein the number of carbon atoms is greater than that of nitrogen atom in one molecule such as TEA gas or DEA gas is used as the first reactive gas, a carbon concentration in the first layer formed in step 2, i.e., a carbon concentration in a SiOCN film or a SiOC film formed by processes performed a predetermined number of times (to be described later) can be increased.

On the other hand, when the chlorosilane-based source gas containing a predetermined element (silicon) and a halogen element (chlorine) such as HCDS gas is used as a source gas, the case in which a gas containing the three elements including carbon, nitrogen and hydrogen and having a composition wherein the number of carbon atoms is not greater than that of nitrogen atoms in one molecule such as an amine-based gas, for example, MMA gas, or an organic hydrazine-based gas, for example, MMH gas or DMH gas (to be described later) is used as the first reactive gas, the carbon concentration of the first layer, i.e., the carbon concentration in the SiOCN film or the SiOC film cannot be increased to a level similar to the case in which the amine-based gas containing the three elements including carbon, nitrogen and hydrogen and having a composition wherein the number of carbon atoms is greater than that of nitrogen atoms in one molecule is used as the first reactive gas, and thus, an appropriate carbon concentration cannot be easily realized.

In addition, a gas containing a plurality of ligands containing a carbon (C) atom in one molecule, i.e., a gas containing a plurality of hydrocarbon groups such as alkyl groups in one molecule may be used as the amine-based gas. Specifically, a gas having three or two ligands (a hydrocarbon group such as an alkyl group) containing a carbon (C) atom in one molecule may be used as the amine-based gas, and for example, a gas containing at least one amine selected from the group consisting of TEA, DEA, TMA, DMA, TPA, DPA, TWA, DIPA, TBA, DBA, TIBA and MBA may be used.

When the chlorosilane-based source gas containing a predetermined element (silicon) and a halogen element (chlorine) such as HCDS gas is used as a source gas, as the amine-based gas containing the three elements including carbon, nitrogen and hydrogen and containing a plurality of ligands containing a carbon atom in one molecule such as TEA gas or DEA gas, i.e., the amine-based gas containing a plurality of hydrocarbon groups such as alkyl groups in one molecule is used as the first reactive gas, the carbon concentration in the first layer, i.e., the carbon concentration in the SiOCN film or the SiOC film can be further improved.

On the other hand, when the chlorosilane-based source gas containing silicon and a halogen element (chlorine) such as HCDS gas is used as a source gas, as the case in which a gas that does not include a plurality of ligands containing a carbon atom in one molecule such as an amine-based gas, for example, MMA gas, or an organic hydrazine-based gas to be described later, for example, MMH gas, is used as the first reactive gas, the carbon concentration in the first layer, i.e., the carbon concentration in the SiOCN film or the SiOC film, cannot be increased to a level similar to the case in which the amine-based gas containing a plurality of ligands containing a carbon atom in one molecule is used as the first reactive gas, and an appropriate carbon concentration cannot be easily realized.

As the amine-based gas containing two ligands (hydrocarbon groups such as alkyl groups) containing a carbon atom in one molecule such as DEA gas is used as the first reactive gas, in comparison with the case in which the amine-based gas containing three ligands (hydrocarbon groups such as alkyl groups) containing a carbon atom in one molecule such as TEA gas is used, a cycle rate (a thickness of the SiOCN layer or the SiOC layer formed at each unit cycle) can be improved, and a ratio of a nitrogen concentration with respect to a carbon concentration in the first layer (a ratio of the nitrogen concentration/the carbon concentration), i.e., a ratio of the nitrogen concentration with respect to the carbon concentration (a ratio of the nitrogen concentration/the carbon concentration) in the SiOCN film or the SiOC film can be increased.

On the other hand, as the amine-based gas containing three ligands (hydrocarbon groups such as alkyl groups) containing a carbon atom in one molecule such as TEA gas is used as the first reactive gas, in comparison with the case in which the amine-based gas containing two ligands (hydrocarbon groups such as alkyl groups) containing a carbon atom in one molecule such as DEA gas is used, a ratio of the carbon concentration with respect to the nitrogen concentration (a ratio of the carbon concentration/the nitrogen concentration) in the first layer, i.e., a ratio of the carbon concentration with respect to the nitrogen concentration (a ratio of the carbon concentration/the nitrogen concentration) in the SiOCN film or the SiOC film, can be increased.

That is, the cycle rate or the nitrogen concentration or carbon concentration in the formed SiOCN film or SiOC film can be finely adjusted by the number of ligands (the number of hydrocarbon groups such as alkyl groups) containing a carbon atom contained in the first reactive gas, i.e., by varying a gas species of the first reactive gas.

In addition, while the fact that the carbon concentration in the SiOCN film or the SiOC film can be increased by appropriately selecting the gas species (composition) of the amine-based gas, which is the first reactive gas, is similar to the above description, in order to further increase the carbon concentration, for example, the pressure in the process chamber 201 when the amine-based gas (TEA gas) is supplied to the wafer 200 may be higher than the pressure in the process chamber 201 when the chlorosilane-based source gas (HCDS gas) is supplied to the wafer 200 in step 1, and further, higher than the pressure in the process chamber 201 when an oxygen-containing gas ($O_2$ gas) is supplied to the wafer 200 in step 3 (to be described later). Further, in this case, the pressure in the process chamber 201 when the $O_2$ gas is supplied to the wafer 200 in step 3 may be higher than the pressure in the process chamber 201 when the HCDS gas is supplied to the wafer 200 in step 1. That is, provided that the pressure in the process chamber 201 when the HCDS gas is supplied to the wafer 200 is $P_1$ [Pa], the pressure in the process chamber 201 when the TEA gas is supplied to the wafer 200 is $P_2$ [Pa], and the pressure in the process chamber 201 when the $O_2$ gas is supplied to the wafer 200 is $P_3$ [Pa], the pressures $P_1$ to $P_3$ may be set to satisfy, preferably, a relation of $P_2 > P_1$, $P_3$, and more preferably, a relation of $P_2 > P_3 > P_1$. That is, the pressure in the process chamber 201 when the TEA gas is supplied to the wafer 200 may be highest in steps 1 to 3.

On the other hand, in order to appropriately suppress an increment of the carbon concentration of the SiOCN film or the SiOC film, the pressure in the process chamber 201 when the amine-based gas (TEA gas) is supplied to the wafer 200 may be set to a pressure equal to or less than the pressure in the process chamber 201 when the oxygen-containing gas ($O_2$ gas) is supplied to the wafer 200 in step 3 (to be described later), or may be set to a pressure equal to or less than the pressure in the process chamber 201 when the chlorosilane-based source gas (HCDS gas) is supplied to the wafer 200 in step 1. That is, the above-mentioned pressures $P_1$ to $P_3$ may be set to satisfy a relation of $P_3 \geq P_2$, and also, may be set to satisfy a relation of $P_3$, $P_1 \geq P_2$.

That is, the carbon concentration in the SiOCN film or the SiOC film formed by appropriately controlling the pressure in the process chamber 201 when the amine-based gas is supplied can be finely adjusted.

A rare gas such as Ar gas, He gas, Ne gas, or Xe gas, in addition to the N₂ gas, may be used as an inert gas.

[Step 3]

O₂ Gas Supply

After step 2 is terminated and the residual gas in the process chamber 201 is removed, the valve 243c of the third gas supply pipe 232c is opened to flow the O₂ gas into the third gas supply pipe 232c. A flow rate of the O₂ gas flowing in the third gas supply pipe 232c is adjusted by the mass flow controller 241c. The flow rate-adjusted O₂ gas is supplied into the process chamber 201 through the gas supply hole 250c of the third nozzle 249c. The O₂ gas supplied into the process chamber 201 is thermally activated (excited) to be exhausted through the exhaust pipe 231. Here, the thermally activated O₂ gas is supplied to the wafer 200. Here, at the same time, the valve 243g is opened to flow the N₂ gas into the third inert gas supply pipe 232g. The N₂ gas is supplied into the process chamber 201 with the O₂ gas to be exhausted through the exhaust pipe 231. In addition, here, in order to prevent infiltration of the O₂ gas into the first nozzle 249a and the second nozzle 249b, the valves 243e and 243f are opened to flow the N₂ gas into the first inert gas supply pipe 232e and the second inert gas supply pipe 232f. The N₂ gas is supplied into the process chamber 201 via the first gas supply pipe 232a, the second gas supply pipe 232b, the first nozzle 249a and the second nozzle 249b to be exhausted through the exhaust pipe 231.

Here, the APC valve 244 is appropriately adjusted to set the pressure in the process chamber 201 to a pressure within a range of, for example, 1 to 3,000 Pa. As the pressure in the process chamber 201 is set to a relative high pressure range, the O₂ gas can be thermally activated with non-plasma. In addition, as the O₂ gas is thermally activated and supplied, a soft reaction can be generated and oxidation (to be described later) can be softly performed. A supply flow rate of the O₂ gas controlled by the mass flow controller 241c is set to a flow rate in a range of, for example, 100 to 10,000 sccm. Supply flow rates of the N₂ gas controlled by the mass flow controllers 241g, 241e and 241f are set to flow rates within a range of, for example, 100 to 10,000 sccm. Here, a partial pressure of the O₂ gas in the process chamber 201 is set to a pressure within a range of 0.01 to 2,970 Pa. A time of supplying the thermally activated O₂ gas to the wafer 200, i.e., a gas supply time (an irradiation time), is set to a time within a range of, for example, 1 to 120 seconds, preferably, 1 to 60 seconds. Here, similar to steps 1 and 2, a temperature of the heater 207 is set such that a temperature of the wafer 200 is set to a temperature within a range of, for example, 250 to 700° C., preferably 300 to 650° C., and more preferably 350 to 600° C.

The gas flowing into the process chamber 201 is the O₂ gas thermally activated by increasing the pressure in the process chamber 201, and neither the HCDS gas nor the TEA gas flows into the process chamber 201. Accordingly, the O₂ gas does not generate a gaseous reaction, and the activated O₂ gas reacts with at least a portion of the first layer containing Si, N and C formed on the wafer 200 in step 2. Accordingly, the first layer is oxidized to be modified as a layer containing silicon, oxygen, carbon and nitrogen, i.e., a silicon oxycarbonitride layer (a SiOCN layer), or a layer containing silicon, oxygen and carbon, i.e., a silicon oxycarbide layer (a SiOC layer), which is a second layer.

In addition, as the O₂ gas is thermally activated to flow into the process chamber 201, the first layer can be thermally oxidized to be modified (changed) into a SiOCN layer or a SiOC layer. Here, an O element is added to the first layer, and the first layer is modified into the SiOCN layer or the SiOC layer. In addition, here, while Si—O bonding in the first layer is increased by an action of the thermal oxidation due to the O₂ gas, Si—N bonding, Si—C bonding and Si—Si bonding are reduced to reduce a ratio of the N element, a ratio of the C element, and a ratio of the Si element in the first layer. Here, as the thermal oxidation time is extended or an oxidation power of the thermal oxidation is increased, most of the N element can be eliminated to reduce the N element to an impurity level, or the N element can become substantially extinct. That is, the first layer can be modified into the SiOCN layer or the SiOC layer while varying the composition ratio in a direction of increasing the oxygen concentration or a direction of reducing the nitrogen concentration, the carbon concentration and the silicon concentration. Here, since a ratio of the O element in the SiOCN layer or the SiOC layer, i.e., the oxygen concentration, can be finely adjusted by controlling the processing conditions such as the pressure in the process chamber 201 or the gas supply time, the composition ratio of the SiOCN layer or the SiOC layer can be more accurately controlled.

In addition, it is determined that the C element in the first layer formed in steps 1 and 2 is richer than the N element. For example, in some experiments, the carbon concentration may be twice the nitrogen concentration or more. That is, before the N element in the first layer is completely eliminated by the action of the thermal oxidation due to the O₂ gas, i.e., as the oxidation is prevented while the N element remains, the C element and the N element remain in the first layer and the first layer is modified into the SiOCN layer. In addition, even when elimination of most of the N element in the first layer is terminated by the action of the thermal oxidation due to the O₂ gas, the C element remains in the first layer, and the first layer is modified into the SiOC layer by preventing the oxidation in this state. That is, the ratio of the C element, i.e., the carbon concentration, can be controlled by controlling the gas supply time (an oxidation processing time) or the oxidation power, and any one of the SiOCN layer and the SiOC layer can be formed while controlling the composition ratio. In addition, here, since a ratio of the O element, i.e., the oxygen concentration, in the SiOCN layer or the SiOC layer can be finely adjusted by controlling the processing conditions such as the pressure in the process chamber 201 or the gas supply time, the composition ratio of SiOCN layer or the SiOC layer can be more accurately controlled.

In addition, here, the oxidation reaction of the first layer may not be saturated. For example, when the first layer having a thickness of less than one atomic layer to several atomic layers is formed in steps 1 and 2, a portion of the first layer may be oxidized. In this case, the oxidation is performed under the conditions in which the oxidation reaction of the first layer is unsaturated such that the entire first layer having a thickness of less than one atomic layer to several atomic layers is not oxidized.

In addition, while the processing conditions in step 3 may be the above-mentioned processing conditions to make the oxidation reaction of the first layer unsaturated, if the processing conditions in step 3 are set to the following processing conditions, the oxidation reaction of the first layer is likely to be unsaturated.

Wafer temperature: 500 to 650° C.
Pressure in process chamber: 133 to 2,666 Pa
O₂ gas partial pressure: 33 to 2,515 Pa
O₂ gas supply flow rate: 1,000 to 5,000 sccm
N₂ gas supply flow rate: 300 to 3,000 sccm
O₂ gas supply time: 6 to 60 seconds Removal of Residual Gas After the second layer is formed, the valve 243c of the third gas supply pipe 232c is closed to stop supply of the $O_2$ gas. Here, the inside of the process chamber 201 is vacuum-exhausted by the vacuum pump 246 in a state in which the APC valve 244 of the exhaust pipe 231 is open, and the $O_2$ gas or reaction byproduct remaining in the process chamber 201 after non-reaction or contribution to formation of the second layer is removed from the process chamber 201. In addition, here, supply of the $N_2$ gas into the process chamber 201 is maintained in a state in which the valves 243g, 243e and 243f are open. The $N_2$ gas acts as a purge gas, and thus the $O_2$ gas or reaction byproduct remaining in the process chamber 201 after non-reaction or contribution to formation of the second layer can be effectively removed from the process chamber 201.

In addition, here, the gas remaining in the process chamber 201 may not be completely removed, and the inside of the process chamber 201 may not be completely purged. When the amount of gas remaining in the process chamber 201 is very small, there is no bad affect generated in step 1 performed thereafter. Here, the flow rate of the $N_2$ gas supplied into the process chamber 201 need not be set to be a large flow rate, and for example, as the amount of $N_2$ gas is supplied to a level similar to a capacity of the reaction tube 203 (the process chamber 201), the purge can be performed such that a bad effect is not generated in step 1. As described above, as the inside of the process chamber 201 is not completely purged, the purge time can be reduced to improve throughput. In addition, consumption of the $N_2$ gas can also be suppressed to minimal necessity.

Nitrous oxide ($N_2O$) gas, nitrogen monoxide (NO) gas, nitrogen dioxide ($NO_2$) gas, ozone ($O_3$) gas, hydrogen ($H_2$) gas+oxygen ($O_2$) gas, $H_2$ gas+$O_3$ gas, steam ($H_2O$) gas, carbon monoxide (CO) gas, carbon dioxide ($CO_2$) gas, and so on, may be used as the oxygen-containing gas, in addition to the $O_2$ gas. A rare gas such as Ar gas, He gas, Ne gas, Xe gas, and so on, may be used as the inert gas, in addition to the $N_2$ gas.

Performing Predetermined Number of Times

The above-mentioned steps 1 to 3 may be set as one cycle and the cycle may be performed once or more (a predetermined number of times) to form a film containing silicon, oxygen, carbon and nitrogen having a predetermined composition and a predetermined film thickness, i.e., a silicon oxycarbonitride film (a SiOCN film), or a film containing silicon, oxygen and carbon, i.e., a silicon oxycarbide film (a SiOC film), on the wafer 200. In addition, the above-mentioned cycle may be performed a plurality of times. That is, the thickness of the SiOCN layer or the SiOC layer formed at each unit cycle may be set to be smaller than a desired film thickness, and the cycle may be repeated a plurality of times to the desired film thickness.

In addition, when the cycle is performed a plurality of times, the phrase "a predetermined gas is supplied to the wafer 200" in each step after at least two cycles means "a predetermined gas is supplied to a layer formed on the wafer 200, i.e., the uppermost surface of the wafer 200, which is a stacked body," and the phrase "a predetermined layer is formed on the wafer 200" means "a predetermined layer is formed on a layer formed on the wafer 200, i.e., the uppermost surface of the wafer 200, which is a stacked body." This is similar to the above. In addition, the above-mentioned matters are similar in the respective variants and the other embodiments.

Purge and Return to Atmospheric Pressure

When film-forming processing of forming the SiOCN film or the SiOC film of a predetermined film thickness having a predetermined composition is performed, the valves 243e, 243f and 243g are opened to supply the $N_2$ gas, which is an inert gas, into the process chamber 201 through the first inert gas supply pipe 232e, the second inert gas supply pipe 232f and the third inert gas supply pipe 232g to be exhausted through the exhaust pipe 231. The $N_2$ gas acts as a purge gas, and thus the inside of the process chamber 201 is purged with the inert gas so that the gas or reaction byproduct remaining in the process chamber 201 is removed from the process chamber 201 (purge). After that, atmosphere in the process chamber 201 is substituted with the inert gas (substitution of the inert gas), and the pressure in the process chamber 201 is returned to a normal pressure (return to atmospheric pressure).

Boat Unloading and Wafer Discharging

After that, the seal cap 219 is lowered by the boat elevator 115 to open the lower end of the reaction tube 203, and the processed wafer 200 supported by the boat 217 is unloaded to the outside of the reaction tube 203 through the lower end of the reaction tube 203 (boat unloading). Then, the processed wafer 200 is discharged by the boat 217 (wafer discharging).

(3) Effects According to the Embodiment

According to the embodiment, one or a plurality of effects are provided as described below.

(a) According to the embodiment, steps 1 and 2 are alternately performed once to form the first layer containing Si, N and C, and then step 3 of supplying the $O_2$ gas, which is an oxygen-containing gas, as a second reactive gas to oxidize the first layer to be modified into the SiOCN layer or the SiOC layer, which is a second layer, is performed so that a composition ratio of oxygen, carbon and nitrogen in the formed SiOCN film or SiOC film can be adjusted. In addition, here, as the $O_2$ gas is thermally activated and supplied, Si—O bonding in the SiOCN film or the SiOC film can be increased by the action of the thermal oxidation, and Si—C bonding, Si—N bonding and Si—Si bonding can be reduced. That is, the composition ratio can be varied in a direction of increasing the oxygen concentration or in a direction of reducing the nitrogen concentration, the carbon concentration and the silicon concentration. In addition, here, the composition ratio can be varied by extending the thermal oxidation time or increasing the oxidation power of the thermal oxidation in a direction of increasing the oxygen concentration or in a direction of further reducing the nitrogen concentration, the carbon concentration and the silicon concentration. Further, here, since the processing conditions such as the pressure in the process chamber 201 or the gas supply time can be controlled to finely adjust a ratio of the O element in the SiOCN film or the SiOC film, i.e., the oxygen concentration, the composition ratio of the SiOCN film or the SiOC film can be more accurately controlled. Accordingly, permittivity of the formed SiOCN film or SiOC film can be adjusted, an etching resistance can be improved, or a leak resistance can be improved.

(b) According to the embodiment, the carbon concentration in the SiOCN film or the SiOC film can be increased using the amine-based gas containing the three elements including carbon, nitrogen and hydrogen and having a composition wherein the number of carbon atoms is greater than that of nitrogen atoms in one molecule as the first reactive gas.

In particular, the carbon concentration in the SiOCN film or the SiOC film can be increased using the amine-based gas containing a plurality of ligands containing a carbon (C) atom in one molecule, i.e., the amine-based gas containing a plurality of hydrocarbon groups such as alkyl groups in one molecule as the first reactive gas. Specifically, the carbon concentration in the SiOCN film or the SiOC film can be increased using TEA gas, TMA gas, TPA gas, TIPA gas, TBA gas or TIBA gas containing three ligands (hydrocarbon groups such as alkyl groups) containing a carbon (C) atom in one molecule, or DEA gas, DMA gas, DPA gas, DIPA gas, DBA gas or DMA gas containing two ligands (hydrocarbon groups such as alkyl groups) containing a carbon (C) atom in one molecule as the first reactive gas.

(c) According to the embodiment, a cycle rate (a thickness of the SiOCN layer or the SiOC layer formed at each unit cycle) or the nitrogen concentration or the carbon concentration in the SiOCN film or the SiOC film can be finely adjusted by the number of ligands (the number of hydrocarbon groups such as alkyl groups) containing a carbon atom contained in the first reactive gas, i.e., appropriately changing a gas species of the first reactive gas.

For example, the cycle rate can be improved and the ratio of the nitrogen concentration with respect to the carbon concentration in the SiOCN film or the SiOC film (the ratio of the nitrogen concentration/the carbon concentration) can be increased using the amine-based gas, which is the first reactive gas, containing two ligands (hydrocarbon groups such as alkyl groups) containing a carbon atom in one molecule such as DEA gas, in comparison with the case using the amine-based gas containing three ligands (hydrocarbon groups such as alkyl groups) containing a carbon (C) atom in one molecule such as TEA gas.

In addition, for example, the ratio of the carbon concentration with respect to the nitrogen concentration in the SiOCN film or the SiOC film (the ratio of the carbon concentration/the nitrogen concentration) can be increased using the amine-based gas, which is the first reactive gas, containing three ligands (hydrocarbon groups such as alkyl groups) containing a carbon atom in one molecule such as TEA gas, in comparison with the case using the amine-based gas containing two ligands (hydrocarbon groups such as alkyl groups) containing a carbon atom in one molecule such as DEA gas.

(d) According to the embodiment, the carbon concentration in the SiOCN film or the SiOC film can be finely adjusted by controlling the pressure in the process chamber 201 when the first reactive gas is supplied.

For example, as the pressure in the process chamber 201 when the TEA gas is supplied to the wafer 200 in step 2 is higher than the pressure in the process chamber 201 when the HCDS gas is supplied to the wafer 200 in step 1, the carbon concentration in the SiOCN film or the SiOC film can be further increased. In addition, as the pressure in the process chamber 201 when the TEA gas is supplied to the wafer 200 is higher than the pressure in the process chamber 201 when the $O_2$ gas is supplied to the wafer 200 in step 3, the carbon concentration in the SiOCN film or the SiOC film can be further increased.

In addition, for example, an increment of the carbon concentration in the SiOCN film or the SiOC film can be appropriately suppressed by setting the pressure in the process chamber 201 when the TEA gas is supplied to the wafer 200 in Step 2 to a pressure equal to or less than the pressure in the process chamber 201 when the $O_2$ gas is supplied to the wafer 200 in step 3, or to a pressure equal to or less than the pressure in the process chamber 201 when the HCDS gas is supplied to the wafer 200 in step 1.

(e) According to the embodiment, reaction controllability, in particular, composition controllability, upon formation of the SiOCN film or the SiOC film can be improved using the TEA gas as the first reactive gas, which is an amine-based gas, containing the three elements including carbon, nitrogen and hydrogen and containing no silicon and no metal. That is, in the film-forming sequence of the embodiment using the TEA gas as the first reactive gas, in comparison with the film-forming sequence using tetrakis ethyl methyl aminohafnium $(Hf[N(C_2H_5)(CH_3)]_4$, abbreviation: TEMAH) gas containing the four elements hafnium, carbon, nitrogen and hydrogen, which is the first reactive gas, reaction controllability, in particular, composition controllability, when the first layer is formed by reacting the first reactive gas with the silicon-containing layer containing Cl can be improved. Accordingly, composition control of the SiOCN film or the SiOC film can be easily performed.

(f) According to the embodiment, an impurity concentration in the formed SiOCN film or the SiOC film can be reduced using the TEA gas as the first reactive gas, which is an amine-based gas, containing the three elements including carbon, nitrogen and hydrogen and containing no silicon and no metal. That is, in the film-forming sequence of the embodiment using the TEA gas as the first reactive gas, in comparison with the film-forming sequence using TEMAH gas containing the four elements hafnium, carbon, nitrogen and hydrogen as the first reactive gas, mixing probability of an impurity element into the first layer formed by a reaction of the first reactive gas with the silicon-containing layer containing Cl can be reduced, and an impurity concentration in the formed SiOCN film or SiOC film can be reduced.

(g) According to the embodiment, film thickness uniformity in a surface of the wafer 200 and between surfaces of the wafers 200 of the SiOCN film or the SiOC film can be improved using the TEA gas as the first reactive gas, which is the amine-based gas containing the three elements including carbon, nitrogen and hydrogen and containing no silicon and no metal. That is, since the TEA gas containing the three elements including carbon, nitrogen and hydrogen has high reactivity with respect to the silicon-containing layer containing Cl in comparison with the TEMAH gas containing four elements, for example, hafnium, carbon, nitrogen and hydrogen, the film-forming sequence of the embodiment using the TEA gas as the first reactive gas can securely and uniformly perform a reaction of the first reactive gas with the silicon-containing layer containing Cl throughout a surface of the wafer 200 and between surfaces of the wafers 200. As a result, film thickness uniformity in a surface of the wafer 200 and between surfaces of the wafers 200 in the SiOCN film or the SiOC film can be improved.

Variants

While an example in which steps 1 to 3 are set as one cycle and the cycle is performed a predetermined number of times in the above-mentioned film-forming sequence of FIGS. 4 and 5 has been described, the film-forming sequence according to the present invention is not limited thereto but may be varied as described below.

For example, like variant 1 shown in FIG. 6A, steps 1 and 2 may be set as one set and after the set is performed a predetermined number of times (m times), step 3 may be performed, and the above may be set as one cycle and the cycle may be performed a predetermined number of times (n times). That is, a cycle including a process in which a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 are alternately performed a predetermined number of times (m times) to form a first layer containing silicon, nitrogen and carbon on the wafer 200; and a process of supplying an oxygen-containing gas (O₂ gas) to the wafer 200 in the process chamber 201 to modify the first layer to form a SiOCN layer or a SiOC layer as a second layer; may be performed a predetermined number of times (n times) to form a SiOCN film or a SiOC film having a predetermined composition and a predetermined film thickness on the wafer 200. In addition, the phrase "performed a predetermined number of times" means "performed one or a plurality of times, i.e., performed once or more." FIG. 6A shows an example in which a set of steps 1 and 2 is performed twice per cycle, i.e., an example in which a process of performing a set of steps 1 and 2 twice and a process of performing step 3 are set as one cycle and the cycle is performed a predetermined number of times (n times). The variant is distinguished from the above-mentioned film-forming sequence shown in FIGS. 4 and 5 in that the set of steps 1 and 2 is performed a predetermined number of times (m times) and then step 3 is performed, and the above is set as one cycle, while everything else is similar to the above-mentioned film-forming sequence. In addition, the case in which the number of times m the set of steps 1 and 2 is performed in the variant is set as one corresponds to the above-mentioned film-forming sequence shown in FIGS. 4 and 5.

In addition, for example, like variant 2 shown in FIG. 6B, steps 1, 2, 1 and 3 may be sequentially performed as one cycle and the cycle may be performed a predetermined number of times (n times). That is, a cycle including a process in which a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 are alternately performed once to form a first layer containing silicon, nitrogen and carbon on the wafer 200; and a process in which a process of supplying a chlorosilane-based source gas (HCDS gas) to the wafer 200 in the process chamber 201 and a process of supplying an oxygen-containing gas (O₂ gas) to the wafer 200 in the process chamber 201 are alternately performed once to form a silicon oxide layer (a SiO layer) on the first layer as a second layer; may be performed a predetermined number of times (n times) to form a SiOCN film having a predetermined composition and a predetermined film thickness formed by alternately depositing the first layer and the second layer on the wafer 200. In addition, the variant is distinguished from the above-mentioned film-forming sequence shown in FIGS. 4 and 5 in that steps 1, 2, 1 and 3 are set as one cycle, while everything else is similar to the above-mentioned film-forming sequence.

In addition, for example, like variant 3 shown in FIG. 6C, after steps 1 and 2 are set as one set and the set is performed a predetermined number of times (m times), steps 1 and 3 may be set as one set and the set may be performed a predetermined number of times (m' times), and the combination may be set as one cycle and the cycle may be performed a predetermined number of times (n times). That is, a cycle including a process in which a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 are alternately performed a predetermined number of times (m times) to form a first layer containing silicon, nitrogen and carbon on the wafer 200; and a process in which a process of supplying a chlorosilane-based source gas (HCDS gas) to the wafer 200 in the process chamber 201 and a process of supplying an oxygen-containing gas (O₂ gas) to the wafer 200 in the process chamber 201 are alternately performed a predetermined number of times (m' times) to form a SiO layer on the first layer as a second layer; may be performed a predetermined number of times (n times) to form a SiOCN film having a predetermined composition and a predetermined film thickness formed by alternately depositing the first layer and the second layer on the wafer 200. FIG. 6C shows an example in which a set of steps 1 and 2 and a set of steps 1 and 3 are performed twice per cycle, i.e., an example in which a process of performing a set of steps 1 and 2 twice and a process of performing a set of steps 1 and 3 twice are set as one cycle and the cycle is performed a predetermined number of times (n times). In addition, the variant is distinguished from the above-mentioned film-forming sequence shown in FIGS. 4 and 5 in that after a set of steps 1 and 2 is performed a predetermined number of times (m times), a set of steps 1 and 3 is performed a predetermined number of times (m' times), and the above is set as one cycle, while everything else is similar to the above-mentioned film-forming sequence. In addition, the case in which the number of times m the set of steps 1 and 2 is performed in the variant is one and the number of times m' the set of steps 1 and 3 is performed is one corresponds to the film-forming sequence of variant 2 shown in FIG. 6B.

Even in this variant, effects similar to the above-mentioned film-forming sequence shown in FIGS. 4 and 5 will be provided. In addition, according to the above-mentioned variant, a ratio of a silicon element, a nitrogen element, a carbon element and an oxygen element in the SiOCN film or the SiOC film can be more accurately controlled, and controllability of the composition ratio of the SiOCN film or the SiOC film can be improved.

For example, an absolute amount of the silicon element, the nitrogen element and the carbon element of the first layer can be increased by increasing the number m of sets including step 1 and step 2 in variant 1, a ratio of the silicon element, the nitrogen element and the carbon element with respect to the oxygen element of the SiOCN layer or the SiOC layer can be controlled to be increased as the first layer in which absolute amounts of the respective elements are increased is oxidized in step 3, and a ratio of the silicon element, the nitrogen element and the carbon element with respect to the oxygen element of the finally formed SiOCN film or SiOC film can be controlled to be increased.

In addition, for example, an absolute amount of the silicon element, the nitrogen element and the carbon element of the first layer can be reduced by reducing the number m of sets including step 1 and step 2 in variant 1, a ratio of the silicon element, the nitrogen element and the carbon element with respect to the oxygen element of the SiOCN layer or the SiOC layer can be controlled to be decreased as the first layer in which absolute amounts of the respective elements are decreased is oxidized in step 3, and a ratio of the silicon element, the nitrogen element and the carbon element with respect to the oxygen element of the finally formed SiOCN film or SiOC film can be controlled to be decreased.

Even in variants 2 and 3, a ratio of the silicon element, the nitrogen element, the carbon element and the oxygen element in the SiOCN film or the SiOC film can be more accurately controlled according to the same principle.

In addition, according to the variants, since the thickness formed in one cycle can be increased, the cycle rate (the thickness of the SiOCN layer or the SiOC layer formed in each unit cycle) can be improved. In addition, the film-forming rate can also be improved.

For example, as the number m of sets including step 1 and step 2 is increased in variants 1 and 3, the number of layers of the first layer formed in one cycle, i.e., the thickness of the first layer formed in one cycle, can be increased by the set number m, and the cycle rate can be improved. In addition, as the number m' of sets including step 1 and step 3 is increased in variant 3, the number of layers of the SiO layer, which is the second layer, formed in one cycle, i.e., the thickness of the second layer formed in one cycle, can be increased by the set number m', and thus the cycle rate can be improved. Further, since step 1 is performed twice per cycle in variant 2, the cycle rate can also be improved even in variant 2. In addition, the film-forming rate can also be improved.

In addition, in variants 2 and 3, a sequence of the process of forming the first layer containing Si, N and C and the process of forming the SiO layer as the second layer may be changed. That is, after the process of forming the second layer (the SiO layer), the process of forming the first layer may be performed, and the above may be set as one cycle. In addition, such a variant may be arbitrarily combined and used.

Second Embodiment of the Invention

Next, a second embodiment of the present invention will be described.

In the above-mentioned first embodiment, while an example in which the silicon oxycarbonitride film or the silicon oxycarbide film having a predetermined composition and a predetermined film thickness is formed on the wafer 200 using the oxygen-containing gas ($O_2$ gas) as the second reactive gas has been described, in the embodiment, an example in which a silicon carbonitride film having a predetermined composition and a predetermined film thickness is formed on the wafer 200 using a nitrogen-containing gas ($NH_3$ gas) as the second reactive gas will be described.

That is, in the embodiment, an example in which a cycle including a process in which a process of supplying HCDS gas, which is a chlorosilane-based source gas, to the wafer 200 in the process chamber 201 as a source gas and a process of supplying TEA gas, which is an amine-based gas containing a plurality of (three) ligands (ethyl groups) containing a carbon atom in one molecule to the wafer 200 in the process chamber 201 as a first reactive gas containing the three elements including carbon, nitrogen and hydrogen and having a composition wherein the number of carbon atoms is greater than that of nitrogen atoms in one molecule are alternately performed once to form a first layer containing silicon, nitrogen and carbon on the wafer 200; and a process of supplying $NH_3$ gas, which is a nitrogen-containing gas (a nitriding gas), to the wafer 200 in the process chamber 201 as a second reactive gas different from the source gas and the first reactive gas to modify the first layer to form a silicon carbonitride layer (a SiCN layer) as a second layer; is performed a predetermined number of times (n times) to form a silicon carbonitride film (a SiCN film) having a predetermined composition and a predetermined film thickness on the wafer 200.

Figure 7:
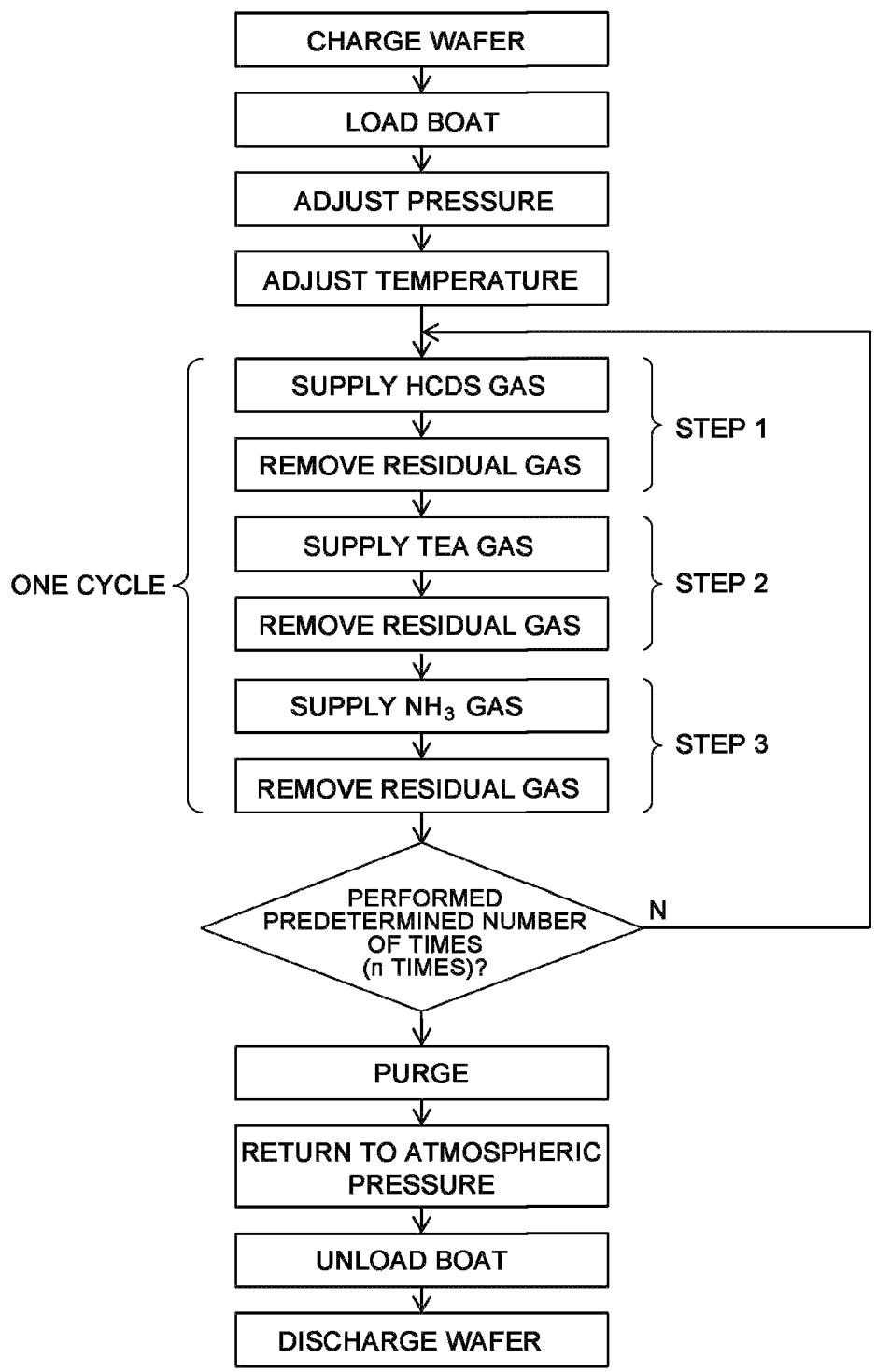
FIG. 7 is a view showing a film-forming flow of a second embodiment of the present invention.
Figure 8:
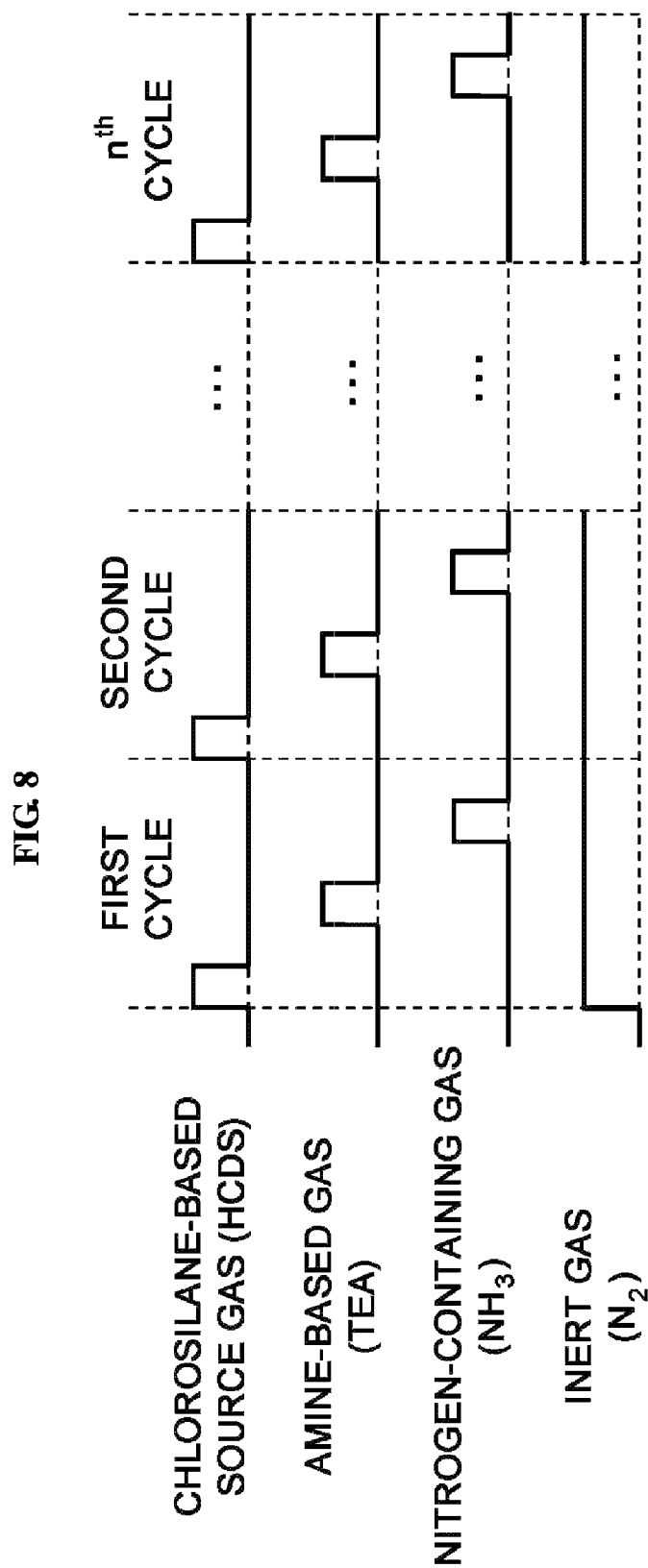
FIG. 8 is a view showing a gas supply timing in a film-forming sequence of the second embodiment of the present invention.

FIG. 7 is a view showing a film-forming flow of the embodiment. FIG. 8 is a view showing a gas supply timing in a film-forming sequence of the embodiment. In addition, the embodiment is distinguished from the first embodiment in that the thermally activated $NH_3$ gas is used as the second reactive gas in step 3, and everything else is similar to the first embodiment. Hereinafter, step 3 of the embodiment will be described.

[Step 3]

$NH_3$ Gas Supply

After step 2 is terminated and the residual gas in the process chamber 201 is removed, the valve 243d of the fourth gas supply pipe 232d is opened to flow $NH_3$ gas into the fourth gas supply pipe 232d. A flow rate of the $NH_3$ gas flowing in the fourth gas supply pipe 232d is adjusted by the mass flow controller 241d. The flow rate-adjusted $NH_3$ gas is supplied into the process chamber 201 through the gas supply hole 250c of the third nozzle 249c. The $NH_3$ gas supplied into the process chamber 201 is thermally activated (excited) to be exhausted through the exhaust pipe 231. Here, the thermally activated $NH_3$ gas is supplied to the wafer 200. At the same time, the valve 243g is opened to flow $N_2$ gas into the third inert gas supply pipe 232g. The $N_2$ gas is supplied into the process chamber 201 with the $NH_3$ gas to be exhausted through the exhaust pipe 231. In addition, here, in order to prevent infiltration of the $NH_3$ gas into the first nozzle 249a and the second nozzle 249b, the valves 243e and 243f are opened to flow the $N_2$ gas into the first inert gas supply pipe 232e and the second inert gas supply pipe 232f. The $N_2$ gas is supplied into the process chamber 201 via the first gas supply pipe 232a, the second gas supply pipe 232b, the first nozzle 249a and the second nozzle 249b to be exhausted through the exhaust pipe 231.

Here, the APC valve 244 is appropriately adjusted to set the pressure in the process chamber 201 to a pressure within a range of, for example, 1 to 3,000 Pa. As the pressure in the process chamber 201 is set to a relatively high pressure, the $NH_3$ gas can be thermally activated with non-plasma. In addition, the $NH_3$ gas can be thermally activated and supplied to cause a soft reaction, and thus, nitridation (to be described later) can be softly performed. A supply flow rate of the $NH_3$ gas controlled by the mass flow controller 241c is set to a flow rate within a range of, for example, 100 to 10,000 sccm. Supply flow rates of the $N_2$ gas controlled by the mass flow controllers 241g, 241e and 241f are set to flow rates within a range of, for example, 100 to 10,000 sccm. Here, a partial pressure of the $NH_3$ gas in the process chamber 201 is set to a pressure within a range of 0.01 to 2,970 Pa. A time for supplying the thermally activated $NH_3$ gas to the wafer 200, i.e., a gas supply time (an irradiation time), is set to a time within a range of, for example, 1 to 120 seconds, preferably, 1 to 60 seconds. Here, similar to steps 1 to 2, a temperature of the heater 207 is set such that the temperature of the wafer 200 is set to a temperature within a range of, for example, 250 to 700° C., preferably 300 to 650° C., more preferably 350 to 600° C.

Here, the gas flowing in the process chamber 201 is the $NH_3$ gas thermally activated by increasing the pressure in the process chamber 201, and neither the HCDS gas nor the TEA gas flows in the process chamber 201. Accordingly, the $NH_3$ gas does not generate a gaseous reaction, and the activated $NH_3$ gas reacts at least a portion of the first layer containing Si, N and C formed on the wafer 200 in step 2.

Accordingly, the first layer is nitrided to be modified into a layer containing silicon, carbon and nitrogen, i.e., a silicon carbonitride layer (a SiCN layer) as a second layer.

In addition, as the $NH_3$ gas is thermally activated to flow in the process chamber 201, the first layer can be thermally nitrided to be modified (changed) into a SiCN layer. Here, the first layer is modified into the SiCN layer while increasing a ratio of an N element in the first layer. Meanwhile, here, Si—N bonding in the first layer is increased by an action of thermal nitridation due to the $NH_3$ gas, and Si—C bonding and Si—Si bonding are reduced to reduce a ratio of a C element and a ratio of a Si element in the first layer. That is, the first layer can be modified into the SiCN layer while varying the composition ratio in a direction of increasing the nitrogen concentration or a direction of reducing the carbon concentration and the silicon concentration. Further, here, the ratio of the N element in the SiCN layer, i.e., the nitrogen concentration, can be finely adjusted by controlling the processing conditions such as the pressure in the process chamber 201 or the gas supply time, and the composition ratio of the SiCN layer can be more accurately controlled.

In addition, here, the nitridation reaction of the first layer may not be saturated. For example, when the first layer having a thickness of less than one atomic layer to several atomic layers is formed in steps 1 and 2, a portion of the first layer may be nitrided. In this case, the nitridation is performed under the conditions in which the nitridation reaction of the first layer is unsaturated, such that the entire first layer having a thickness of less than one atomic layer to several atomic layers is not nitrided.

Further, while the processing conditions in step 3 are set to the above-mentioned processing conditions to make the nitridation reaction of the first layer unsaturated, the nitridation of the first layer can easily become unsaturated by setting the processing conditions in step 3 to the following processing conditions.

Wafer temperature: 500 to 650° C.
Pressure in process chamber: 133 to 2,666 Pa
$NH_3$ gas partial pressure: 33 to 2,515 Pa
$NH_3$ gas supply flow rate: 1,000 to 5,000 sccm
$N_2$ gas supply flow rate: 300 to 3,000 sccm
$NH_3$ gas supply time: 6 to 60 seconds Removal of Residual Gas After the second layer is formed, the valve 243d of the fourth gas supply pipe 232d is closed to stop supply of the $NH_3$ gas. Here, in a state in which the APC valve 244 of the exhaust pipe 231 is open, the inside of the process chamber 201 is vacuum-exhausted by the vacuum pump 246 to remove the $NH_3$ gas or reaction byproduct remaining in the process chamber 201 after non-reaction or contribution to formation of the second layer from the process chamber 201. In addition, here, the valves 243g, 243e and 243f are opened to maintain supply of the $N_2$ gas into the process chamber 201. The $N_2$ gas acts as a purge gas, and thus the $NH_3$ gas or reaction byproduct remaining in the process chamber 201 after non-reaction or contribution to formation of the second layer can be effectively removed from the process chamber 201.

In addition, here, the gas remaining in the process chamber 201 may not be completely removed, and the inside of the process chamber 201 may not be completely purged. When the amount of gas remaining in the process chamber 201 is very small, there is no bad effect generated in step 1 performed thereafter. Here, a flow rate of the $N_2$ gas supplied into the process chamber 201 need not be set a large flow rate, and for example, as the amount of $N_2$ gas similar to a capacity of the reaction tube 203 (the process chamber 201) is supplied, the purge can be performed not to generate the bad effect in step 1. As described above, as the inside of the process chamber 201 is not completely purged, the purge time can be reduced to improve throughput. In addition, consumption of the $N_2$ gas can be suppressed to minimal necessity.

A gas containing diazene ($N_2H_2$) gas, hydrazine ($N_2H_4$) gas, $N_3H_8$ gas, or a compound thereof may be used as the nitrogen-containing gas, in addition to the $NH_3$ gas. A rare gas such as Ar gas, He gas, Ne gas or Xe gas may be used as the inert gas, in addition to the $N_2$ gas.

Performing Predetermined Number of Times

The above-mentioned steps 1 to 3 may be set as one cycle, and the cycle may be performed once or more (a predetermined number of times) to form a film containing silicon, carbon and nitrogen and having a predetermined composition and a predetermined film thickness, i.e., a silicon carbonitride film (a SiCN film), on the wafer 200. In addition, the above-mentioned cycle may be performed a plurality of times. That is, as the thickness of the SiCN layer formed by one cycle is set to be smaller than a desired film thickness, the above-mentioned cycle may be repeated a plurality of times to a desired film thickness.

According to the embodiment, after steps 1 and 2 are alternately performed once to form the first layer containing Si, N and C, step 3 of supplying the $NH_3$ gas, which is a nitrogen-containing gas, as the second reactive gas to nitride the first layer to modify the SiCN layer, which is a second layer, may be performed to adjust the composition ratio of carbon and nitrogen in the formed SiCN film. In addition, here, as the $NH_3$ gas is thermally activated and supplied, Si—N bonding in the SiCN film can be increased by an action of thermal nitridation, and Si—C bonding and Si—Si bonding can also be reduced. That is, the composition ratio can be varied in a direction of increasing the nitrogen concentration and in a direction of reducing the carbon concentration and the silicon concentration. In addition, here, as a thermal nitridation time is extended or a nitridation power in thermal nitridation is improved, the composition ratio can be varied in a direction of further increasing the nitrogen concentration and in a direction of further reducing the carbon concentration and the silicon concentration. Further, here, as the processing conditions such as the pressure in the process chamber 201 or the gas supply time are controlled, a ratio of the N element in the SiCN film, i.e., the nitrogen concentration, can be finely adjusted, and the composition ratio of the SiCN film can be more accurately controlled. Accordingly, permittivity of the formed SiCN film can be adjusted, an etching resistance can be improved, or a leak resistance can be improved.

In addition, according to the embodiment, effects similar to the above-mentioned first embodiment are provided. That is, by using the TEA gas, which is an amine-based gas containing the three elements including carbon, nitrogen and hydrogen, having a composition wherein the number of carbon atoms is greater than that of nitrogen atoms, and containing no silicon and no metal as the first reactive gas, the carbon concentration in the SiCN film can be increased, reaction controllability, in particular, composition controllability, upon formation of the SiCN film can be improved, an impurity concentration in the film can be reduced, or film thickness uniformity in a surface of the wafer 200 and between surfaces of the wafers 200 can be improved.

(4) Variant

While an example in which steps 1 to 3 are set as one cycle and the cycle is performed a predetermined number of times has been described in the above-mentioned film-forming sequence shown in FIGS. 7 and 8, the film-forming sequence according to the embodiment is not limited thereto but may be varied as described below.

For example, like variant 1 shown in FIG. 9A, after steps 1 and 2 are set as one set and the one set is performed a predetermined number of times (m times), step 3 may be performed, the above may be set as one cycle, and the cycle may be performed a predetermined number of times (n times). That is, a cycle including a process in which a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 are alternately performed a predetermined number of times (m times) to form a first layer containing silicon, nitrogen and carbon on the wafer 200; and a process of supplying a nitrogen-containing gas ($NH_3$ gas) to the wafer 200 in the process chamber 201 to modify the first layer to form a SiCN layer as a second layer; may be performed a predetermined number of times (n times) to form a SiCN film having a predetermined composition and a predetermined film thickness on the wafer 200. FIG. 9A shows an example in which a set of steps 1 and 2 is performed twice per cycle, i.e., an example in which a process of performing a set of steps 1 and 2 twice and a process of performing step 3 are set as one cycle and the cycle is performed a predetermined number of times (n times). The variant is distinguished from the above-mentioned film-forming sequence shown in FIGS. 7 and 8 in that a set of steps 1 and 2 is performed a predetermined number of times (m times) and then step 3 is performed, and the above is set as one cycle, while everything else is similar to the above-mentioned film-forming sequence. In addition, the case in which the number of times m the set of steps 1 and 2 is performed is one in the variant corresponds to the above-mentioned film-forming sequence shown in FIGS. 7 and 8.

In addition, for example, like variant 2 shown in FIG. 9B, steps 1, 2, 1 and 3 may be sequentially performed as one cycle and the cycle may be performed a predetermined number of times (n times). That is, a cycle including a process in which a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 are alternately performed once to form a first layer containing silicon, nitrogen and carbon on the wafer 200; and a process in which a process of supplying a chlorosilane-based source gas (HCDS gas) to the wafer 200 in the process chamber 201 and a process of supplying a nitrogen-containing gas ($NH_3$ gas) to the wafer 200 in the process chamber 201 are alternately performed once to form a silicon nitride layer (SiN layer) as a second layer on the first layer; may be performed a predetermined number of times (n times) to form a SiCN film having a predetermined composition and a predetermined film thickness formed by alternately depositing the first layer and the second layer on the wafer 200. In addition, the variant is distinguished from the above-mentioned film-forming sequence shown in FIGS. 7 and 8 in that steps 1, 2, 1 and 3 are set as one cycle, and everything else is similar to the above-mentioned film-forming sequence.

In addition, for example, like variant 3 shown in FIG. 9C, after steps 1 and 2 are set as one set and the set is performed a predetermined number of times (m times), steps 1 and 3 may be set as one set and the set may be performed a predetermined number of times (m' times), and the combinations may be set as one cycle and the cycle may be performed a predetermined number of times (n times). That is, a cycle including a process in which a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 are alternately performed a predetermined number of times (m times) to form a first layer containing silicon, nitrogen and carbon on the wafer 200; and a process in which a process of supplying a chlorosilane-based source gas (HCDS gas) to the wafer 200 in the process chamber 201 and a process of supplying a nitrogen-containing gas ($NH_3$ gas) to the wafer 200 in the process chamber 201 are alternately performed a predetermined number of times (m' times) to form a SiN layer as a second layer on the first layer; may be performed a predetermined number of times (n times) to form a SiCN film having a predetermined composition and a predetermined film thickness formed by alternately depositing the first layer and the second layer on the wafer 200. FIG. 9C shows an example in which a set of steps 1 and 2 and a set of steps 1 and 3 are performed twice per cycle, i.e., an example in which a process of performing a set of steps 1 and 2 twice and a process of performing a set of steps 1 and 3 twice are set as one cycle and the cycle is performed a predetermined number of times (n times). In addition, the variant is distinguished from the above-mentioned film-forming sequence shown in FIGS. 7 and 8 in that, after a set of steps 1 and 2 is performed a predetermined number of times (m times), a set of steps 1 and 3 is performed a predetermined number of times (m' times), and the above is set as one cycle, while everything else is similar to the above-mentioned film-forming sequence. In addition, the case in which the number of times m the set of steps 1 and 2 is performed is one and the number of times m' the set of steps 1 and 3 is performed is one in the variant corresponds to the film-forming sequence of variant 2 shown in FIG. 9B.

In such a variant, effects similar to the above-mentioned film-forming sequence shown in FIGS. 7 and 8 will be provided. In addition, according to such a variant, a ratio of the silicon element, the nitrogen element and the carbon element in the SiCN film can be more accurately controlled, and controllability of a composition ratio of the SiCN film can be improved.

For example, as the number m of sets including step 1 and step 2 is increased in variant 1, absolute amounts of the silicon element, the nitrogen element and the carbon element of the first layer can be increased. Accordingly, the first layer in which the absolute values of the respective elements are increased is nitride in step 3, a ratio of the silicon element and the carbon element with respect to the nitrogen element of the SiCN layer can be controlled to be increased, and the ratio of the silicon element and the carbon element with respect to the nitrogen element of the finally formed SiCN film can be controlled to be increased.

In addition, for example, as the number m of sets including step 1 and step 2 is reduced in variant 1, absolute values of the silicon element, the nitrogen element and the carbon element of the first layer can be reduced. Accordingly, the first layer in which the absolute values of the respective elements are reduced is nitride in step 3, the ratio of the silicon element and the carbon element with respect to the nitrogen element of the SiCN layer can be controlled to be reduced, and the ratio of the silicon element and the carbon element with respect to the nitrogen element of the finally formed SiCN film can be controlled to be reduced.

Even in variants 2 and 3, the ratio of the silicon element, the nitrogen element and the carbon element of the SiCN film can be more accurately controlled according to the same principle.

In addition, according to such a variant, a thickness of the layer formed in one cycle can be increased, and a cycle rate (a thickness of the SiCN layer formed in unit cycle) can be improved. Accordingly, the film-forming rate can also be improved.

For example, in variants 1 and 3, as the number m of sets including step 1 and step 2 is increased, the number of layers of the first layer formed in one cycle, i.e., the thickness of the first layer formed in one cycle, can be increased according to the number m of sets, and the cycle rate can be improved. In addition, as the number m' of sets including step 1 and step 3 is increased in variant 3, the number of layers of the SiN layer as the second layer formed in one cycle, i.e., the thickness of the second layer formed in one cycle, can be increased according to the set number m', and thus the cycle rate can also be improved. In addition, since step 1 is preformed twice by one cycle in variant 2, the cycle rate can be improved even in variant 2. Accordingly, the film-forming rate can also be improved.

In addition, a sequence of a process of forming a first layer containing Si, N and C and a process of forming a SiN layer as a second layer may be changed. That is, the process of forming the first layer may be performed after the process of forming the second layer (the SiN layer) is performed, and the above may be set as one cycle. In addition, the variant may be arbitrarily combined and used.

Third Embodiment of the Invention

Next, a third embodiment of the present invention will be described.

In the above-mentioned first embodiment, while an example in which the silicon oxycarbonitride film or the silicon oxycarbide film having a predetermined composition and a predetermined film thickness is formed on the wafer 200 using the oxygen-containing gas ($O_2$ gas) as the second reactive gas has been described, in the embodiment, an example in which a silicon oxycarbonitride film having a predetermined composition and predetermined film thickness is formed on the wafer 200 using a nitrogen-containing gas ($NH_3$ gas) and an oxygen-containing gas ($O_2$ gas) as a second reactive gas will be described.

That is, in the embodiment, an example in which a cycle including a process in which a process of supplying HCDS gas as a source gas, which is a chlorosilane-based source gas, to the wafer 200 in the process chamber 201 and a process of supplying TEA gas as a first reactive gas, which is an amine-based gas, containing the three elements including carbon, nitrogen and hydrogen, having a composition wherein the number of carbon atoms is greater than that of nitrogen atoms in one molecule, and containing a plurality of (three) ligands (an ethyl group) containing a carbon atom to the wafer 200 in the process chamber 201 are alternately performed once to form a first layer containing silicon, nitrogen and carbon on the wafer 200; and a process of supplying $NH_3$ gas, which is a nitrogen-containing gas (a nitriding gas), and $O_2$ gas, which is an oxygen-containing gas (an oxidizing gas), as a second reactive gas different from the source gas and the first reactive gas, to the wafer 200 in the process chamber 201 to modify the first layer to form a silicon oxycarbonitride layer (a SiOCN layer) as a second layer; is performed a predetermined number of times (n times) to form a silicon oxycarbonitride film (a SiOCN film) having a predetermined composition and a predetermined film thickness on the wafer 200 will be described.

Figure 10:
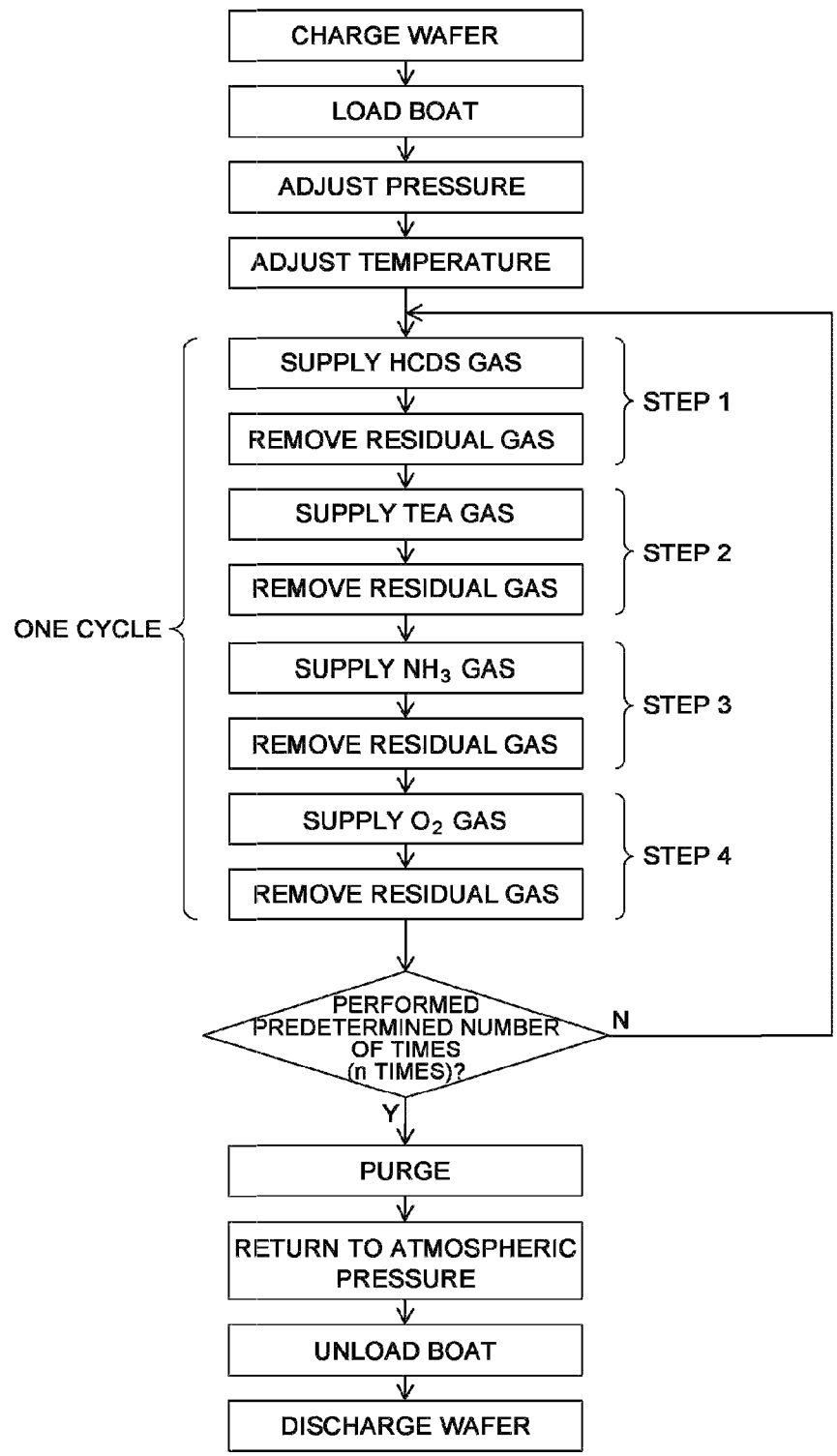
FIG. 10 is a view showing a film-forming flow of a third embodiment of the present invention.
Figure 11:
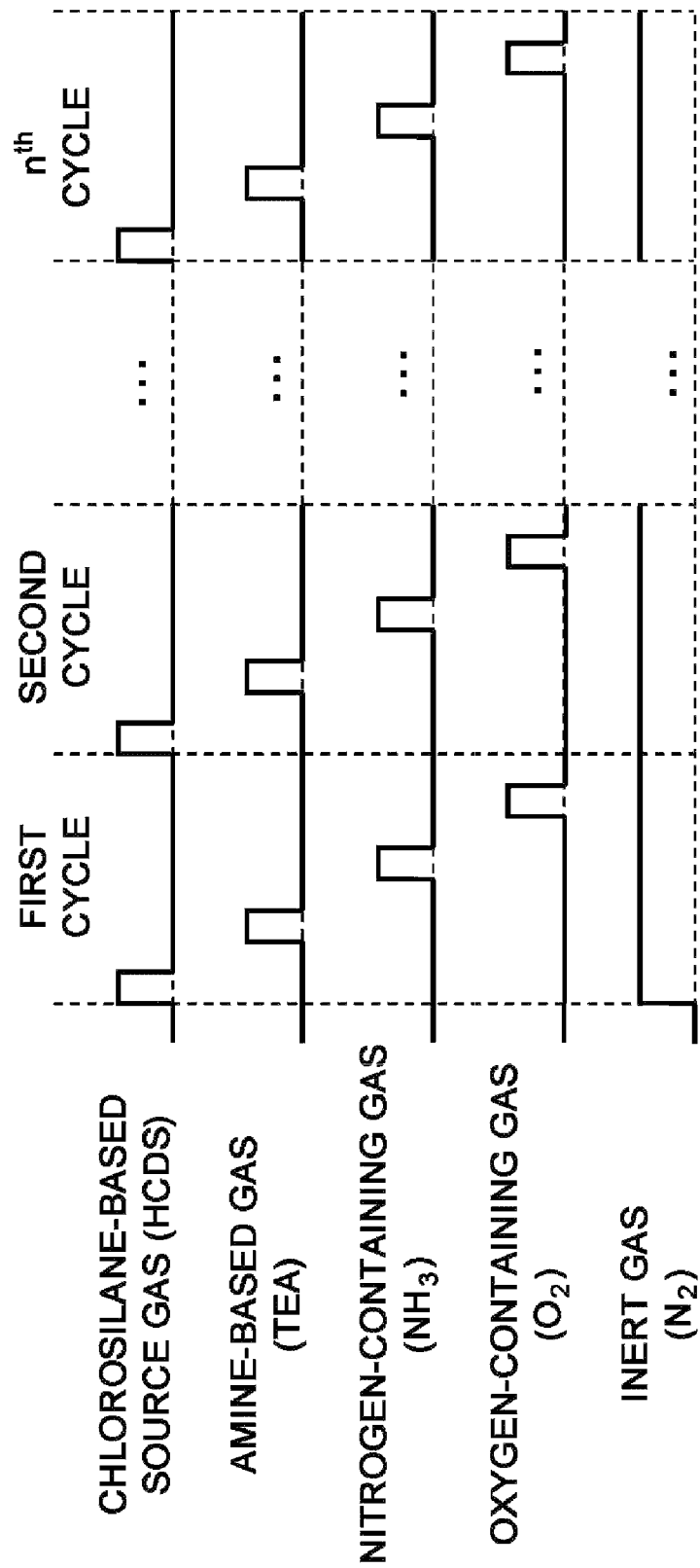
FIG. 11 is a view showing a gas supply timing in a film-forming sequence of the third embodiment of the present invention.

FIG. 10 is a view showing a film-forming flow of the embodiment. FIG. 11 is a view showing a gas supply timing in a film-forming sequence of the embodiment. In addition, the embodiment is distinguished from the first embodiment in that, after steps 1 and 2 are performed to form a first layer, step 3 of supplying $NH_3$ gas, which is a nitrogen-containing gas, as a second reactive gas to nitride the first layer, and step 4 of supplying $O_2$ gas, which is an oxygen-containing gas, as the second reactive gas to oxidize the first layer after nitridation to be modified into a SiOCN layer as a second layer are performed, steps 1 to 4 are set as one cycle, and the cycle is performed a predetermined number of times, while everything else is similar to the first embodiment. In addition, a sequence and processing conditions of step 3 of the embodiment or a reaction generated thereby are similar to a sequence and processing conditions of step 3 of the second embodiment and a reaction generated thereby. Further, a sequence and processing conditions of step 4 of the embodiment or a reaction generated thereby are similar to a sequence and processing conditions of step 3 of the first embodiment or a reaction generated thereby.

According to the embodiment, after steps 1 and 2 are alternately performed once to form the first layer containing Si, N and C, step 3 of supplying $NH_3$ gas as a second reactive gas, which is a nitrogen-containing gas, to nitride the first layer to be modified into a SiCN layer and step 4 of supplying $O_2$ gas as a second reactive gas, which is an oxygen-containing gas, to oxidize the first layer (the SiCN layer) after nitridation to be modified into a SiOCN layer as a second layer may be performed to adjust a composition ratio of oxygen, carbon and nitrogen in the formed SiOCN film. Accordingly, permittivity of the formed SiOCN film can be adjusted, an etching resistance can be improved, or a leak resistance can be improved.

In addition, according to the embodiment, effects similar to the above-mentioned first and second embodiments are provided. That is, by using the TEA gas, which is an amine-based gas containing the three elements including carbon, nitrogen and hydrogen, having a composition wherein the number of carbon atoms is greater than that of nitrogen atoms, and containing no silicon and no metal, as a first reactive gas, a carbon concentration of the SiOCN film can be increased, reaction controllability, in particular, composition controllability, upon formation of the SiOCN film can be improved, an impurity concentration in the film can be reduced, or film thickness uniformity in a surface of the wafer 200 and between surfaces of the wafers 200 can be improved. In addition, as the $NH_3$ gas or the $O_2$ gas is thermally activated (excited) and supplied as the second reactive gas, a composition ratio of the SiOCN film can be appropriately adjusted.

Variant

In the above-mentioned film-forming sequence shown in FIGS. 10 and 11, while an example in which steps 1 to 4 are set as one cycle and the cycle is performed a predetermined number of times has been described, the film-forming sequence according to the embodiment is not limited thereto but may be varied as described below.

Figure 12A:
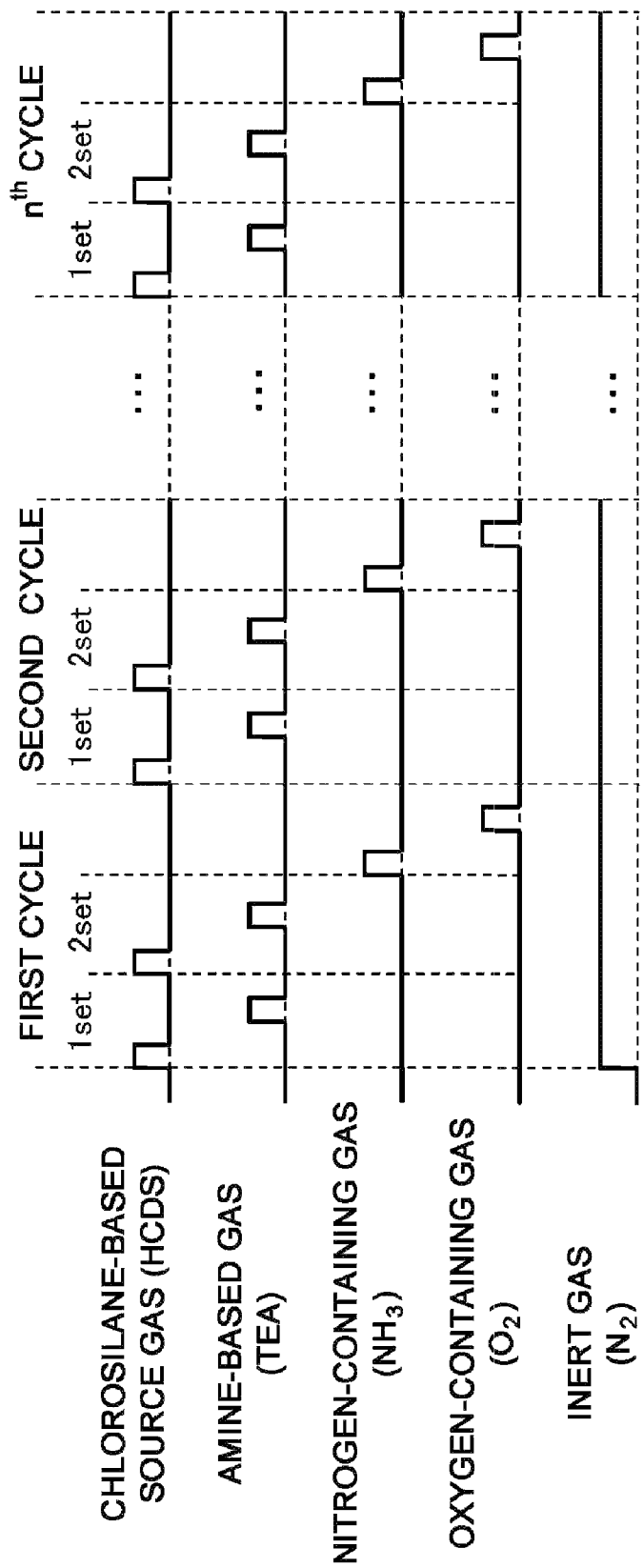
FIGS. 12A and 12B are views showing variants of the gas supply timing in the film-forming sequence of the third embodiment of the present invention, FIG. 12A showing a variant 1 and FIG. 12B showing a variant 2.

For example, like variant 1 shown in FIG. 12A, after steps 1 and 2 are set as one set and the set is performed a predetermined number of times (m times), steps 3 and 4 may be sequentially performed, and the above may be set as one cycle and the cycle may be performed a predetermined number of times (n times). That is, a cycle including a process in which a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 are alternately performed a predetermined number of times (m times) to form a first layer containing silicon, nitrogen and carbon on the wafer 200; and a process of sequentially supplying a nitrogen-containing gas ($NH_3$ gas) and an oxygen-containing gas ($O_2$ gas) to the wafer 200 in the process chamber 201 to modify the first layer to form a SiOCN layer as a second layer; may be performed a predetermined number of times (n times) to form a SiOCN film having a predetermined composition and a predetermined film thickness on the wafer 200. FIG. 12A shows an example in which steps 1 and 2 are performed twice per cycle, i.e., an example in which a process of performing a set of steps 1 and 2 twice and a process of performing steps 3 and 4 twice are set as one cycle and the cycle is performed a predetermined number of times (n times). The variant is distinguished from the above-mentioned film-forming sequence shown in FIGS. 10 and 11 in that after a set of steps 1 and 2 is performed a predetermined number of times (m times), steps 3 and 4 are sequentially performed, and the above is set as one cycle, while everything else is similar to the above-mentioned film-forming sequence. In addition, the case in which the number of times m the set of steps 1 and 2 is performed is one in the variant corresponds to the above-mentioned film-forming sequence shown in FIGS. 10 and 11.

Figure 12B:
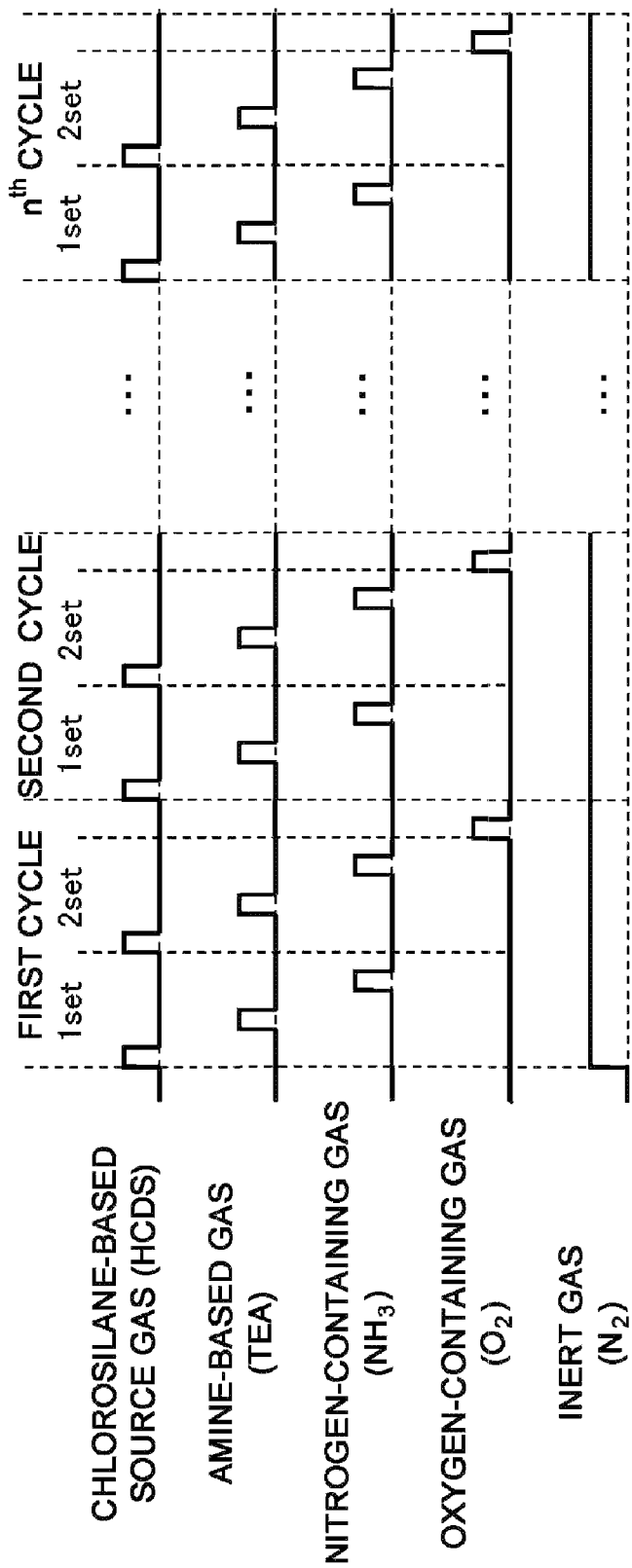

In addition, for example, like variant 2 shown in FIG. 12B, after steps 1 to 3 are set as one set and the set is performed a predetermined number of times (m times), step 4 may be performed, and the above may be set as one cycle and the cycle may be performed a predetermined number of times (n times). That is, a cycle including a process in which a set including a process of supplying a chlorosilane-based source gas (HCDS gas) to the wafer 200 in the process chamber 201, a process of supplying an amine-based gas (TEA gas) containing the three elements including carbon, nitrogen and hydrogen and having a composition wherein the number of carbon atoms is greater than that of nitrogen atoms to the wafer 200 in the process chamber 201, and a process of supplying a nitrogen-containing gas ($NH_3$ gas) to the wafer 200 in the process chamber 201 is performed a predetermined number of times (m times) to form a SiCN layer as a first layer on the wafer 200; and a process of supplying an oxygen-containing gas ($O_2$ gas to the wafer 200 in the process chamber 201 to modify the first layer to form a SiOCN layer as a second layer; may be performed a predetermined number of times (n times) to form a SiOCN film having a predetermined composition and a predetermined film thickness on the wafer 200. FIG. 12B shows an example in which a set of steps 1 to 3 is performed twice per cycle, i.e., an example in which a process of performing a set of steps 1 to 3 is performed twice and a process of performing step 4 are set as one cycle and the cycle is performed a predetermined number of times (n times). The variant is distinguished from the above-mentioned film-forming sequence shown in FIGS. 10 and 11 in that, after the set of steps 1 to 3 is performed a predetermined number of times (m times), step 4 is performed, and the above is set as one cycle, while everything else is similar to the above-mentioned film-forming sequence. In addition, the case in which the number of times m the set of steps 1 to 3 is performed is one in the variant corresponds to the above-mentioned film-forming sequence shown in FIGS. 10 and 11.

Figure 13A:
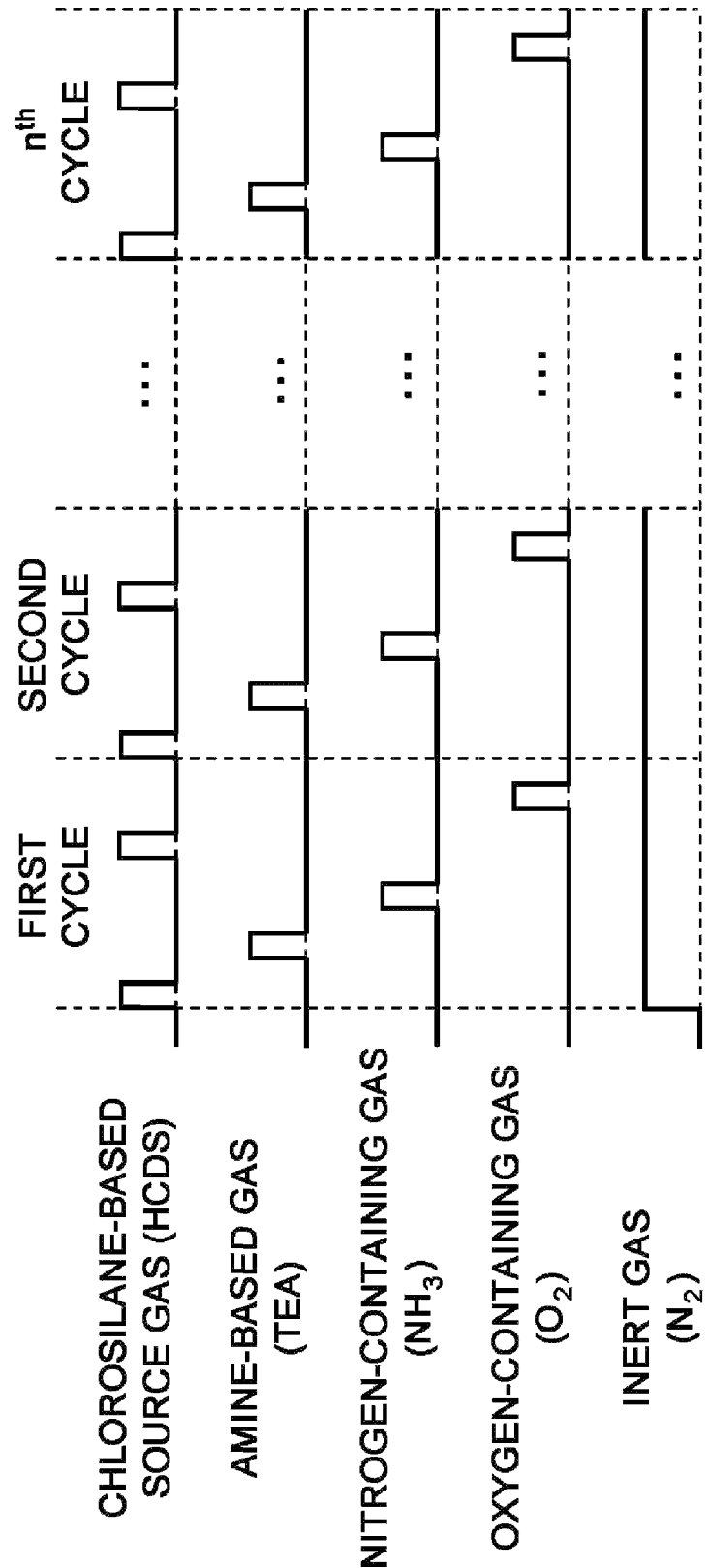
FIGS. 13A and 13B are views showing variants of the gas supply timing in the film-forming sequence of the third embodiment of the present invention, FIG. 13A showing a variant 3 and FIG. 13B showing a variant 4.

In addition, for example, like variant 3 shown in FIG. 13A, steps 1, 2, 3, 1, and 4 may be sequentially performed and set as one cycle, and the cycle may be performed a predetermined number of times (n times). That is, a cycle including a process in which a set including a process of supplying a chlorosilane-based source gas (HCDS gas) to the wafer 200 in the process chamber 201, a process of supplying an amine-based gas (TEA gas) containing the three elements including carbon, nitrogen and hydrogen and having a composition wherein the number of carbon atoms is greater than that of nitrogen atoms to the wafer 200 in the process chamber 201, and a process of supplying a nitrogen-containing gas ($NH_3$ gas) to the wafer 200 in the process chamber 201 is performed once to form a SiCN layer as a first layer on the wafer 200; and a process in which a set including a process of supplying a chlorosilane-based source gas (HCDS gas) to the wafer 200 in the process chamber 201 and a process of supplying an oxygen-containing gas ($O_2$ gas) to the wafer 200 in the process chamber 201 is performed once to form a silicon oxide layer (a SiO layer) as a second layer on the first layer; may be performed a predetermined number of times (n times) to form a SiOCN film having a predetermined composition and a predetermined film thickness formed by alternately depositing the first layer and the second layer on the wafer 200. In addition, the variant is distinguished from the above-mentioned film-forming sequence shown in FIGS. 10 and 11 in that steps 1, 2, 3, 1, and 4 are set as one cycle, and everything else is similar to the above-mentioned film-forming sequence.

Figure 13B:
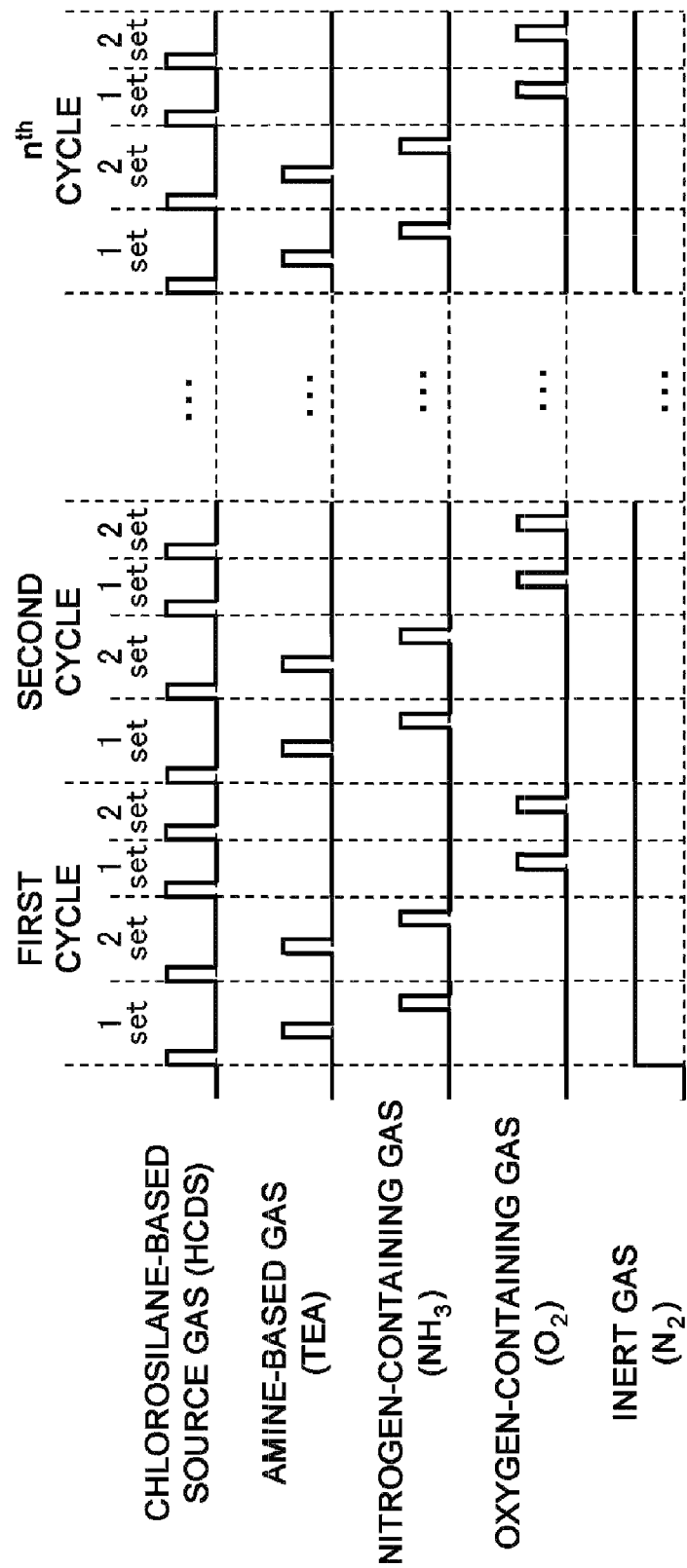

In addition, for example, like variant 4 shown in FIG. 13B, after steps 1 to 3 are set as one set and the set is performed a predetermined number of times (m times), steps 1 and 4 may be set as one set and the set may be performed a predetermined number of times (m' times), and the combinations may be set as one cycle and the cycle may be performed a predetermined number of times (n times). That is, a cycle including a process in which a set including a process of supplying a chlorosilane-based source gas (HCDS gas) to the wafer 200 in the process chamber 201, a process of supplying an amine-based gas (TEA gas) containing the three elements including carbon, nitrogen and hydrogen and having a composition wherein the number of carbon atoms is greater than that of nitrogen atoms to the wafer 200 in the process chamber 201, and a process of supplying a nitrogen-containing gas ($NH_3$ gas) to the wafer 200 in the process chamber 201 is performed a predetermined number of times (m times) to form a SiCN layer as a first layer on the wafer 200; and a process in which a set including a process of supplying a chlorosilane-based source gas (HCDS gas) to the wafer 200 in the process chamber 201 and a process of supplying an oxygen-containing gas ($O_2$ gas) to the wafer 200 in the process chamber 201 is performed a predetermined number of times (m' times) to form a SiO layer as a second layer on the first layer; may be performed a predetermined number of times (n times) to form a SiOCN film having a predetermined composition and a predetermined film thickness formed by alternately depositing the first layer and the second layer on the wafer 200. FIG. 13B shows an example in which a set of steps 1 to 3 and a set of steps 1 and 4 are respectively performed twice per cycle, i.e., an example in which a process of performing a set of steps 1 to 3 twice and a process of performing a set of steps 1 and 4 twice are set as one cycle and the cycle is performed a predetermined number of times (n times). In addition, the variant is distinguished from the above-mentioned film-forming sequence shown in FIGS. 10 and 11 in that, after a set of steps 1 to 3 is performed a predetermined number of times (m times), a set of steps 1 and 4 is performed a predetermined number of times (m' times), and the above is set as one cycle, while everything else is similar to the above-mentioned film-forming sequence. In addition, the case in which the number of times m the set of steps 1 to 3 are performed is one and the performing number m' of the set of steps 1 and 4 in the variant is one corresponds to the film-forming sequence of variant 3 shown in FIG. 13A.

Figure 14A:
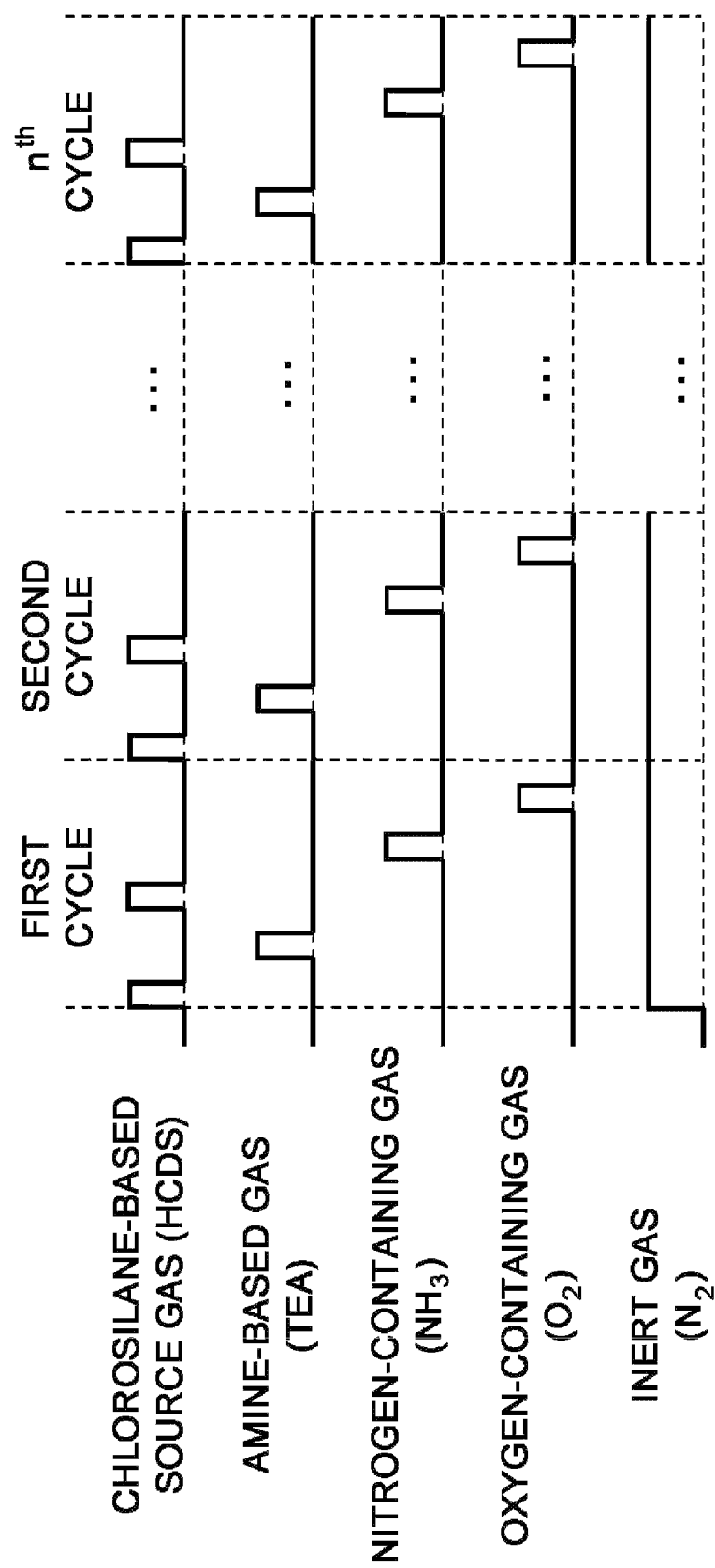
FIGS. 14A and 14B are views showing variants of the gas supply timing in the film-forming sequence of the third embodiment of the present invention, FIG. 14A showing a variant 5 and FIG. 14B showing a variant 6.

In addition, for example, like variant 5 shown in FIG. 14A, steps 1, 2, 1, 3, and 4 may be sequentially performed and set as one cycle and the cycle may be performed a predetermined number of times. That is, a cycle including a process in which a set including a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 is performed once to form a first layer containing silicon, nitrogen and carbon on the wafer 200; a process in which a set including a process of supplying a chlorosilane-based source gas (HCDS gas) to the wafer 200 in the process chamber 201, a process of supplying a nitrogen-containing gas ($NH_3$ gas) to the wafer 200 in the process chamber 201, and a process of supplying an oxygen-containing gas ($O_2$ gas) to the wafer 200 in the process chamber 201 is performed once to form a silicon oxynitride layer (a SiON layer) as a second layer on the first layer; may be performed a predetermined number of times (n times) to form a SiOCN film having a predetermined composition and a predetermined film thickness formed by alternately depositing the first layer and the second layer on the wafer 200. In addition, the variant is distinguished from the above-mentioned film-forming sequence shown in FIGS. 10 and 11 in that steps 1, 2, 1, 3, and 4 are set at one cycle, and everything else is similar to the above-mentioned film-forming sequence.

Figure 14B:
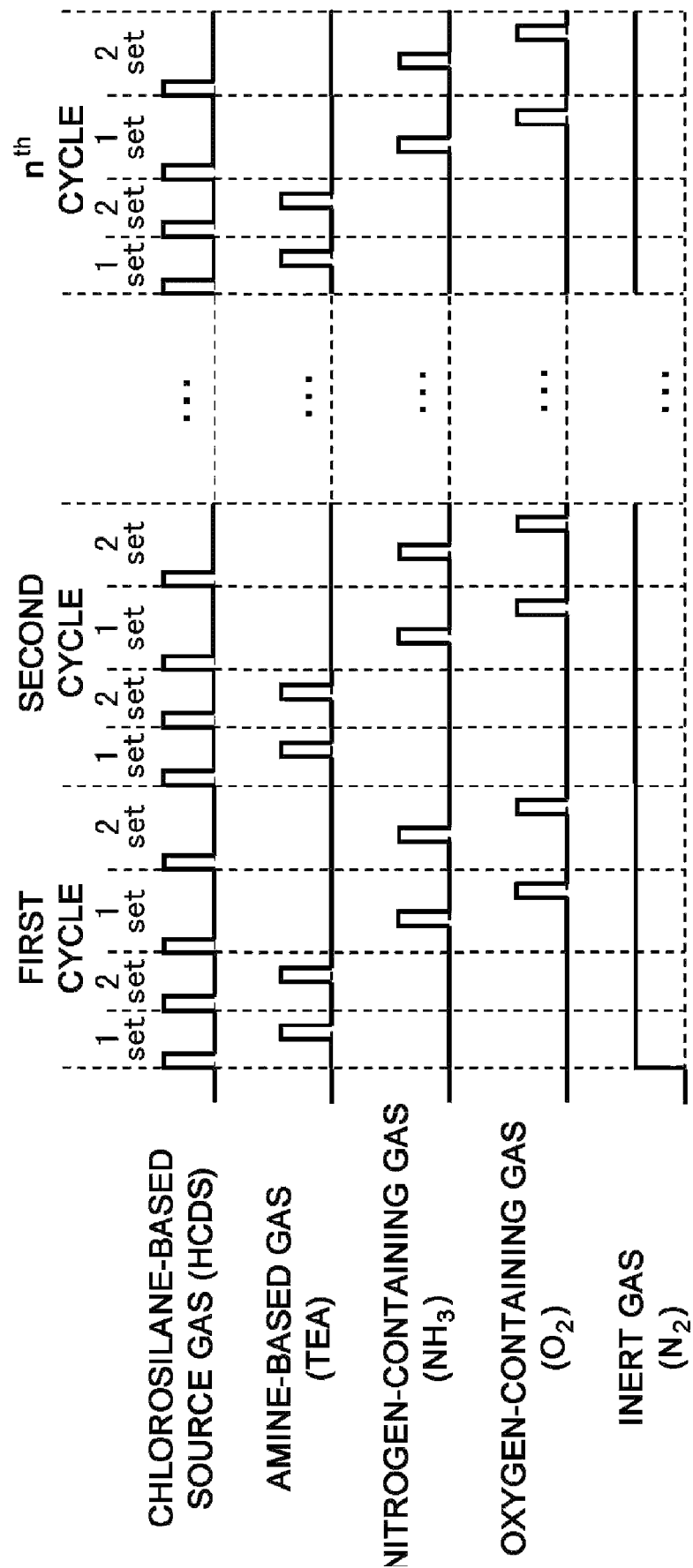

In addition, for example, like variant 6 shown in FIG. 14B, after steps 1 and 2 are set as one set and the set is performed a predetermined number of times (m times), steps 1, 3 and 4 may be set as one set and the set may be performed a predetermined number of times (m' times), and the above may be set as one cycle and the cycle may be performed a predetermined number of times (n times). That is, a cycle including a process in which a set including a process of supplying a chlorosilane-based source gas (HCDS gas) to the wafer 200 in the process chamber 201 and a process of supplying an amine-based gas (TEA gas) containing the three elements including carbon, nitrogen and hydrogen and having a composition wherein the number of carbon atoms is greater than that of nitrogen atoms to the wafer 200 in the process chamber 201 is performed a predetermined number of times (m times) to form a first layer containing silicon (Si), nitrogen (N) and carbon (C) on the wafer 200; a process in which a set including a process of supplying a chlorosilane-based source gas (HCDS gas) to the wafer 200 in the process chamber 201, a process of supplying a nitrogen-containing gas ($NH_3$ gas) to the wafer 200 in the process chamber 201, and a process of supplying an oxygen-containing gas ($O_2$ gas) to the wafer 200 in the process chamber 201 is performed a predetermined number of times (m' times) to form a SiON layer as a second layer on the first layer; may be performed a predetermined number of times (n times) to form a SiOCN film having a predetermined composition and a predetermined film thickness formed by alternately depositing the first layer and the second layer on the wafer 200. FIG. 14B shows an example in which a set of steps 1 and 2 and a set of steps 1, 3 and 4 are respectively performed twice per cycle, i.e., an example in which a process of performing a set of steps 1 and 2 twice and a process of performing a set of steps 1, 3 and 4 twice are set as one cycle and the cycle is performed a predetermined number of times (n times). The variant is distinguished from the above-mentioned film-forming sequence shown in FIGS. 10 and 11 in that after a set of steps 1 and 2 is performed a predetermined number of times (m times), a set of steps 1, 3 and 4 is performed a predetermined number of times (m' times), and the above is set as one cycle, while everything else is similar to the above-mentioned film-forming sequence. In addition, the case in which the number of times m the set of steps 1 and 2 is performed is one and the number of times m' the set of steps 1, 3 and 4 is performed is one in the variant corresponds to the film-forming sequence of the variant 5 shown in FIG. 14A.

Even in the variant, effects similar to the above-mentioned film-forming sequence shown in FIGS. 10 and 11 can be provided. In addition, according to such a variant, a ratio of the silicon element, the nitrogen element, the carbon element and the oxygen element in the SiOCN film can be more accurately controlled, and controllability of the composition ratio of the SiOCN film can be improved. In addition, according to the variant, a thickness of the layer formed by one cycle can be increased, and a cycle rate (a thickness of the SiOCN layer formed by a unit cycle) can be improved. Accordingly, a film-forming rate can also be improved.

In addition, in the variants 3 and 4, the process of forming the SiCN layer as the first layer and the process of forming the SiO layer as the second layer may be changed. That is, the process of forming the SiCN later may be performed after the process of forming the SiO layer is performed, and the above may be set as one cycle. In addition, in variants 5 and 6, the process of forming the first layer containing Si, N and C and the process of forming the SiON layer as the second layer may be changed. That is, after the process of forming the SiON layer is performed, the process of forming the first layer is performed, and the above may be set as one cycle. In addition, the variant may be arbitrarily combined and used.

Another Embodiment of the Invention

Hereinabove, while the embodiment of the present invention has been specifically described, the present invention is not limited to the above-mentioned embodiment but may be varied without departing from the spirit of the present invention.

For example, in the above-mentioned embodiment, while the example in which the chlorosilane-based source gas is supplied to the wafer 200 in the process chamber 201 when the first layer containing Si, N and C is formed, and then the amine-based gas is supplied has been described, the supply sequence of the gases may be reversed. That is, the amine-based gas may be supplied, and then the chlorosilane-based source gas may be supplied. That is, one of the chlorosilane-based source gas and the amine-based gas may be supplied, and then the other gas may be supplied. As described above, as the supply sequence of the gases is varied, film quality or a composition ratio of the formed thin film can be varied.

In addition, for example, in the above-mentioned embodiment, while an example in which the chlorosilane-based source gas is used as the source gas when the initial layer containing the predetermined element (silicon) and the halogen element (chlorine) is formed in step 1 has been described, the silane-based source gas having a halogen-based ligand other than the chloro group may be used instead of the chlorosilane-based source gas. For example, a fluorosilane-based source gas may be used instead of the chlorosilane-based source gas. Here, the fluorosilane-based source gas refers to a fluorosilane-based source material in a gaseous state, for example, a gas obtained by vaporizing a fluorosilane-based source material in a liquid state under a normal temperature and a normal pressure, or a fluorosilane-based source material in a gaseous state under a normal temperature and a normal pressure. In addition, the fluorosilane-based source material is a silane-based source material containing a fluoro group, which is a halogen group, and is a source material containing at least silicon (Si) and fluorine (F). That is, the fluorosilane-based source material disclosed herein may be referred to as a kind of halide. For example, silicon fluoride gas such as tetrafluorosilane, i.e., silicon tetrafluoride ($SiF_4$) gas, or hexafluorodisilane ($Si_2F_6$) gas, may be used as the fluorosilane-based source gas. In this case, when an initial layer containing a predetermined element and a halogen element is formed, the fluorosilane-based source gas is supplied to the wafer 200 in the process chamber 201. In this case, the initial layer becomes a layer containing Si and F, i.e., a silicon-containing layer containing F.

In addition, for example, in the above-mentioned embodiment, while an example in which the amine-based gas is used as the first reactive gas when the silicon-containing layer containing Cl as the initial layer is modified into the first layer containing Si, N and C has been described, a gas containing, for example, an organic hydrazine compound, i.e., an organic hydrazine-based gas, may be used as the first reactive gas instead of the amine-based gas. In addition, the gas containing an organic hydrazine compound may be simply referred to as an organic hydrazine compound gas or an organic hydrazine gas. Here, the organic hydrazine-based gas is organic hydrazine in a gaseous state, for example, a gas obtained by vaporizing organic hydrazine in a liquid state under a normal temperature and a normal pressure, or a gas containing a hydrazine group such as organic hydrazine in a gaseous state under a normal temperature and a normal pressure. The organic hydrazine-based gas is a gas containing the three elements including carbon (C), nitrogen (N) and hydrogen (H) and containing no silicon, or a gas containing no silicon and no metal. For example, a methyl hydrazine-based gas formed by vaporizing monomethyl hydrazine [$(CH_3)HN_2H_2$, abbreviation: MMH], dimethyl hydrazine [$(CH_3)_2N_2H_2$, abbreviation: DMH], or trimethyl hydrazine [$(CH_3)_2N_2(CH_3)H$, abbreviation: TMH], or an ethyl hydrazine-based gas formed by vaporizing ethyl hydrazine [$(C_2H_5)HN_2H_2$, abbreviation: EH] may be used as the organic hydrazine-based gas. In this case, when the silicon-containing layer containing Cl as the initial layer is modified into the first layer containing Si, N and C, the organic hydrazine-based gas is supplied to the wafer 200 in the process chamber 201. In addition, a gas containing the three elements including carbon, nitrogen and hydrogen and having a composition wherein the number of carbon atoms is greater than that of nitrogen atoms in one molecule may be used as the organic hydrazine-based gas. In addition, a gas containing a plurality of ligands containing a carbon (C) atom in one molecule, i.e., a gas containing a plurality of hydrocarbon groups such as an alkyl group in one molecule, may be used as the organic hydrazine-based gas. Specifically, a gas containing three or two ligands (hydrocarbon groups such as alkyl groups) containing a carbon (C) atom in one molecule may be used as the organic hydrazine-based gas.

Figure 15A:
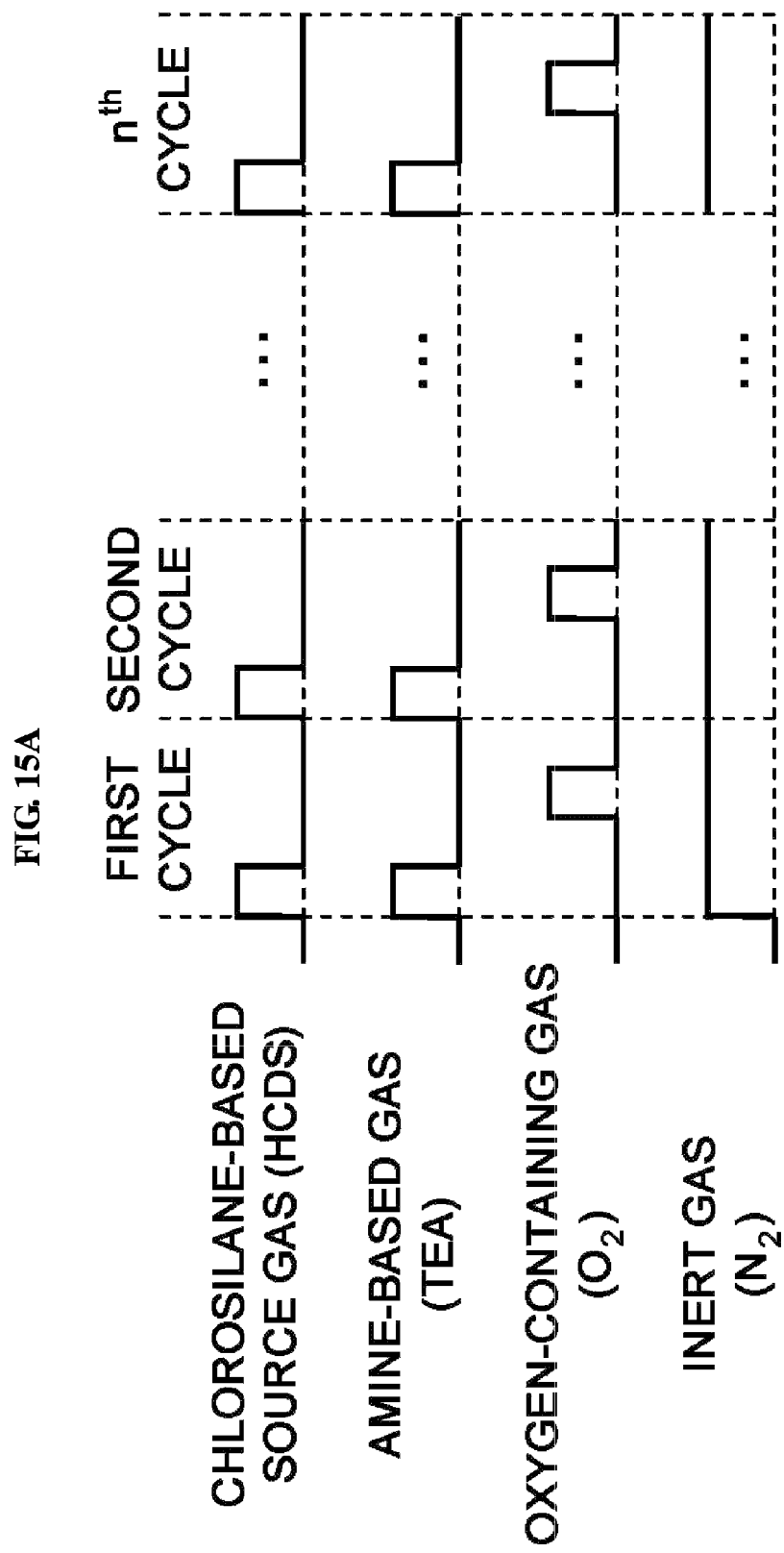

In addition, for example, in the above-mentioned embodiment, while an example in which the chlorosilane-based source gas is supplied to the wafer 200 in the process chamber 201 when the first layer containing Si, N and C is formed, and then the amine-based gas is supplied has been described, as shown in FIG. 15A, the chlorosilane-based source gas and the amine-based gas may be simultaneously supplied to the wafer 200 in the process chamber 201 to generate a CVD reaction.

A sequence of FIGS. 15A and 15B is an example in which a cycle including a process of simultaneously supplying a chlorosilane-based source gas (HCDS gas), and an amine-based gas (TEA gas) containing the three elements including carbon, nitrogen and hydrogen and having a composition wherein the number of carbon atoms is greater than that of nitrogen atoms to the wafer 200 in the process chamber 201 to form a first layer containing silicon, nitrogen and carbon on the wafer 200; and a process of supplying an oxygen-containing gas ($O_2$ gas), which is a second reactive gas, to the wafer 200 in the process chamber 201 to modify the first layer to form a SiOCN layer or a SiOC layer as a second layer; is performed a predetermined number of times (n times) to form a SiOCN film or a SiOC film having a predetermined composition and a predetermined film thickness on the wafer 200. In addition, FIG. 15A shows the case in which a process of simultaneously supplying HCDS gas and TEA gas is performed once in one cycle, and FIG. 15B shows the case in which a process of simultaneously supplying HCDS gas and TEA gas is performed a plurality of times (twice) by one cycle. In addition, the processing conditions in this case may also be processing conditions similar to the processing conditions in the above-mentioned embodiment.

As described, even when the chlorosilane-based source gas and the amine-based gas are simultaneously, rather than sequentially, supplied to the wafer 200 in the process chamber 201, effects similar to the above-mentioned embodiment can be obtained. However, alternate supply of the chlorosilane-based source gas and the amine-based gas with the purge in the process chamber 201 interposed therebetween like in the above-mentioned embodiment can appropriately cause reaction of the chlorosilane-based source gas with the amine-based gas under a condition that a surface reaction is dominant, and controllability of film thickness can be improved.

As the silicon insulating film formed by techniques of the above-mentioned embodiments or variants is used as a sidewall spacer, a device forming technique having a small leak current and good machinability can be provided.

As the silicon insulating film formed by a technique of the above-mentioned embodiments or variants is used as an etching stopper, a device forming technique having good machinability can be provided.

According to the above-mentioned embodiments or variants, the silicon insulating film having an ideal stoichiometric mixture ratio can be formed without using plasma even at a low temperature region. In addition, since the silicon insulating film can be formed with no use of plasma, for example, application to a process having probability of plasma damage, for example, an SADP film of DPT, is also possible.

In addition, in the above-mentioned embodiment, while an example in which the silicon-based insulating film (the SiOCN film, the SiOC film, or the SiCN film) containing silicon, which is a semiconductor element, is formed as an oxycarbonitride film, an oxycarbide film, or a carbonitride film has been described, the present invention may be applied to the case in which a metal-based thin film containing a metal element such as titanium (Ti), zirconium (Zr), hafnium (Hf), tantalum (Ta), aluminum (Al), molybdenum (Mo), or the like is used.

That is, the present invention may be applied to the case in which a metal oxycarbonitride film such as a titanium oxycarbonitride film (a TiOCN film), a zirconium oxycarbonitride film (a ZrOCN film), a hafnium oxycarbonitride film (a HfOCN film), a tantalum oxycarbonitride film (a TaOCN film), an aluminum oxycarbonitride film (an AlOCN film), a molybdenum oxycarbonitride film (a MoOCN film), or the like, is formed.

In addition, for example, the present invention may be applied to the case in which a metal oxycarbide film such as a titanium oxycarbide film (a TiOC film), a zirconium oxycarbide film (a ZrOC film), a hafnium oxycarbide film (a HfOC film), a tantalum oxycarbide film (a TaOC film), an aluminum oxycarbide film (an AlOC film), a molybdenumoxycarbide film (a MoOC film), or the like, is formed.

Further, for example, the present invention may also be applied to the case in which a metal carbonitride film such as a titanium carbonitride film (a TiCN film), a zirconium carbonitride film (a ZrCN film), a hafnium carbonitride film (a HfCN film), a tantalum carbonitride film (a TaCN film), an aluminum carbonitride film (an AlCN film), a molybdenum carbonitride film (a MoCN film), or the like, is formed.

In this case, film-forming may be performed by a sequence similar to the above-mentioned embodiment using a source gas containing a metal element and a halogen element, instead of the chlorosilane-based source gas in the above-mentioned embodiment. That is, a cycle including a process in which a process of supplying a source gas containing a metal element and a halogen element to the wafer 200 in the process chamber 201 and a process of supplying a first reactive gas containing the three elements including carbon, nitrogen and hydrogen and having a composition wherein the number of carbon atoms is greater than that of nitrogen atoms to the wafer 200 in the process chamber 201 are alternately performed a predetermined number of times to form a first layer containing a metal element, nitrogen and carbon on the wafer 200; and a process of supplying a second reactive gas different from the source gas and the first reactive gas to the wafer 200 in the process chamber 201 to modify the first layer to form a second layer; may be performed a predetermined number of times to form a metal-based thin film (a metal oxycarbonitride film, a metal oxycarbide film, or a metal carbonitride film) having a predetermined composition and a predetermined film thickness on the wafer 200.

For example, when a metal-based thin film (a TiOCN film, a TiOC film, or a TiCN film) containing Ti is formed, a gas containing Ti and a chloro group such as titanium tetrachloride ($TiCl_4$) or a gas containing Ti and a fluoro group such as titanium tetrafluoride ($TiF_4$) may be used as the source gas. A gas similar to the above-mentioned embodiment may be used as the first and second reactive gases. In addition, the processing conditions at this time may be, for example, processing conditions similar to the above-mentioned embodiment.

In addition, for example, when a metal-based thin film containing Zr (a ZrOCN film, a ZrOC film, or a ZrCN film) is formed, a gas containing Zr and a chloro group such as zirconium tetrachloride ($ZrCl_4$) or a gas containing Zr and a fluoro group such as zirconium tetrafluoride ($ZrF_4$) may be used as the source gas. The same gas as of the above-mentioned embodiment may be used as the first and second reactive gases. Further, the processing conditions at this time may be substantially the same processing conditions as of the above-mentioned embodiment.

In addition, for example, when a metal-based thin film containing Hf (a HfOCN film, a HfOC film, or a HfCN film) is formed, a gas containing Hf and a chloro group such as hafnium tetrachloride ($HfCl_4$) or a gas containing Hf and a fluoro group such as hafnium tetrafluoride ($HfF_4$) may be used as the source gas. The same gas as of the above-mentioned embodiment may be used as the first and second reactive gases. Further, the processing conditions at this time may be substantially the same processing conditions as of the above-mentioned embodiment.

In addition, for example, when a metal-based thin film containing Ta (a TaOCN film, a TaOC film, or a TaCN film) is formed, a gas containing Ta and a chloro group such as tantalum pentachloride ($TaCl_5$) or a gas containing Ta and a fluoro group such as tantalum pentafluoride ($TaF_5$) may be used as the source gas. The same gas as of the above-mentioned embodiment may be used as the first and second reactive gases. Further, the processing conditions at this time may be substantially the same processing conditions as of the above-mentioned embodiment.

In addition, for example, when a metal-based thin film containing Al (an AlOCN film, an AlOC film, or an AlCN film) is formed, a gas containing Al and a chloro group such as aluminum trichloride ($AlCl_3$) or a gas containing Al and a fluoro group such aluminum trifluoride ($AlF_3$) may be used as the source gas. The same gas as of the above-mentioned embodiment may be used as the first and second reactive gases. Further, the processing conditions at this time may be substantially the same processing conditions as of the above-mentioned embodiment.

In addition, for example, when a metal-based thin film containing Mo (a MoOCN film, a MoOC film, or a MoCN film) is formed, a gas containing Mo and a chloro group such as molybdenum pentachloride ($MoCl_5$) or a gas containing Mo and a fluoro group such as molybdenum pentafluoride ($MoF_5$) may be used as the source gas. The same gas as of the above-mentioned embodiment may be used as the first and second reactive gases. Further, the processing conditions at this time may be substantially the same processing conditions as of the above-mentioned embodiment.

That is, the present invention may be applied to the case in which a thin film containing a predetermined element such as a semiconductor element or a metal element is formed.

In addition, in the above-mentioned embodiment, while an example in which the thin film is formed using a batch type substrate processing apparatus in which a plurality of substrates are processed at a time has been described, the present invention is not limited thereto but may be applied to the case in which the thin film is formed using a sheet-feed type substrate processing apparatus in which one or several substrates are processed at a time. In addition, in the above-mentioned embodiment, while an example in which the thin film is formed using the substrate processing apparatus including a hot wall type processing furnace has been described, the present invention is not limited thereto but may be applied to the case in which the thin film is formed using the substrate processing apparatus including a cold wall type processing furnace.

In addition, the above-mentioned embodiments, variants, and application examples may be appropriately combined and used.

Further, the present invention is realized by varying, for example, a process recipe of the substrate processing apparatus in the related art. When the process recipe is varied, the process recipe according to the present invention may be installed at the substrate processing apparatus in the related art via a electrical communication line or a non-transitory computer readable recording medium in which the process recipe is recorded, or the process recipe itself may be changed into the process recipe according to the present invention by manipulating an input/output device of the substrate processing apparatus in the related art.

Example 1

SiOCN films were formed on a plurality of wafers by the film-forming sequence of the above-mentioned first embodiment using the substrate processing apparatus of the above-mentioned embodiment. HCDS gas was used as a source gas, TEA gas was used as a first reactive gas, and $O_2$ gas was used as a second reactive gas. A wafer temperature upon film-forming was 600 to 650° C. Here, a supply time of the $O_2$ gas in step 3 was varied to 0 seconds, 3 seconds and 6 seconds, and three estimation samples were drafted. The other processing conditions were set as predetermined values within a range of the processing conditions described in the above-mentioned first embodiment. Hereinafter, the estimation samples drafted by setting the supply times of the $O_2$ gas in step 3 to 0 seconds, 3 seconds and 6 seconds are referred to as estimation samples A, B and C, respectively. In addition, the supply time of the $O_2$ gas=0 seconds refers to the case in which the $O_2$ gas is not supplied, i.e., the case in which a material containing Si, N and C (hereinafter, simply referred to as "a SiCN film") is formed by a sequence in which step 1 and step 2 of the film-forming sequence of the above-mentioned first embodiment are alternately repeated (a reference example). Then, film thickness uniformity in a wafer surface (hereinafter referred to as WIW), film thickness uniformity between surfaces of the wafers (hereinafter referred to as WTW), a refractive index (hereinafter referred to as R.I.), an XPS composition ratio, and a wet etching rate (hereinafter referred to as WER) with respect to a liquid containing hydrogen fluoride (HF) having a concentration of 1.0% of each estimation sample were measured. The measurement results are shown in FIG. 16.

As shown in FIG. 16, it was confirmed that the film thickness uniformity (WIW) in the wafer surface and the film thickness uniformity (WTW) between the surfaces of the wafers of the SiCN film of the estimation sample A formed as the reference example become 2.7% and 2.5%, respectively. In addition, it was confirmed that the film thickness uniformity (WIW) in the wafer surface and the film thickness uniformity (WTW) between the surfaces of the wafers of the SiOCN film of the estimation sample B formed in the example become 2.9% and 2.2%, respectively. Further, it was confirmed that the film thickness uniformity (WIW) in the wafer surface and the film thickness uniformity (WTW) between the surfaces of the wafers of the SiOCN film of the estimation sample C formed in the example become 2.1% and 2.4%, respectively. Furthermore, both of WIW and WTW represent that the film thickness uniformity is increased, i.e., that the film thickness uniformity becomes better, as the value thereof is reduced. That is, it was confirmed that both of the film thickness uniformity in the wafer surface and the film thickness uniformity between the surfaces of the wafers of the SiCN film of the estimation sample A formed in the reference example and the SiOCN films of the estimation samples B and C formed in the example are good.

In addition, it was confirmed that R.I. of the film of the estimation sample A formed as the reference example is 2.2, and the formed film is the SiCN film. Further, it was confirmed that R.I. of the film of the estimation sample B formed in the example is 1.8, and the formed film is the SiOCN film. Furthermore, it was confirmed that R.I. of the film of the estimation sample C formed in the example is 1.6, and the formed film is the SiOCN film. As a result, it was confirmed that R.I. is reduced as the supply time of the $O_2$ gas in step 3 is increased. That is, it was confirmed that R.I. can be controlled by controlling conditions such as the supply time of the $O_2$ gas in step 3.

In addition, it was confirmed from the XPS measurement result of the SiCN film of the estimation sample A formed as the reference example that a ratio of Si/C/N/O in the SiCN film of the estimation sample A formed in the reference example becomes 40/42/15/3. That is, it was confirmed that the SiCN film having a C concentration of 42 at % can be formed. Further, it was confirmed that the Si concentration in the SiCN film is 40 at %, the N concentration is 15 at %, and the O concentration is 3 at %. In addition, while the detected O element is an impurity level, this may be caused by a native oxide film formed on an interface between the SiCN film and a bottom surface, or on the SiCN film surface.

In addition, it was confirmed from the XPS measurement result of the SiOCN film of the estimation sample B formed in the example that a ratio of Si/C/N/O in the SiOCN film of the estimation sample B formed in the example becomes 36/20/12/32. That is, it was confirmed that the SiOCN film having a C concentration of 20 at % can be formed. Further, it was confirmed that the Si concentration in the SiOCN film is 36 at %, the N concentration is 12 at %, and the O concentration is 32 at %.

In addition, it was confirmed from the XPS measurement result of the SiOCN film of the estimation sample C formed in the example that a ratio of Si/C/N/O in the SiOCN film of the estimation sample C formed in the example becomes 36/9/9/46. That is, it was confirmed that the SiOCN film having a C concentration of 9 at % can be formed. Further, it was confirmed that the Si concentration in the SiOCN film is 36 at %, the N concentration is 9 at %, and the O concentration is 46 at %.

As a result, it will be appreciated that, as the supply time of the $O_2$ gas in step 3 is increased, the oxidation is performed to increase the O concentration of the SiOCN film and reduce the C concentration and the N concentration. In the other experiments performed by the inventor(s), it was confirmed that the N element reaches an impurity level when the supply time of the $O_2$ gas is somewhat lengthened and the oxidation is performed to some extent, and the oxidation is further performed as the supply time of the $O_2$ gas is further lengthened so that the N element becomes substantially extinct to form the SiOC film.

That is, it was confirmed that the O concentration, the C concentration or the N concentration of the SiOCN film can be controlled by controlling conditions such as the supply time of the $O_2$ gas in step 3, i.e., the composition ratio of the SiOCN film can be controlled. In addition, it was confirmed that the N element can be reduce to an impurity level or become substantially extinct, and the SiOC film can also be formed.

In addition, it was confirmed that WER of the SiCN film of the estimation sample A formed as the reference example becomes 0.5 Å/min. That is, it was confirmed that the SiCN film having a high etching resistance can be formed. In addition, it was confirmed that WER of the SiOCN film of the estimation sample B formed in the example becomes 2.5 Å/min. That is, it was confirmed that the SiOCN film having a high etching resistance can be formed. In addition, it was confirmed that WER of the SiOCN film of the estimation sample C formed in the example becomes 12.9 Å/min. That is, it was confirmed that the SiOCN film having a high etching resistance can be formed. As a result, it was confirmed that WER is increased as the supply time of the $O_2$ gas in step 3 is increased. That is, it was confirmed that WER can be controlled by controlling conditions such as the supply time of the $O_2$ gas in step 3.

Example 2

SiOC films were formed on a plurality of wafers by the film-forming sequence of the above-mentioned first embodiment using the substrate processing apparatus in the above-mentioned embodiment. HCDS gas was used as a source gas, TEA gas was used as a first reactive gas, and $O_2$ gas was used as a second reactive gas. A wafer temperature upon film-forming was 600 to 650° C. Here, the supply time of the $O_2$ gas in step 3 was set to 20 to 25 seconds to draft an estimation sample. In addition, the processing conditions were set to predetermined values within a range of the processing conditions described in the above-mentioned first embodiment. Hereinafter, the estimation sample drafted in the example is referred to as an estimation sample D. Then, film thickness uniformity (WIW) in a wafer surface, film thickness uniformity (WTW) between surfaces of the wafers, a cycle rate, an XRF composition ratio and a refractive index (R.I.) in the estimation sample D were measured. The measurement results are shown in FIG. 17.

As shown in FIG. 17, it was confirmed that film thickness uniformity (WIW) of the wafer surface and film thickness uniformity (WTW) between surfaces of the wafers of the SiOC film of the estimation sample D formed in the example become 1.8% and 0.8%, respectively. That is, it was confirmed that both of the film thickness uniformity of the wafer surface and the film thickness uniformity between the surfaces of the wafers in the SiOC film of the estimation sample D formed in the example are good.

In addition, it was confirmed that a cycle rate of the SiOC film of the estimation sample D formed in the example becomes 0.55 Å/cycle. That is, it was confirmed that the cycle rate having a good practical level, i.e., the film-forming rate, can be realized by the example.

Further, it was confirmed from the XRF measurement result of the SiOC film of the estimation sample D formed in the example that a ratio of Si/O/C/N in the SiOC film of the estimation sample D formed in the example becomes 56.7/33.5/8.0/1.8. That is, it was confirmed that the SiOC film having a C concentration of 8.0 at % can be formed. In addition, it was confirmed that the Si concentration in the SiOC film is 56.7 at %, the O concentration is 33.5 at %, and the N concentration is 1.8 at %. While the detected N element is an impurity level, it is considered that the oxidation is performed as the supply time of the $O_2$ gas in step 3 is increased, and most of N is eliminated from the film during the process so that the N element in the film becomes the impurity level. Further, similar to the above-mentioned description, the oxidation can be further performed by further increasing the supply time of the $O_2$ gas, and the N element can become substantially extinct.

In addition, it was confirmed that R.I. of the estimation sample D formed in the example is 1.57, and the formed film is the SiOC film.

Example 3

SiOCN films were formed on a plurality of wafers by the film-forming sequence of the above-mentioned first embodiment using the substrate processing apparatus of the above-mentioned embodiment. HCDS gas was used as a source gas, TEA gas or DEA gas was used as a first reactive gas, and $O_2$ gas was used as a second reactive gas. A wafer temperature upon film-forming was set to 600 to 650° C. Here, two estimation samples in the case of using the TEA gas and the case using the DEA gas as the first reactive gas in step 2 were drafted. In addition, the other processing conditions were set to predetermined values within a range of the processing conditions described in the above-mentioned first embodiment. In addition, the processing conditions when the two estimation samples are drafted are the same. Hereinafter, the estimation sample drafted using the TEA gas as the first reactive gas is referred to as an estimation sample E, and the estimation sample drafted using the DEA gas as the first reactive gas is referred to as an estimation sample F. Then, film thickness uniformity (WIW) in wafer surfaces, film thickness uniformity (WTW) between surfaces of the wafers, a cycle rate, XRF measurement results, a wet etching rate (WER) with respect to a liquid containing hydrogen fluoride (HF) having a concentration of 1.0%, and a refractive index (R.I.) in the SiOCN films of the estimation samples E and F were measured. The measurement results are shown in FIG. 18.

As shown in FIG. 18, it was confirmed that the film thickness uniformity (WIW) in the wafer surface and the film thickness uniformity (WTW) between surfaces of the wafers of the SiOCN film of the estimation sample E formed in the example become 2.0% and 1.1%, respectively. In addition, it was confirmed that the film thickness uniformity (WIW) in the wafer surface and the film thickness uniformity (WTW) between surfaces of the wafers of the SiOCN film of the estimation sample F formed in the example become 2.0% and 1.3%, respectively. That is, it was confirmed that both of the film thickness uniformity in the wafer surfaces and the film thickness uniformity between surfaces of the wafers of the SiOCN films of the estimation samples E and F formed in the example are good, and there is no difference between the samples.

In addition, it was confirmed that a cycle rate of the SiOCN film of the estimation sample E formed in the example becomes 0.55 Å/cycle. Further, it was confirmed that a cycle rate of the SiOCN film of the estimation sample F formed in the example becomes 0.87 Å/cycle. That is, it was confirmed that the cycle rates of the SiOCN films of the estimation samples E and F formed in the example become cycle rates of a practical level, and the film-forming rate of the practical level can be realized by the example.

Further, when cycle rates of the SiOCN films of the estimation samples E and F formed in the example were compared, it was confirmed that the cycle rate of the SiOCN film of the estimation sample F drafted using the DEA gas as the first reactive gas is greater than the cycle rate of the SiOCN film of the estimation sample E drafted using the TEA gas as the first reactive gas. That is, it will be appreciated that the case using the DEA gas as the first reactive gas is better than the case using the TEA gas as the first reactive gas in a viewpoint of the cycle rate, i.e., the film-forming rate.

In addition, it was confirmed from the XRF measurement result of the SiOCN film of the estimation sample E formed in the example that a ratio of Si/O/C/N in the SiOCN film formed in the example becomes 55.1/31.6/10.2/3.1. That is, it was confirmed that the SiOCN film having a C concentration of 10.2 at % can be formed. In addition, it was confirmed that the Si concentration in the SiOCN film is 55.1 at %, the O concentration is 31.6 at %, and the N concentration is 3.1 at %.

Further, it was confirmed from the XRF measurement results of the SiOCN film of the estimation sample F formed in the example that a ratio of Si/O/C/N in the SiOCN film formed in the example becomes 56.1/32.7/6.1/5.1. That is, it was confirmed that the SiOCN film having a C concentration of 6.1 at % can be formed. In addition, it was confirmed that the Si concentration of the SiOCN film is 56.1 at %, the O concentration is 32.7 at %, and the N concentration is 5.1 at %.

In addition, it was confirmed that, when ratios of the N concentrations with respect to the C concentrations (ratios of the N concentrations/the C concentrations) of the SiOCN films of the estimation samples E and F formed in the example are compared, the ratio of the N concentration/the C concentration (=0.84) of the SiOCN film of the estimation sample F drafted using the DEA gas as the first reactive gas is higher than the ratio of the N concentration/the C concentration (=0.3) of the SiOCN film of the estimation sample E drafted using the TEA gas as the first reactive gas. That is, it will be appreciated that, when the SiOCN film is formed under the same processing conditions, the SiOCN film having a higher ratio of the N concentration/the C concentration can be obtained in the case of using the DEA gas as the first reactive gas than the case of using the TEA gas as the first reactive gas. In other words, it will be appreciated that, when the SiOCN film is formed under the same processing conditions, the SiOCN film having a lower C concentration and a higher N concentration can be formed in the case of using the DEA gas as the first reactive gas than the case of using the TEA gas as the first reactive gas. On the other hand, it will be appreciated that, when the SiOCN film is formed under the same conditions, the SiOCN film having a higher ratio of the C concentration with respect to the N concentration (a ratio of the C concentration/the N concentration) can be formed in the case of using the TEA gas as the first reactive gas than the case of using the DEA gas as the first reactive gas. In other words, it will be appreciated that, when the SiOCN film is formed under the same processing conditions, the SiOCN film having a lower N concentration and a higher C concentration can be formed in the case of using the TEA gas as the first reactive gas than the case of using the DEA gas as the first reactive gas.

In addition, it was confirmed that WER of the SiOCN film of the estimation sample E formed in the example becomes 5.2 Å/min. That is, it was confirmed that the SiOCN film having a high etching resistance can be formed. Further, it was confirmed that WER of the SiOCN film of the estimation sample F formed in the example becomes 5.1 Å/min. That is, it was confirmed that the SiOCN film having a higher etching resistance can be formed. That is, it was confirmed that the etching resistances of the SiOCN films of the estimation samples E and F formed in the example are good, and there is no difference between the samples.

In addition, it was confirmed that R.I. of the SiOCN film of the estimation sample E formed in the example is 1.59, and the formed film is the SiOCN film. Further, it was confirmed that R.I. of the SiOCN film of the estimation sample F formed in the example is 1.59, and the formed film is the SiOCN film. That is, it was confirmed that R.I. values of the SiOCN films of the estimation samples E and F formed in the example are appropriate values, and there is no difference between the samples.

According to the present invention, there is provided a method of manufacturing a semiconductor device in which a thin film having characteristics of low permittivity, high etching resistance and high leak resistance can be formed, a method of processing a substrate, a substrate processing apparatus and a non-transitory computer readable recording medium.

Exemplary Aspects of the Invention

Hereinafter, exemplary aspects of the present invention will be supplementarily noted.

Supplementary Note 1

According to an aspect of the present invention, there is provided a method of manufacturing a semiconductor device, including: forming a thin film containing a predetermined element on a substrate by performing a cycle a predetermined number of times, the cycle including: forming a first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times; and forming a second layer by supplying a second reactive gas different from the source gas and the first reactive gas to the substrate to modify the first layer.

Here, the phrase "alternately performing supplying a source gas and supplying a first reactive gas a predetermined number of times" means that, when a process of supplying one gas of the source gas and the first reactive gas and then a process of supplying the other gas of the source gas and the first reactive gas are set as one set, both of the case of performing the set once and the case of performing the set a plurality of times are included. That is, this means that the set is performed once or more (a predetermined number of times).

The phrase "performing a cycle a predetermined number of times, the cycle including forming a first layer and forming a second layer" means that, when the process of forming the first layer and the process of forming the second layer are set as one cycle, both of the case of performing the cycle once and the case of performing the cycle a plurality of times are included. That is, this means that the cycle is performed once or more (a predetermined number of times).

Such expressions in the specification are used with the same meanings as above.

Supplementary Note 2

In the method of manufacturing a semiconductor device according to supplementary note 1, it is preferable that the first reactive gas contains a plurality of ligands containing the carbon atoms.

Supplementary Note 3

In the method of manufacturing a semiconductor device according to supplementary note 1 or 2, it is preferable that the first reactive gas contains three ligands containing the carbon atoms.

Supplementary Note 4

In the method of manufacturing a semiconductor device according to supplementary note 1 or 2, it is preferable that the first reactive gas contains two ligands containing the carbon atoms.

Supplementary Note 5

In the method of manufacturing a semiconductor device according to any one of supplementary notes 1 to 4, it is preferable that the first reactive gas includes at least one of amine and organic hydrazine.

Supplementary Note 6

In the method of manufacturing a semiconductor device according to any one of supplementary notes 1 to 4, it is preferable that the first reactive gas includes at least one amine selected from a group consisting of ethylamine, methylamine, propylamine, isopropylamine, butylamine, and isobutylamine.

Supplementary Note 7

In the method of manufacturing a semiconductor device according to supplementary note 1 or 2, it is preferable that the first reactive gas includes at least one amine selected from a group consisting of triethylamine, diethylamine, trimethylamine, dimethylamine, tripropylamine, dipropylamine, triisopropylamine, diisopropylamine, tributyl amine, dibutylamine, triisobutylamine, and diisobutylamine Supplementary Note 8

In the method of manufacturing a semiconductor device according to supplementary note 1 or 2, it is preferable that the first reactive gas includes at least one amine selected from a group consisting of diethylamine, dimethylamine, dipropylamine, diisopropylamine, dibutylamine, and diisobutylamine.

Supplementary Note 9

In the method of manufacturing a semiconductor device according to any one of supplementary notes 1 to 8, it is preferable that the first reactive gas is a silicon-free gas.

Supplementary Note 10

In the method of manufacturing a semiconductor device according to any one of supplementary notes 1 to 8, it is preferable that the first reactive gas is a silicon-free and metal-free gas.

Supplementary Note 11

In the method of manufacturing a semiconductor device according to any one of supplementary notes 1 to 10, it is preferable that the predetermined element includes silicon or metal, and the halogen element includes chlorine or fluorine.

Supplementary Note 12

In the method of manufacturing a semiconductor device according to any one of supplementary notes 1 to 11, it is preferable that the forming of the first layer includes forming the first layer on the substrate while discharging the halogen element contained in the source gas and the hydrogen contained in the first reactive gas as a gas.

Supplementary Note 13

In the method of manufacturing a semiconductor device according to any one of supplementary notes 1 to 12, it is preferable that the supplying of the source gas includes forming an initial layer containing the predetermined element and the halogen element, and the supplying of the first reactive gas includes forming the first layer by reacting the initial layer with the first reactive gas Supplementary Note 14

In the method of manufacturing a semiconductor device according to supplementary note 13, it is preferable that the supplying of the first reactive gas includes separating at least a part of a ligand or ligands contained in the first reactive gas from the first reactive gas while drawing at least a part of atoms of the halogen element contained in the initial layer from the initial layer by reacting the initial layer with the first reactive gas.

Supplementary Note 15

In the method of manufacturing a semiconductor device according to supplementary note 13 or 14, it is preferable that the supplying of the first reactive gas includes combining the nitrogen of the first reactive gas having at least a part of a ligand or ligands being separated therefrom with the predetermined element contained in the initial layer by separating at least the part of the ligand or the ligands contained in the first reactive gas from the first reactive gas while drawing at least a part of atoms of the halogen element contained in the initial layer from the initial layer by reacting the initial layer with the first reactive gas.

Supplementary Note 16

In the method of manufacturing a semiconductor device according to supplementary notes 13 to 15, it is preferable that the supplying of the first reactive gas includes: combining the nitrogen of the first reactive gas having at least a part of a ligand being separated therefrom with the predetermined element contained in the initial layer; and combining the carbon contained in the ligand or the ligands with the predetermined element contained in the initial layer by separating at least the part of the ligand or the ligands contained in the first reactive gas from the first reactive gas while drawing at least a part of atoms of the halogen element contained in the initial layer from the initial layer by reacting the initial layer with the first reactive gas.

Supplementary Note 17

In the method of manufacturing a semiconductor device according to any one of supplementary notes 1 to 16, it is preferable that the forming of the thin film is performed with the substrate being accommodated in a process chamber, and an inner pressure of the process chamber when the first reactive gas is supplied is set to be higher than that of the process chamber when the second reactive gas is supplied, and an inner pressure of the process chamber when the second reactive gas is supplied is set to be higher than that of the process chamber when the source gas is supplied.

Supplementary Note 18

In the method of manufacturing a semiconductor device according to any one of supplementary notes 1 to 17, it is preferable that the forming of the second layer includes forming a layer containing the predetermined element, oxygen, carbon and nitrogen (an oxycarbonitride layer containing the predetermined element), or a layer containing the predetermined element, oxygen and carbon (an oxycarbide layer containing the predetermined element) as the second layer by supplying an oxygen-containing gas as the second reactive gas to the substrate, and the forming of the thin film includes forming a film containing the predetermined element, oxygen, carbon and nitrogen (an oxycarbonitride film containing the predetermined element), or a film containing the predetermined element, oxygen and carbon (an oxycarbide film containing the predetermined element) as the thin film.

Supplementary Note 19

In the method of manufacturing a semiconductor device according to any one of supplementary notes 1 to 17, it is preferable that the forming of the second layer includes forming a layer containing the predetermined element, the carbon and the nitrogen (a carbonitride layer containing the predetermined element) as the second layer by supplying a nitrogen-containing gas as the second reactive gas to the substrate, and the forming of the thin film includes forming a film containing the predetermined element, carbon and nitrogen (a carbonitride film containing the predetermined element) as the thin film.

Supplementary Note 20

In the method of manufacturing a semiconductor device according to any one of supplementary notes 1 to 17, it is preferable that the forming of the second layer includes forming a layer containing the predetermined element, oxygen, carbon and nitrogen (an oxycarbonitride layer containing the predetermined element) as the second layer by supplying a nitrogen-containing gas and an oxygen-containing gas as the second reactive gas to the substrate, and the forming of the thin film includes forming a film containing the predetermined element, oxygen, carbon and nitrogen (an oxycarbonitride film containing the predetermined element) as the thin film.

Supplementary Note 21

In the method of manufacturing a semiconductor device according to any one of supplementary notes 1 to 17, it is preferable that the forming of the second layer includes forming a layer containing the predetermined element, oxygen, carbon and nitrogen (an oxycarbonitride layer containing the predetermined element) as the second layer by supplying a nitrogen-containing gas as the second reactive gas to the substrate and then supplying an oxygen-containing gas as the second reactive gas to the substrate, and the forming of the thin film includes forming a film containing the predetermined element, oxygen, carbon and nitrogen (an oxycarbonitride film containing the predetermined element) as the thin film.

Supplementary Note 22

According to another aspect of the present invention, there is provided a method of manufacturing a semiconductor device, including: forming a thin film by stacking a first layer and a second layer on a substrate by performing a cycle a predetermined number of times, the cycle including: forming the first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times; and forming the second layer containing the predetermined element by alternately performing supplying the source gas to the substrate and supplying a second reactive gas different from the source gas and the first reactive gas to the substrate.

Supplementary Note 23

In the method of manufacturing a semiconductor device according to supplementary note 22, it is preferable that the forming of the second layer includes forming a layer containing the predetermined element and the nitrogen (a nitride layer containing the predetermined element) as the second layer by supplying a nitrogen-containing gas as the second reactive gas to the substrate, and the forming of the thin film includes forming a film containing the predetermined element, the carbon and the nitrogen (a carbonitride film containing the predetermined element) formed by alternately depositing the first layer and the second layer as the thin film.

Supplementary Note 24

In the method of manufacturing a semiconductor device according to supplementary note 22, it is preferable that the forming of the second layer includes forming a layer containing the predetermined element and oxygen (an oxide layer containing the predetermined element) as the second layer by supplying an oxygen-containing gas as the second reactive gas to the substrate, and the forming of the thin film includes forming a film containing the predetermined element, the oxygen, the carbon and the nitrogen (an oxycarbonitride film containing the predetermined element) formed by alternately depositing the first layer and the second layer as the thin film.

Supplementary Note 25

According to still another aspect of the present invention, there is provided a method of manufacturing a semiconductor device, including: forming a thin film containing a predetermined element on a substrate by alternately performing the following steps a predetermined number of times: forming a first layer containing the predetermined element, nitrogen and carbon by supplying a source gas containing the predetermined element and a halogen element, and a first reactive gas containing three elements including the carbon, the nitrogen and hydrogen and having a composition wherein a number of carbon atoms is greater than that of nitrogen atoms to the substrate; and forming a second layer by supplying a second reactive gas different from the source gas and the first reactive gas to the substrate to modify the first layer.

Supplementary Note 26

According to yet another aspect of the present invention, there is provided a method of processing a substrate, including: forming a thin film containing a predetermined element on a substrate by performing a cycle a predetermined number of times, the cycle including: forming a first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times; and forming a second layer by supplying a second reactive gas different from the source gas and the first reactive gas to the substrate to modify the first layer.

Supplementary Note 27

According to yet another aspect of the present invention, there is provided a substrate processing apparatus including: a process chamber configured to accommodate a substrate; a source gas supply system configured to supply a source gas containing a predetermined element and a halogen element into the process chamber; a first reactive gas supply system configured to supply a first reactive gas containing three elements including carbon, nitrogen and hydrogen and having a composition wherein a number of carbon atoms is greater than that of nitrogen atoms into the process chamber; a second reactive gas supply system configured to supply a second reactive gas different from the source gas and the first reactive gas into the process chamber; and a control unit configured to control the source gas supply system, the first reactive gas supply system and the second reactive gas supply system so as to form a thin film containing the predetermined element on the substrate, by performing a cycle a predetermined number of times, the cycle including: forming a first layer containing the predetermined element, the nitrogen and the carbon by alternately performing supplying the source gas to the substrate in the process chamber and supplying the first reactive gas to the substrate in the process chamber a predetermined number of times; and forming a second layer by supplying the second reactive gas to the substrate in the process chamber to modify the first layer.

Supplementary Note 28

According to yet another aspect of the present invention, there is provided a program that causes a computer to perform a process of forming a thin film containing a predetermined element on a substrate in a process chamber by performing a cycle a predetermined number of times, the cycle including: a process of forming a first layer containing the predetermined element, nitrogen and carbon by alternately performing supplying a source gas containing the predetermined element and a halogen element to the substrate in the process chamber and supplying a first reactive gas containing three elements including the carbon, the nitrogen and hydrogen and having a composition wherein a number of carbon atoms is greater than that of nitrogen atoms to the substrate in the process chamber a predetermined number of times; and a process of forming a second layer by supplying a second reactive gas different from the source gas and the first reactive gas to the substrate in the process chamber to modify the first layer.

Supplementary Note 29

According to yet another aspect of the present invention, there is provided a non-transitory computer-readable recording medium storing a program that causes a computer to perform a process of forming a thin film containing a predetermined element on a substrate in a process chamber by performing a cycle a predetermined number of times, the cycle including: a process of forming a first layer containing the predetermined element, nitrogen and carbon by alternately performing supplying a source gas containing the predetermined element and a halogen element to the substrate in the process chamber and supplying a first reactive gas containing three elements including the carbon, the nitrogen and hydrogen and having a composition wherein a number of carbon atoms is greater than that of nitrogen atoms to the substrate in the process chamber a predetermined number of times; and a process of forming a second layer by supplying a second reactive gas different from the source gas and the first reactive gas to the substrate in the process chamber to modify the first layer.

What is claimed is:

1. A method of manufacturing a semiconductor device, comprising:
   forming a film containing a predetermined element, oxygen, carbon and nitrogen on a substrate in a process chamber by performing a cycle a predetermined number of times, the cycle including non-simultaneously performing:
   (a) supplying a source gas containing the predetermined element and a halogen element to the substrate in the process chamber;
   (b) supplying a first reactive gas containing carbon, nitrogen and hydrogen to the substrate in the process chamber wherein number of carbon atoms in each molecule of the first reactive gas is greater than that of nitrogen atoms in each molecule of the first reactive gas; and
   (c) supplying an oxidizing gas as a second reactive gas to the substrate in the process chamber,
   wherein an inner pressure of the process chamber in (b) is greater than that of the process chamber in (a), and the cycle further includes: (d) supplying a nitriding gas as a third reactive gas to the substrate.

2. The method according to claim 1, wherein the first reactive gas comprises at least one selected from the group consisting of amine and organic hydrazine.

3. The method according to claim 1, wherein the first reactive gas comprises at least one amine selected from the group consisting of ethylamine, methylamine, propylamine, isopropylamine, butylamine, and isobutylamine.

4. The method according to claim 1, wherein the first reactive gas contains a plurality of ligands containing the carbon atoms.

5. The method according to claim 1, wherein the first reactive gas is a silicon-free and metal-free gas.

6. The method according to claim 1, wherein the first reactive gas is a silicon-free gas.

7. The method according to claim 2, wherein the second reactive gas comprises at least one selected from the group consisting of $NH_3$ gas, $N_2H_2$ gas, $N_2H_4$ gas and $N_3H_8$ gas.

8. The method according to claim 3, wherein the third reactive gas comprises at least one selected from the group consisting of $O_2$ gas, $N_2O$ gas, NO gas, $NO_2$ gas, $O_3$ gas, $H_2$ gas+$O_2$ gas, $H_2$ gas+$O_3$ gas, $H_2O$ gas, CO gas and $CO_2$ gas.

9. The method according to claim 1, wherein the predetermined element comprises silicon or a metal, and the halogen element comprises chlorine or fluorine.

10. The method according to claim 1, wherein each of the first reactive gas, the second reactive gas, and the third reactive gas is thermally activated under non-plasma condition and supplied to the substrate.

11. A method of manufacturing a semiconductor device, comprising:
   forming a film containing silicon, oxygen, carbon and nitrogen on a substrate in a process chamber by performing a cycle a predetermined number of times, the cycle including non-simultaneously performing:
   (a) supplying a source gas containing silicon and a halogen element to the substrate in the process chamber;
   (b) supplying a first reactive gas containing carbon, nitrogen and hydrogen to the substrate in the process chamber wherein number of carbon atoms in each molecule of the first reactive gas is greater than that of nitrogen atoms in each molecule of the first reactive gas; and
   (c) supplying an oxidizing gas as a second reactive gas to the substrate in the process chamber,
   wherein an inner pressure of the process chamber in (b) is greater than that of the process chamber in (a), and the cycle further includes: (d) supplying a nitriding gas as a third reactive gas to the substrate.

12. A method of manufacturing a semiconductor device, comprising:
   forming a film containing a metal element, oxygen, carbon and nitrogen on a substrate in a process chamber by performing a cycle a predetermined number of times, the cycle including non-simultaneously performing:
   (a) supplying a source gas containing the metal element and a halogen element to the substrate in the process chamber;
   (b) supplying a first reactive gas containing carbon, nitrogen and hydrogen to the substrate in the process chamber wherein number of carbon atoms in each molecule of the first reactive gas is greater than that of nitrogen atoms in each molecule of the first reactive gas; and
   (c) supplying an oxidizing gas as a second reactive gas to the substrate in the process chamber, wherein an inner pressure of the process chamber in (b) is greater than that of the process chamber in (a), and the cycle further includes: (d) supplying a nitriding gas as a third reactive gas to the substrate.

* * * * *